(12) United States Patent
Mick et al.

(10) Patent No.: US 12,707,556 B1
(45) Date of Patent: Aug. 11, 2026

(54) TORSO OF A HUMANOID ROBOT

(71) Applicant: FIGURE AI INC., San Jose, CA (US)

(72) Inventors: Brian Mick, San Jose, CA (US); Katarina Rodak, San Jose, CA (US); Emily Bartling, San Jose, CA (US); Nivay Anandarajah, San Jose, CA (US); Huize Li, San Jose, CA (US)

(73) Assignee: FIGURE AI INC., San Jose, CA (US)

( * ) Notice: Subject to any disclaimer, the term of this patent is extended or adjusted under 35 U.S.C. 154(b) by 0 days.

(21) Appl. No.: 19/079,397

(22) Filed: Mar. 13, 2025

Related U.S. Application Data

(60) Provisional application No. 63/635,846, filed on Apr. 18, 2024, provisional application No. 63/634,697, filed on Apr. 16, 2024, provisional application No. 63/632,630, filed on Apr. 11, 2024, provisional application No. 63/573,543, filed on Apr. 3, 2024, provisional application No. 63/564,560, filed on Mar. 13, 2024.

(51) Int. Cl.
*H05K 1/02* (2006.01)
*B25J 19/00* (2006.01)

(52) U.S. Cl.
CPC ........ *H05K 1/0203* (2013.01); *B25J 19/0054* (2013.01); *H05K 2201/064* (2013.01)

(58) Field of Classification Search
CPC ............... B25J 19/0054; H05K 1/0203; H05K 2201/064; H01R 12/72
USPC ............................... 74/490.03; 174/255, 252
See application file for complete search history.

(56) References Cited

U.S. PATENT DOCUMENTS

| | | | |
|---|---|---|---|
| 552,557 | A | 1/1896 | Weber |
| 1,290,140 | A | 1/1919 | Elleby |
| 2,362,597 | A | 11/1944 | Vince |
| 3,060,445 | A | 10/1962 | Brockman |

(Continued)

FOREIGN PATENT DOCUMENTS

| | | |
|---|---|---|
| AU | 202413544 | 7/2024 |
| CA | 137209 | 5/2011 |

(Continued)

OTHER PUBLICATIONS https://web.archive.org/web/20220702203427/https://singularityhub.com/2010/01/20/ iwalk-presents-worlds-first-actively-powered-foot-and-ankle/ (Year: 2010).

(Continued)

*Primary Examiner* — T. Scott Fix

(57) ABSTRACT

The present disclosure provides a humanoid robot with an arrangement of components that allows the robot to mimic the movements, functionality and capabilities of a human being. The robot includes a torso having a side portion and a vent opening positioned near said side portion, and a fan positioned within an extent of the torso that is configured to generate an air flow path through the torso to prevent overheating of internal components. A central processing unit (CPU) is coupled to a first printed circuit board. A first extent of a heat sink is thermally coupled to the CPU and a second extent is positioned within the air flow path. A graphical processing unit (GPU) is coupled to a second printed circuit board. A first extent of a second heat sink is thermally coupled to the GPU and a second extent is positioned within the air flow path.

28 Claims, 19 Drawing Sheets

(56) References Cited

U.S. PATENT DOCUMENTS

| | | | | |
|---|---|---|---|---|
| 3,458,864 | A | 8/1969 | Austin | |
| D246,201 | S | 10/1977 | Ogawa | |
| D251,627 | S | 4/1979 | McQuarrie | |
| D255,283 | S | 6/1980 | Piche | |
| 4,804,220 | A | 2/1989 | Rosheim | |
| 4,834,761 | A | 5/1989 | Walters | |
| 4,986,723 | A | 1/1991 | Maeda | |
| 5,394,766 | A | 3/1995 | Johnson | |
| 5,447,403 | A | 9/1995 | Engler, Jr. | |
| 5,673,367 | A | 9/1997 | Buckley | |
| 6,477,058 | B1 * | 11/2002 | Luebs | H05K 7/1061 361/764 |
| D476,404 | S | 6/2003 | Chen | |
| 6,732,015 | B2 | 5/2004 | Maeda | |
| 6,901,313 | B2 | 5/2005 | Mori | |
| 6,980,889 | B2 | 12/2005 | Ito | |
| 7,024,276 | B2 | 4/2006 | Ito | |
| 7,031,806 | B2 | 4/2006 | Kuroki | |
| 7,072,741 | B2 | 7/2006 | Nagashima | |
| 7,099,747 | B2 | 8/2006 | Mikami | |
| 7,113,849 | B2 | 9/2006 | Kuroki | |
| 7,308,336 | B2 | 12/2007 | Takenaka | |
| 7,319,918 | B2 | 1/2008 | Takenaka | |
| 7,379,789 | B2 | 5/2008 | Takenaka | |
| 7,386,364 | B2 | 6/2008 | Mikami | |
| 7,664,569 | B2 | 2/2010 | Shimizu | |
| D622,332 | S | 8/2010 | Pence | |
| D631,612 | S | 1/2011 | Tajima | |
| 7,864,159 | B2 | 1/2011 | Sweetser | |
| D641,808 | S | 7/2011 | Matsuda | |
| 8,224,652 | B2 | 7/2012 | Wang | |
| D668,758 | S | 10/2012 | Hall | |
| D677,743 | S | 3/2013 | Koshiishi | |
| D687,908 | S | 8/2013 | Hoang | |
| 8,511,964 | B2 | 8/2013 | Linn | |
| D689,566 | S | 9/2013 | Wong | |
| 8,660,695 | B2 | 2/2014 | De La Rosa Tames | |
| 8,706,299 | B2 | 4/2014 | Sanders | |
| 8,770,749 | B2 | 7/2014 | Mccabe | |
| D712,598 | S | 9/2014 | Mehra | |
| 8,942,849 | B2 | 1/2015 | Maisonnier | |
| D732,999 | S | 6/2015 | Siegel | |
| 9,134,547 | B2 | 9/2015 | Mccabe | |
| 9,205,556 | B1 | 12/2015 | Magnusson | |
| 9,205,560 | B1 | 12/2015 | Edsinger | |
| 9,302,393 | B1 | 4/2016 | Rosen | |
| 9,346,165 | B1 | 5/2016 | Metzger | |
| 9,494,415 | B2 | 11/2016 | Sweetser | |
| D774,148 | S | 12/2016 | Hong | |
| 9,569,976 | B2 | 2/2017 | Krauss | |
| 9,574,646 | B1 | 2/2017 | Edsinger | |
| 9,575,335 | B1 | 2/2017 | Mccabe | |
| 9,592,603 | B2 | 3/2017 | Hardouin | |
| 9,669,280 | B2 | 6/2017 | Hua | |
| D794,692 | S | 8/2017 | Haranaka | |
| D795,320 | S | 8/2017 | Liu | |
| D795,321 | S | 8/2017 | Liu | |
| D800,229 | S | 10/2017 | Baker | |
| 9,789,607 | B1 | 10/2017 | Whitman | |
| 9,789,612 | B2 | 10/2017 | Hoffman | |
| 9,796,078 | B2 | 10/2017 | Angle | |
| 9,821,466 | B2 | 11/2017 | Bingham | |
| 9,842,585 | B2 | 12/2017 | Huang | |
| 9,868,210 | B1 | 1/2018 | Whitman | |
| 9,992,474 | B2 | 6/2018 | Grunnet-Jepsen | |
| 10,007,994 | B2 | 6/2018 | Grunnet-Jepsen | |
| 10,018,256 | B1 | 7/2018 | Magnusson | |
| D831,308 | S | 10/2018 | Lu | |
| D835,214 | S | 12/2018 | Xiong | |
| D838,759 | S | 1/2019 | Kowalski | |
| 10,189,158 | B2 | 1/2019 | Edsinger | |
| D841,708 | S | 2/2019 | Koshiishi | |
| 10,203,209 | B2 | 2/2019 | Roumeliotis | |
| 10,310,362 | B2 | 6/2019 | Grunnet-Jepsen | |
| 10,349,245 | B2 | 7/2019 | Tokuchi | |
| D856,593 | S | 8/2019 | Burke | |
| D866,684 | S | 11/2019 | Früh | |
| D868,866 | S | 12/2019 | Gable | |
| D872,152 | S | 1/2020 | Xiong | |
| D873,320 | S | 1/2020 | Clerc | |
| 10,532,464 | B1 | 1/2020 | Guzman | |
| 10,537,998 | B2 | 1/2020 | Salisbury | |
| 10,545,497 | B1 | 1/2020 | Cui | |
| 10,571,896 | B2 | 2/2020 | Benaim | |
| D885,451 | S | 5/2020 | Chen | |
| D888,120 | S | 6/2020 | Hurst | |
| D892,886 | S | 8/2020 | Klassen | |
| D892,887 | S | 8/2020 | Klassen | |
| D893,573 | S | 8/2020 | Yan | |
| 10,780,578 | B2 | 9/2020 | Blankespoor | |
| D898,789 | S | 10/2020 | Nazarikhorram | |
| D900,251 | S | 10/2020 | Ouyang | |
| D901,608 | S | 11/2020 | Okabe | |
| 10,890,921 | B2 | 1/2021 | Gillett | |
| D911,459 | S | 2/2021 | Xiong | |
| 10,921,558 | B2 | 2/2021 | Yao | |
| 10,924,638 | B2 | 2/2021 | Swaminathan | |
| 10,946,528 | B2 | 3/2021 | Gupta | |
| 10,960,539 | B1 | 3/2021 | Kalakrishnan | |
| 10,988,192 | B1 | 4/2021 | Thorne | |
| D918,979 | S | 5/2021 | Mullan | |
| D921,081 | S | 6/2021 | Laplante | |
| D932,531 | S | 10/2021 | Xu | |
| 11,180,205 | B2 | 11/2021 | Amino | |
| 11,188,821 | B1 | 11/2021 | Kalakrishnan | |
| 11,200,816 | B2 | 12/2021 | Wang | |
| 11,247,738 | B2 | 2/2022 | Lavalley | |
| 11,292,126 | B2 | 4/2022 | Christensen | |
| 11,333,954 | B2 | 5/2022 | Bull | |
| 11,347,030 | B2 | 5/2022 | Yao | |
| 11,416,003 | B2 | 8/2022 | Whitman | |
| 11,435,745 | B2 | 9/2022 | Lee | |
| 11,498,223 | B2 | 11/2022 | Williams | |
| D972,815 | S | 12/2022 | Wang | |
| D975,363 | S | 1/2023 | Paulson | |
| 11,546,504 | B2 | 1/2023 | Kim | |
| 11,554,484 | B2 | 1/2023 | Jung | |
| 11,600,010 | B2 | 3/2023 | Doutre | |
| 11,602,853 | B2 | 3/2023 | Stoianovici | |
| 11,632,991 | B2 | 4/2023 | Hull | |
| D985,643 | S | 5/2023 | Li | |
| 11,645,444 | B2 | 5/2023 | Scheutz | |
| 11,686,884 | B2 | 6/2023 | Shinohara | |
| D991,347 | S | 7/2023 | Ding | |
| 11,699,884 | B2 * | 7/2023 | Braun | H05K 9/0028 361/818 |
| 11,707,852 | B1 | 7/2023 | Hurst | |
| 11,736,677 | B2 | 8/2023 | Grunnet-Jepsen | |
| 11,807,067 | B2 | 11/2023 | Mancini | |
| 11,833,680 | B2 | 12/2023 | Deits | |
| 11,850,738 | B2 | 12/2023 | Chernyak | |
| 11,851,120 | B2 | 12/2023 | Fay | |
| 11,924,023 | B1 | 3/2024 | Smith | |
| D1,024,427 | S | 4/2024 | Li | |
| 11,999,423 | B2 | 6/2024 | Whitman | |
| 12,036,670 | B2 | 7/2024 | Geating | |
| 12,054,208 | B2 | 8/2024 | Swilling | |
| 12,070,863 | B2 | 8/2024 | Whitman | |
| 12,077,229 | B2 | 9/2024 | Whitman | |
| 12,097,626 | B2 | 9/2024 | Ikeda | |
| 12,122,044 | B2 | 10/2024 | Webb | |
| D1,051,193 | S | 11/2024 | Mahoor | |
| 12,134,181 | B2 | 11/2024 | Klingensmith | |
| D1,055,176 | S | 12/2024 | Qin | |
| 12,172,537 | B2 | 12/2024 | Gonano | |
| 12,205,214 | B2 | 1/2025 | Starke | |
| 12,214,497 | B2 | 2/2025 | Whitman | |
| 12,235,652 | B2 | 2/2025 | Whitman | |
| 12,240,117 | B2 | 3/2025 | Chebotar | |
| 12,246,441 | B1 | 3/2025 | Abate | |
| 12,251,831 | B2 | 3/2025 | Murphy | |
| D1,069,875 | S | 4/2025 | Belon | |
| 12,263,591 | B1 | 4/2025 | Clerc | |
| D1,082,881 | S | 7/2025 | Wang | |

(56) References Cited

U.S. PATENT DOCUMENTS

D1,085,192 S 7/2025 Abroff
12,365,094 B2 7/2025 Mccall
D1,089,451 S 8/2025 Lin
12,403,611 B2 9/2025 Mccall
12,420,434 B1 9/2025 Goldsmith
12,472,648 B1 11/2025 Hadas
D1,105,195 S 12/2025 Liu
D1,107,770 S 12/2025 Wang
D1,114,356 S 2/2026 Dau
D1,114,898 S 2/2026 Feldman
12,539,618 B1 2/2026 Mccall
12,558,791 B1 2/2026 Bernards
D1,115,887 S 3/2026 Wang
D1,117,383 S 3/2026 Wang
D1,118,726 S 3/2026 Mccall
12,578,733 B2 3/2026 Lynch
2002/0157167 A1 10/2002 Paul
2003/0070202 A1 4/2003 Paul
2004/0044417 A1 3/2004 Gramnaes
2004/0075168 A1* 4/2004 Azuma .................. H01L 24/11 257/E21.511
2004/0103740 A1 6/2004 Townsend
2005/0072558 A1* 4/2005 Whitney ............. H01L 23/4006 257/E23.084
2006/0128261 A1* 6/2006 Kawabe ............... B25J 19/0054 446/268
2006/0217838 A1 9/2006 Sugino
2007/0035143 A1 2/2007 Blackwell
2008/0239678 A1* 10/2008 Ploeg .................. H05K 7/2049 361/719
2008/0240889 A1 10/2008 Yokoyama
2009/0059033 A1 3/2009 Shimada
2009/0321150 A1 12/2009 Kwon
2010/0229663 A1 9/2010 Wang
2010/0280662 A1 11/2010 Abdallah
2011/0058800 A1 3/2011 Lee
2011/0067517 A1 3/2011 Ihrke
2011/0067520 A1 3/2011 Ihrke
2011/0068595 A1 3/2011 Ihrke
2011/0071671 A1 3/2011 Ihrke
2011/0071673 A1 3/2011 Ihrke
2011/0071678 A1 3/2011 Ihrke
2011/0178636 A1 7/2011 Kwon
2011/0186362 A1 8/2011 Alfayad
2012/0072215 A1 3/2012 Yu
2012/0078419 A1 3/2012 Kim
2012/0155775 A1 6/2012 Ahn
2012/0215539 A1 8/2012 Juneja
2012/0310412 A1 12/2012 Seo
2013/0175816 A1 7/2013 Kawasaki
2013/0345863 A1 12/2013 Linder
2014/0039675 A1 2/2014 Ead
2014/0132210 A1 5/2014 Partovi
2014/0217762 A1 8/2014 Ihrke
2014/0265401 A1 9/2014 Allen Demers
2014/0279432 A1 9/2014 Holman
2015/0192399 A1 7/2015 Raab
2015/0290795 A1 10/2015 Oleynik
2016/0008988 A1 1/2016 Kennedy
2016/0052574 A1 2/2016 Khripin
2016/0064263 A1 3/2016 Hosek
2017/0028551 A1 2/2017 Hemken
2017/0028563 A1 2/2017 Hemken
2017/0032035 A1 2/2017 Gao
2017/0075143 A1 3/2017 Saylor
2017/0080582 A1 3/2017 Mugnier
2017/0106738 A1 4/2017 Gillett
2017/0125008 A1 5/2017 Maisonnier
2017/0299898 A1 10/2017 Gallina
2017/0326736 A1 11/2017 Nagatsuka
2018/0104823 A1 4/2018 Kaku
2018/0136912 A1 5/2018 Venkataramani
2018/0182260 A1 6/2018 Ciniello
2018/0186015 A1 7/2018 Xiong
2018/0232201 A1 8/2018 Holtmann
2018/0281179 A1 10/2018 Michalakis
2018/0293517 A1 10/2018 Browne
2018/0357552 A1 12/2018 Campos
2019/0005374 A1 1/2019 Shankar
2019/0025611 A1 1/2019 Saylor
2019/0079924 A1 3/2019 Sugiura
2019/0082811 A1 3/2019 Gray
2019/0105783 A1 4/2019 Al Moubayed
2019/0278079 A1 9/2019 Mccabe
2019/0329413 A1 10/2019 Johnson
2019/0337166 A1 11/2019 Keeney-Ritchie
2019/0371307 A1 12/2019 Zhao
2019/0374161 A1 12/2019 Ly
2020/0009739 A1 1/2020 Moon
2020/0086479 A1 3/2020 Messier
2020/0180145 A1 6/2020 Xiong
2020/0180146 A1 6/2020 Xiong
2020/0180167 A1 6/2020 Xiong
2020/0182336 A1 6/2020 Xiong
2020/0182337 A1 6/2020 Xiong
2020/0330246 A1 10/2020 Tognetti
2020/0409183 A1 12/2020 Saylor
2021/0146214 A1 5/2021 Lim
2021/0162602 A1 6/2021 Kawaguchi
2021/0387346 A1 12/2021 Gillett
2022/0226996 A1 7/2022 Ishizuka
2022/0227010 A1 7/2022 Takabu
2022/0287853 A1 9/2022 Ren
2022/0294062 A1 9/2022 Kamon
2022/0388174 A1 12/2022 Stathis
2022/0390952 A1 12/2022 Yu
2022/0395974 A1 12/2022 Balasubramanian
2022/0410380 A1 12/2022 Lu
2023/0033779 A1 2/2023 Gazeau
2023/0048725 A1 2/2023 Barbour
2023/0112596 A1* 4/2023 Yang .................. H01L 23/4275 361/185
2023/0143315 A1 5/2023 Whitman
2023/0154055 A1 5/2023 Besenbruch
2023/0173683 A1 6/2023 Gomez
2023/0182296 A1 6/2023 Sermanet
2023/0347514 A1 11/2023 Xiao
2023/0390948 A1 12/2023 Hsu
2024/0003380 A1 1/2024 Vyas
2024/0044331 A1 2/2024 Sterling
2024/0091964 A1 3/2024 Smith
2024/0181637 A1 6/2024 Gillett
2024/0217104 A1 7/2024 Neville
2024/0228191 A1 7/2024 Kumar
2024/0289606 A1 8/2024 Wang
2024/0294219 A1 9/2024 Gildert
2024/0299195 A1 9/2024 Perry
2024/0300109 A1 9/2024 Shaw
2024/0430464 A1 12/2024 Kalva
2025/0042020 A1 2/2025 Fleury
2025/0042024 A1 2/2025 Dijkman
2025/0050507 A1 2/2025 Camasmie
2025/0131347 A1 4/2025 Wells
2025/0147517 A1 5/2025 Swilling
2025/0187202 A1 6/2025 Mccall
2025/0196326 A1 6/2025 Katz
2025/0196327 A1 6/2025 Geating
2025/0205908 A1 6/2025 Goldsmith
2025/0242500 A1 7/2025 Mccall
2025/0269518 A1 8/2025 Ragusila
2025/0312911 A1 10/2025 Ragusila
2025/0319614 A1 10/2025 Stevens
2025/0322372 A1 10/2025 Berlin
2025/0367837 A1 12/2025 Webb
2025/0375905 A1 12/2025 Goldsmith
2026/0008178 A1 1/2026 Mccall
2026/0027736 A1 1/2026 Yeganeh
2026/0034678 A1 2/2026 Mccall

FOREIGN PATENT DOCUMENTS

CA 233700 7/2025
CN 102357889 2/2012
CN 302064216 S 9/2012

(56) References Cited

FOREIGN PATENT DOCUMENTS

| | | | | |
|---|---|---|---|---|
| CN | 302255798 | | 12/2012 | |
| CN | 302255798 S | | 12/2012 | |
| CN | 308637925 | | 5/2014 | |
| CN | 303298408 | | 7/2015 | |
| CN | 304998646 S | | 1/2019 | |
| CN | 305154358 S | | 5/2019 | |
| CN | 209615545 | | 11/2019 | |
| CN | 210998685 | | 7/2020 | |
| CN | 306231734 | | 12/2020 | |
| CN | 212287717 | | 1/2021 | |
| CN | 112959343 | | 6/2021 | |
| CN | 306894068 S | | 10/2021 | |
| CN | 114147745 A | | 3/2022 | |
| CN | 307563528 | | 9/2022 | |
| CN | 307563528 S | | 9/2022 | |
| CN | 115503013 | | 12/2022 | |
| CN | 115649316 | | 1/2023 | |
| CN | 218802294 | | 4/2023 | |
| CN | 116714698 | | 9/2023 | |
| CN | 117047810 | | 11/2023 | |
| CN | 117301022 | | 12/2023 | |
| CN | 117462367 | | 1/2024 | |
| CN | 308675468 S | | 6/2024 | |
| CN | 308157136 S | | 8/2024 | |
| CN | 309012925 | | 12/2024 | |
| CN | 309180560 S | | 3/2025 | |
| DE | 3345607 A1 | | 6/1985 | |
| DE | 112018003604 T5 | | 5/2020 | |
| DE | 402020100743 | | 2/2021 | |
| DE | 112018003604 | | 11/2023 | |
| EP | 2186552 A1 | | 5/2010 | |
| ES | 59639 U | | 6/1957 | |
| FR | 2595950 A1 | | 9/1987 | |
| GB | 2446885 A | | 8/2008 | |
| GB | 2472046 | | 4/2013 | |
| GB | 2496335 | | 5/2013 | |
| GB | 90038381840001 | | 11/2017 | |
| GB | 6367851 | | 6/2024 | |
| GB | 6420068 | | 2/2025 | |
| GB | 6420070 | | 2/2025 | |
| JP | 1162349 | | 1/2003 | |
| JP | 2003266362 A | | 9/2003 | |
| JP | 1301180 | | 5/2007 | |
| JP | 1412554 | | 5/2011 | |
| JP | D1638014 | | 7/2019 | |
| JP | 6775862 B1 | | 10/2020 | |
| JP | 1698172 | | 10/2021 | |
| KR | 20180107353 | | 10/2018 | |
| KR | 300994127 | | 2/2021 | |
| KR | 3020240036125 | | 9/2024 | |
| SU | 1734994 | | 5/1992 | |
| TW | 105306360 | | 2/2018 | |
| WO | 2009030922 | | 3/2009 | |
| WO | 2017103682 A2 | | 6/2017 | |
| WO | 2019234706 | | 12/2019 | |
| WO | 2020190594 A1 | | 9/2020 | |
| WO | WO-2022207106 A1 | * | 10/2022 | .......... B25J 19/0054 |
| WO | 2023110778 | | 6/2023 | |
| WO | D224613 | | 10/2023 | |
| WO | 2023246994 | | 12/2023 | |
| WO | 2023246995 | | 12/2023 | |
| WO | 2024058844 | | 3/2024 | |
| WO | 2024085904 | | 4/2024 | |
| WO | WO-2024072966 A1 | * | 4/2024 | .......... B25J 19/0054 |
| WO | 2024111509 A1 | | 5/2024 | |
| WO | 2024112350 | | 5/2024 | |
| WO | 2024112351 | | 5/2024 | |
| WO | 2024123766 | | 6/2024 | |
| WO | 2024163992 | | 8/2024 | |
| WO | D243074010 | | 10/2024 | |
| WO | 2025019583 | | 1/2025 | |
| WO | 2025042802 | | 2/2025 | |
| WO | 2025072321 | | 4/2025 | |
| WO | 2025103557 A1 | | 5/2025 | |
| WO | 2025221916 A1 | | 10/2025 | |

OTHER PUBLICATIONS https://www.hola.com/us/celebrities/20221003337667/elon-musk-unveils-robot/ Oct. 3, 2022 (Year: 2022).

https://robotsguide.com/robots/figure (Year: 2023).

https://startup-weekly.com/Figure-announces-70m-Seres-A-to-support-commercialization-of-Figure-01-humanoid-obot5/312/2023 ( Year: 2023).

https://www.cnn.com/2022/09/30/business/tesla-bot-robot Oct. 1, 2022 (Year: 2022).

https://electrek.co/2023/05/16/tesla-bot-sideshow-new-footage-robots/5/16/2023 (Year: 2023).

https://www.humanoidsdaily.com/news/figure-reveals-fgure-03-in-new-teaser-full-unveling-set-for-october-10 (Oct. 7, 2025) (Year: 2025).

htp://www.analyticsinsight.net/artificial-inteligence/xiaomis-cyberone-a-new-humanoid-obot-to-fight-teslabot(Sep. 8, 2022) (Year: 2022).

Advancing Physical AI with NVIDIA Cosmos World Foundation Model Platform, avaiable at https://developer.nvidia.com/blog/advancing-physical-ai-with-nvidia-cosmos-world-foundation-model-platform/ (Jan. 9, 2025).

Brohan, Anthony, et al. "Rt-1: Robotics transformer for real-world control at scale." arXiv preprint arXiv:2212.06817 (Dec. 13, 2022).

Brown et al., "Language Models are Few-Shot Learners," arXiv:2005.14165v4 (Jul. 22, 2020).

Calvert, Duncan, et al. "A fast, autonomous, bipedal walking behavior over rapid regions." 2022 IEEE-RAS 21st International Conference on Humanoid Robots (Humanoids). IEEE, 2022.

Chang et al., "A Survey on Evaluation of Large Language Models," ACM Trans. Intell. Syst. Technol., vol. 15, No. 3, Article 39. (Mar. 2024).

Chen et al., "InternVL: Scaling up Vision Foundation Models and Aligning for Generic Visual-Linguistic Tasks," https://github.com/OpenGVLab/InternVL (2024).

Dafarra, Stefano, et al. "Non-linear trajectory optimization for large step-ups: Application to the humanoid robot atlas." 2020 IEEE/RSJ International Conference on Intelligent Robots and Systems (IROS). IEEE, 2020.

Ding, Tianli, et al. "Goalseye: Learning high speed precision table tennis on a physical robot." arXiv preprint arXiv:2210.03662 (Oct. 13, 2022).

Driess, Danny, et al. "Palm-e: An embodied multimodal language model." (Mar. 6, 2023).

Dwibedi, Debidatta, et al. "Learning actionable representations from visual observations." 2018 IEEE/RSJ international conference on intelligent robots and systems (IROS). IEEE, Feb. 2, 2018).

Garcia, Gabriel, Robert Griffin, and Jerry Pratt. "0-step capturability, motion decomposition and global feedback control of the 3D variable height-inverted pendulum." arXiv preprint arXiv:1912.06078 (2019).

Gia et al., "Densely Connected Feature Pyramid Network for Image Segmentation," 2020 8th International Conference on Digital Home (ICDH).

Griffin, Robert J., et al. "Capture point trajectories for reduced knee bend using step time optimization." 2017 IEEE-RAS 17th International Conference on Humanoid Robotics (Humanoids). IEEE, 2017.

Griffin, Robert J., et al. "Footstep planning for autonomous walking over rough terrain." 2019 IEEE-RAS 19th international conference on humanoid robots (humanoids). IEEE, 2019.

Griffin, Robert J., et al. "Straight-leg walking through underconstrained whole-body control." 2018 IEEE International Conference on Robotics and Automation (Icra). IEEE, 2018.

Griffin, Robert J., et al. "Walking stabilization using step timing and location adjustment on the humanoid robot, atlas." 2017 IEEE/RSJ International Conference on Intelligent Robots and Systems (IROS). IEEE, 2017.

Gupta, Abhishek, et al. "Bootstrapped autonomous practicing via multi-task reinforcement learning." arXiv preprint arXiv:2203.15755 (Mar. 29, 2022).

Gupta, Abhishek, et al. "Relay policy learning: Solving long-horizon tasks via imitation and reinforcement learning." arXiv preprint arXiv:1910.11956 (Oct. 25, 2019).

(56) References Cited

OTHER PUBLICATIONS

Heravi, Negin, et al. "Visuomotor control in multi-object scenes using object-aware representations." arXiv preprint arXiv:2205.06333 (May 12, 2022).
Jang, Eric, et al. "Bc-z: Zero-shot task generalization with robotic imitation learning." Conference on Robot Learning. PMLR, (Feb. 4, 2022).
Jin et al., "Unified Language-Vision Pretraining in LLM With Dynamic Discrete Visual Tokenization," arXiv:2309.04669v3 [cs.CV] Mar. 22, 2024.
Kim et al., "Giving Robots a Hand: Learning Generalizable Manipulation with Eye-in-Hand Human Video Demonstrations," arXiv:2307.05959v1 (Jul. 12, 2023).
Kim et al., "Parallel Feature Pyramid Network for Object Detection," ECCV 2018.
Kim, Moo Jin, et al. "Openvla: An open-source vision-language-action model." arXiv preprint arXiv:2406.09246 (Jun. 13, 2024).
Kirillov et al., "Panoptic Feature Pyramid Networks," IEEE Xplore (2019).
Lee et al., "Learning Robot Activities from First-Person Human Videos Using Convolutional Future Regression," IEEE Xplore (2017).
Li et al., "Supervision Exists Everywhere: A Data Efficient Contrastive Language-Image Pre-Training Paradigm," arXiv:2110.05208v2 (Mar. 14, 2022).
Li et al., BLIP: Bootstrapping Language-Image Pre-training for Unified Vision-Language Understanding and Generation, Proceedings of the 39 th International Conference on Machine Learning, Baltimore, Maryland, USA, PMLR 162, 2022.
Lin et al., "Feature Pyramid Networks for Object Detection," IEEE Xplore (2017).
Lin et al., "Feature Pyramid Networks for Object Detection," IEEE Xplore (2024).
Lin et al., "VILA: On Pre-training for Visual Language Models," https://github.com/Efficient-Large-Model/VILA (2024).
Liu et al., "A Survey of Attacks on Large Vision-Language Models: Resources, Advances, and Future Trends," Journal of Latex Class Files, vol. 14, No. (Aug. 8, 2021).
Liu et al., "Imitation from Observation: Learning to Imitate Behaviors from Raw Video via Context Translation," arXiv:1707.03374v2 (Jun. 18, 2018).
Liu et al., "Improved Baselines with Visual Instruction Tuning," IEEE Xplore (2024).
Liu et al., "RoBERTa: A Robustly Optimized BERT Pretraining Approach," arXiv:1907.11692v1 (Jul. 26, 2019).
Liu et al., "Visual Instruction Tuning," 37th Conference on Neural Information Processing Systems (NeurIPS 2023).
Lynch, Corey, and Pierre Sermanet. "Language conditioned imitation learning over unstructured data." arXiv preprint arXiv:2005.07648 (Jul. 7, 2020).
Lynch, Corey, et al. "Interactive language: Talking to robots in real time." IEEE Robotics and Automation Letters (Oct. 12, 2023).
Lynch, Corey, et al. "Learning latent plans from play." Conference on robot learning. Pmlr, (Dec. 20, 2020).
Lynch, Corey, Kamelia Aryafar, and Josh Attenberg. "Images don't lie: Transferring deep visual semantic features to large-scale multimodal learning to rank." Proceedings of the 22nd ACM SIGKDD international conference on knowledge discovery and data mining. (Nov. 20, 2015).
Mandi et al., "Towards More Generalizable One-shot Visual Imitation Learning," bencharXiv: 2110.13423v2 [cs.RO] Feb. 8, 2022.
Maniparambil et al., "Do Vision and Language Encoders Represent the World Similarly?" IEEE Xplore (2024).
Available online at https://x.com/Tesla_Optimus/status/1844789517833629717, at least as early as Oct. 11, 2024.
Available online at https://x.com/Tesla_Optimus/status/1862116407594377698, at least as early as Nov. 28, 2024.
Available online at https://x.com/Tesla_Optimus/status/1866171391156113740, at least as early as Dec. 9, 2024.
Available online at https://youtu.be/_MBd_XfXy9M?si=PbEHUJpRUFqaxS3J, at least as early as Jun. 26, 2023.
Available online at https://youtu.be/BNSZ8Fwcd20?si=_YnVgjYblVuhASk1, at least as early as Oct. 27, 2023.
Available online at https://youtu.be/BvFxD-8AhJA?si=Vx1F4a76tbQDUX48, at least as early as Nov. 16, 2023.
Available online at https://youtu.be/cpraXaw7dyc?si=JvPaT6eMA18psrmU, at least as early as Dec. 13, 2023.
Available online at https://youtu.be/GtPs_ygfaEA?si=7lv6MEFvFoaacKfa, at least as early as Aug. 15, 2023.
Available online at https://youtu.be/SHPxcRBIXN0?si=VbJqbK7jzUqtZGmn, at least as early as Sep. 26, 2023.
Available online at https://youtu.be/sihlDeJ4Hmk?si=fJsKpvRFPzFejmS6, at least as early as Dec. 27, 2023.
Available online at https://youtu.be/XiQkeWOFwmk?si=1qOPC8gXgmmGvXRT, at least as early as May 16, 2023.
Barker et al., Natural head movement for HRI with a muscular-skeletal head and neck robot, 2017, IEEE, p. 587-592 (Year: 2017).
Cheng et al., "Human Posture Estimation Using Voxel Data for "Smart" Airbag Systems: Issues and Framework," IEEE, p. 84-89 (2004).
Cheng et al., Human posture estimation using voxel data for "smart" airbag systems: issues and framework, 2004, IEEE, p. 84-89 (Year: 2004).
Droeschel et al., "Learning to Interpret Pointing Gestures with a Time-of-Flight Camera," IEEE, p. 481-488 (2011).
Duran-Hernandez et al., "Control Implementation in a Low-cost Designed Biped Robot to Reproduce Squats," The 10th International Conference on Control, Mechatronics and Automation, Nov. 9, 2022.
Englsberger et al., "Overview of the Torque-Controlled Humanoid Robot TORO," 2014 14th IEEE-RAS International Conference on Humanoid Robots (Humanoids), Nov. 18-20, 2014. Madrid, Spain.
Frohlich et al., "Design and Impementation of a Spherical Joint for Mobile Manipulators," IEEE, p. 251-258 (2016).
Gao et al., Development of a low motion-noise humanoid neck: Statics analysis and experimental validation, 2010, IEEE, p. 1203-1208 (Year: 2010).
Haddadin et al., The "DLR crash report": Towards a standard crash-testing protocol for robot safety—Part II: Discussions, 2009, IEEE, p. 280-287 (Year: 2009).
Han et al., Mechanical design of robot lower body based on four-bar linkage structure for energy efficient bipedal walking, 2016, IEEE, p. 402-407 (Year: 2016).
Hao et al., Design and kinematics analysis of a 4-DOF articulated steering mechanism, 2015, IEEE, p. 5875-5880 (Year: 2015).
Hebi Robotics, "T-Series Actuator," Jan. 29, 2024.
Jeung et al., Realization of human neck motion with novel robotic mechanism, 2016, IEEE, p. 482-486 (Year: 2016).
Keselman et al., "Intel RealSense stereoscopic depth cameras," in Proceedings of the IEEE Conference on Computer Vision and Pattern Recognition Workshops, pp. 1-10, 2017.
Lim et al., Basic emotional walking using a biped humanoid robot, 1999, IEEE, p. 954-959 (Year: 1999).
Luo et al., Human body trajectory generation using point cloud data for robotics massage applications, 2014, IEEE, p. 5612-5617 (Year: 2014).
Machine translation of CN-114147745-A (Year: 2022).
Machine translation of DE-112018003604-T5 (Year: 2020).
Machine translation of WO-2020190594-A1. (Year: 2020).
Merged original document (KR 20180107353) with English Translation (Year: 2018).
Merged original document with English translation (CN 112959343); Paragraphs added for citation purposes. (Year: 2021).
Mikayla Tetteh-Martey, (date posted Nov. 3, 2024), Blurring Lines: Resurgence of 'I, Robot', Cornellsun.com, URL: (https:// www.cornellsun.com/article/2024/11/blurring-lines-resurgence-of-i-robot), (Year: 2024).
Mike Oitzman, (date posted Aug. 6, 2024), Figure 02 humanoid robot is ready to get to work, therobotreport.com, URL: (https://www.therobotreport.com/figure-02-humanoid-robot-is-ready-to-get-to-work/), (Year: 2024).

(56) References Cited

OTHER PUBLICATIONS

Mokhtari et al., Taban:A Retro-Projected Social Robotic—Head for Human-Robot Interaction, 2019, IEEE, p. 46-51 (Year: 2019).
Nakada et al., Deep Learning of Neuromuscular and Visuomotor Control of a Biomimetic Simulated Humanoid, 2020, IEEE, p. 3952-3959 (Year: 2020).
Netzev et al., "Many Faced Robot—Design and Manufacturing of a parametric, Modular and Open Source Robot Head," IEEE, p. 342-348 (2019).
Netzev et al., Design and implementation of a spherical joint for mobile manipulators, 2019, IEEE, p. 342-348 (Year: 2019).
Ophaswongse et al., Optimal Design of a Novel 3-DOF Orientational Parallel Mechanism for Pelvic Assistance on a Wheelchair: An Approach Based on Kinematic Geometry and Screw Theory, 2020, IEEE, p. 3315-3322 (Year: 2020).
Or, Computer Simulations of a Humanoid Robot Capable of Walking Like Fashion Models, 2012, IEEE, p. 241-248 (Year: 2012).
Or, Humanoids Grow a Spine: The Effect of Lateral Spinal Motion on the Mechanical Energy Efficiency, 2012, IEEE, p. 1-11 (Year : 2012).
Park et al., Mechanical Design of Humanoid Robot Platform KHR-3 (Kaist Humanoid Robot 3: HUBO), 2005, IEEE, p. 321-3226 (2005).
Park et al., Design of a lower limb exoskeleton including roll actuation to assist walking and standing up, 2015, IEEE, p. 359-354 ( Year: 2015).
Pateromichelakis et al., Head-eyes system and gaze analysis of the humanoid robot Romeo, 2014, IEEE, p. 1374-131379 (Year: 2014).
Pateromichelakis et al., Head-eyes system and gaze analysis of the humanoid robot Romeo, 2014, IEEE, p. 1374-1379 (Year: 2014).
Shafti et al., Real-time Robot-assisted Ergonomics, 2019, IEEE, p. 1975-1981 (Year: 2019).
Souissi et al., Influence of the number of humanoid vertebral column pitch joints in flexion movements, 2011, IEEE, p. 227-282 ( Year: 2011).
Tsagarakis et al., Lower body realization of the baby humanoid 'iCub', 2007, IEEE, p. 3616-3622 (Year: 2007).
Yaghoubi et al., Region-Based CNNs for Pedestrian Gender Recognition in Visual Surveillance Environments, 2019, IEEE, p. 1-5 (Year: 2019).
"A lightweight robotic leg prosthesis replicating the biomechanics of the knee, ankle, and toe joint", published Nov. 23, 2022 retrieved from Wayback machine URLhttps://www.science.org/doi/10.1126/scirobotics.abo3996 on Feb. 22, 2026 (Year: 2022).
Nvidia "Object Detection Synthetic DataGeneration," Nvidia Corporation, (Nov. 9, 2024).
Peng et al., "DeepMimic: Example-Guided Deep Reinforcement Learning of Physics-Based Character Skills," ACM Trans. Graph., vol. 37, No. 4, Article 143. Publication date: Aug. 2018.
Pirk, Sören, et al. "Online object representations with contrastive learning." arXiv preprint arXiv:1906.04312 (Jun. 10, 2019).
Radford et al., "Improving Language Understanding by Generative Pre-Training," 2018.
Radford et al., "Language Models are Unsupervised Multitask Learners," 2019.
Radford et al., "Learning Transferable Visual Models From Natural Language Supervision," Proceedings of the 38 th International Conference on Machine Learning, PMLR 139, 2021.
Raffel et al., "Exploring the Limits of Transfer Learning with a Unified Text-to-Text Transformer," Journal of Machine Learning Research 21 (2020) 1-67.
Ramachandruni et al., "Attentive Task-Net: Self Supervised Task-Attention Network for Imitation Learning using Video Demonstration," 2020 IEEE International Conference on Robotics and Automation (ICRA) May 31—Paris, France. (Aug. 31, 2020).
Rombach et al., "High-Resolution Image Synthesis with Latent Diffusion Models," IEEE Xplore (2022).
Sanh et al., "DistilBERT, a distilled version of BERT: smaller, faster, cheaper and lighter," arXiv:1910.01108v4 (Mar. 1, 2020).
Schulman et al., "Proximal Policy Optimization Algorithms," arXiv:1707.06347v2 (Aug. 28, 2017).
Sermanet, Pierre, et al. "Time-contrastive networks: Self-supervised learning from video." 2018 IEEE international conference on robotics and automation (ICRA). IEEE, (Mar. 20, 2018).
Sharma et al., "Third-Person Visual Imitation Learning via Decoupled Hierarchical Controller," 33rd Conference on Neural Information Processing Systems (NeurIPS 2019), Vancouver, Canada.
Sieb et al., "Graph-Structured Visual Imitation," 3rd Conference on Robot Learning (CoRL 2019), Osaka, Japan. (May 12, 2020).
Smith et al., "AVID: Learning Multi-Stage Tasks via Pixel-Level Translation of Human Videos," arXiv:1912.04443v3 (Jun. 21, 2020).
Stadie et al., "Third-Person Imitation Learning," arXiv:1703.01703v2 (Sep. 22, 2019).
Sun et al., "Learning by Watching via Keypoint Extraction and Imitation Learning," Machines 2022, 10, 1049. https://doi.org/10.3390/machines10111049 (Nov. 9, 2022).
Team, Octo Model, et al. "Octo: An open-source generalist robot policy." arXiv preprint arXiv:2405.12213 (May 20, 2024).
Touvron et al., "Llama 2: Open Foundation and Fine-Tuned Chat Models," arXiv:2307.09288v2 (Jul. 19, 2023).
Vaswani et al., "Attention Is All You Need," 31st Conference on Neural Information Processing Systems (NIPS 2017), Long Beach, CA, USA. (Jun. 12, 2017).
Wang et al., "Structbert: Incorporating Language Structures Into Pre-Training for Deep Language Understanding,," arXiv:1908.04577v3 (Sep. 27, 2019).
Wiedebach, Georg, et al. "Walking on partial footholds including line contacts with the humanoid robot atlas." 2016 IEEE-RAS 16th International Conference on Humanoid Robots (Humanoids). IEEE, 2016.
Xiong et al., "Learning by Watching: Physical Imitation of Manipulation Skills from Human Videos," arXiv:2101.07241v2 (Nov. 14, 2021).
Yao et al., "Filip: Fine-Grained Interactive Language-Image Pre-Training," arXiv:2111.07783v1 (Nov. 9, 2021).
Yin et al., "A Survey on Multimodal Large Language Models," arXiv:2306.13549v2 (Apr. 1, 2024).
Zhang et al., "An Object Attribute Guided Framework for Robot Learning Manipulations from Human Demonstration Videos," 2019 IEEE/RSJ International Conference on Intelligent Robots and Systems (IROS) Macau, China, (Nov. 4, 2019).
Zhang et al., "Llama-Adapter: Efficient Fine-Tuning of Large Language Models With Zero-Initialized Attention," arXiv:2303.16199v3 (Sep. 18, 2024).
Zhang et al., "MM-LLMs: Recent Advances in MultiModal Large Language Models," arXiv:2401.13601v5 (May 28, 2024).
Zhou et al., "Watch, Try, Learn: Meta-Learning From Demonstrations and Rewards," arXiv:1906.03352v4 (Jan. 30, 2020).
Zitkovich, Brianna, et al. "Rt-2: Vision-language-action models transfer web knowledge to robotic control." Conference on Robot Learning. PMLR, (Jul. 28, 2023).
ttps/startu-wey.com/Figure-announces-70m-Seres-A-to-suppor-commercialzaton-of-Figure-01-humanoid-robot/531/2023( Year: 2023).
https://supercarblondie.com/unitree-humanoid-robot-word-speed-record/(Year 2024).
https://robotsguide.com/robots/hrp4 (Year: 2010).
https://www.economist.com/science-and-technology/2024/06/05/he-uesto-buld-obots-that-look-and-behavelike-humans(Year 2024).
https://lifearchitect.ai/humanoids/ (Year: 2023).
https://robotsguide.com/robots/optimus (Year: 2022).
Albers et al., Upper Body of a new Humanoid Robot—the Design of ARMAR III, 2006, IEEE, p. 308-309 (Year: 2006).
Available online at https://www.youtube.com/watch?v=-9EM5_VFIt8, at least as early as Apr. 16, 2024.
Available online at https://www.youtube.com/watch?v=-HizP4UQvug, at least as early as Apr. 25, 2024.
Available online at https://youtu.be/SS3Ga2HQQ0s?si=Dwr3sJuCsOeUoSLj, at least as early as Nov. 20, 2023.
Available online at https://www.youtube.com/watch?v=_mQJw8VhZ7w, at least as early as Oct. 5, 2022.
Available online at https://www.youtube.com/watch?v=_mQJw8VhZ7w&t=111s, as least as early as Oct. 5, 2022.

(56) References Cited

OTHER PUBLICATIONS

Available online at https://www.youtube.com/watch?v=1fC7b2LjVW4, at least as early as Jul. 12, 2016.
Available online at https://www.youtube.com/watch?v=20GHG-R9eFI, at least as early as Mar. 6, 2023.
Available online at https://www.youtube.com/watch?v=29ECwExc-_M&t=2s, at least as early as Apr. 17, 2024.
Available online at https://www.youtube.com/watch?v=67CUudkjEG4, at least as early as Oct. 26, 2009.
Available online at https://www.youtube.com/watch?v=a-R4H8-8074, at least as early as Jun. 6, 2015.
Available online at https://www.youtube.com/watch?v=B_l2k7MZEKg, at least as early as Jun. 30, 2024.
Available online at https://www.youtube.com/watch?v=B-ebMigAHzQ, at least as early as Sep. 30, 2024.
Available online at https://www.youtube.com/watch?v=bdVrWxjK2vo, at least as early as Sep. 17, 2024.
Available online at https://www.youtube.com/watch?v=Bmglbk_Op64&t=1s, at least as early as Nov. 10, 2011.
Available online at https://www.youtube.com/watch?v=bUrLuUxv9gE, at least as early as Aug. 30, 2024.
Available online at https://www.youtube.com/watch?v=CbA9wA9etGA, at least as early as Sep. 19, 2024.
Available online at https://www.youtube.com/watch?v=CUhuhleQNos, at least as early as May 22, 2019.
Available online at https://www.youtube.com/watch?v=DrNcXgoFv20, at least as early as Oct. 18, 2024.
Available online at https://www.youtube.com/watch?v=dY57qnD_O7U, at least as early as Jul. 27, 2021.
Available online at https://www.youtube.com/watch?v=F_7lPm7f1vl, at least as early as Oct. 30, 2024.
Available online at https://www.youtube.com/watch?v=Fb_R6IDDU4A, at least as early as Oct. 9, 2020.
Available online at https://www.youtube.com/watch?v=FuNFr7V7KFQ, at least as early as Aug. 19, 2024.
Available online at https://www.youtube.com/watch?v=G6JE7mNYz2A, at least as early as Oct. 17, 2024.
Available online at https://www.youtube.com/watch?v=GzX1qOIO1bE, at least as early as May 13, 2024.
Available online at https://www.youtube.com/watch?v=IE-YBaYjbqY, at least as early as Dec. 10, 2013.
Available online at https://www.youtube.com/watch?v=ioOkbUQqmZ0, at least as early as Nov. 9, 2022.
Available online at https://www.youtube.com/watch?v=iWC8rSjDywU, at least as early as Oct. 18, 2024.
Available online at https://www.youtube.com/watch?v=jWTWWuzB6Cg, at least as early as Aug. 27, 2024.
Available online at https://www.youtube.com/watch?v=LBeml9AmTT4, at least as early as Apr. 7, 2015.
Available online at https://www.youtube.com/watch?v=LdxlegrxsBQ, at least as early as Dec. 6, 2024.
Available online at https://www.youtube.com/watch?v=MCbGeC-kuBM, at least as early as Aug. 5, 2024.
Available online at https://www.youtube.com/watch?v=oXBYZxa25vc&t=1s, at least as early as Apr. 3, 2013.
Available online at https://www.youtube.com/watch?v=q8ldbodRG14, at least as early as Feb. 26, 2024.
Available online at https://www.youtube.com/watch?v=q8ldbodRG14, at least as early as May 22, 2019.
Available online at https://www.youtube.com/watch?v=qw2y0kceAv0, at least as early as Oct. 15, 2024.
Available online at https://www.youtube.com/watch?v=r2r26ebhtYQ, at least as early as Feb. 25, 2025.
Available online at https://www.youtube.com/watch?v=UBbk18oZbTc, at least as early as Oct. 14, 2024.
Available online at https://www.youtube.com/watch?v=UHe1zSQwep0, at least as early as Oct. 14, 2024.
Available online at https://www.youtube.com/watch?v=ujdK3yd2gHY, at least as early as Jul. 2, 2024.
Available online at https://www.youtube.com/watch?v=UPOLcE1vwA0, at least as early as Apr. 28, 2016.
Available online at https://www.youtube.com/watch?v=uVcBa6NXAbk, at least as early as Feb. 21, 2025.
Available online at https://www.youtube.com/watch?v=v8UaiRgqvlc, at least as early as Mar. 5, 2025.
Available online at https://www.youtube.com/watch?v=y-j4dixQQml&t=222s, at least as early as May 22, 2012.
Available online at https://www.youtube.com/watch?v=yBmatGQ0giY&t=1s, at least as early as Aug. 11, 2022.
Available online at https://www.youtube.com/watch?v=zkBnFPBV3f0, at least as early as Jul. 11, 2013.
Available online at https://www.youtube.com/watch?v=zLhA-RWBBYU, at least as early as Jul. 5, 2024.
Available online at https://www.youtube.com/watch?v=zmqWU2dQKZ8, at least as early as Oct. 24, 2024.
Available online at https://x.com/elonmusk/status/1752516361799258318, at least as early as Jan. 30, 2024.

* cited by examiner 15B
15B
206.10.2.4
206.10.2.6
206.2
206.10.2.6
210.10.4L
210.10.2L 210.10.2L,
210.10.4L
206.10.10
210.4.2
210.4.6
210.4.2.2
206.6
210.4.2.4
D
206.10.2.2
206.10.6
210.4.4
210.4.6
210.8.2L,
210.8.4L
210.4.4.4
206.10.8
206.10.2.4
206.10.2.2
206.10.4
210.4.4.2
SEE

SEE 206.4.2
SEE 206.2
206.10.2.6
206.10.6

TORSO OF A HUMANOID ROBOT

PRIORITY CLAIM AND CROSS-REFERENCE TO RELATED APPLICATIONS

This application claims priority under 35 U.S.C. § 119 (e) to U.S. Provisional Patent Application No. 63/573,543, filed Apr. 3, 2024; U.S. Provisional Patent Application No. 63/632,630, filed Apr. 11, 2024; U.S. Provisional Patent Application No. 63/634,697, filed Apr. 16, 2024; U.S. Provisional Patent Application No. 63/564,560, filed Mar. 13, 2024; and U.S. Provisional Patent Application No. 63/635,846, filed Apr. 18, 2024, each of which is expressly incorporated by reference herein in its entirety.

Reference is hereby made to: (i) PCT Application Nos. PCT/US2025/012544, PCT/US2025/010425, PCT/US2025/011450, and PCT/US2025/016930; (ii) U.S. patent application Ser. Nos. 18/914,800, 18/904,332, 18/919,263, 18/919,274, 19/006,191, 19/000,626, 19/038,657, 19/064,596, and 19/066,122; (iii) U.S. Design patents application Ser. Nos. 29/928,748 and 29/889,764; and (iv) U.S. Provisional Patent Application Nos. 63/626,030, 63/626,035, 63/626,028, 63/626,034, 63/564,741, 63/626,037, 63/707,547, 63/708,003, 63/557,874, 63/626,040, 63/696,533, 63/696,507, 63/626,039, 63/722,057, 63/626,105, 63/625,362, 63/625,370, 63/625,381, 63/625,384, 63/625,389, 63/625,405, 63/625,423, 63/625,431, 63/685,856, 63/700,749, 63/633,405, 63/635,152, 63/561,317, 63/634,599, 63/574,349, 63/561,311, 63/561,313, 63/633,920, 63/561,318, 63/556,102, 63/633,931, 63/633,941, and 63/632,683, each of which is expressly incorporated by reference herein in its entirety.

TECHNICAL FIELD

This disclosure relates to a torso assembly of a robot, specifically a general-purpose humanoid robot. The torso assembly includes various parts, assemblies, and connections configured to operably couple the head, arms, and legs of the robot to provide the robot with the ability to substantially mimic the movements, functionality and capabilities of a human being.

BACKGROUND

The current workplace landscape is marked by an unparalleled labor shortage, evident in over 10 million unsafe or undesirable jobs within the United States. To counter this ever-expanding labor shortage, it has become imperative to design and integrate advanced robots capable of handling unappealing and even hazardous workplace tasks. With the goal of performing these tasks in an optimal and efficient manner, advanced robots are typically general-purpose humanoid robots tailored for human-centric environments.

These general-purpose humanoid robots emulate human form and functionality with two legs, two arms, and a face-like screen. With the general-purpose humanoid robot's emulation of the human body, arises the necessity for various actuators arranged within the robot to closely replicate human movements and capabilities. The need for actuators to be capable of mimicking human movement and functions extends far beyond cosmetic resemblance. For example, it is also desirable that various actuators be capable of manipulating the arms, legs, and other assemblies of the robot to seamlessly interact with and physically manipulate diverse objects in complex environments, while performing in a durable, cost-effective, and controllable manner using the robot's limited resources, including its battery power resources.

SUMMARY

The present disclosure provides a humanoid robot, comprising: a torso having a side portion and a vent opening positioned near said side portion; a fan positioned within an extent of the torso and near said vent opening, wherein said fan is configured to generate an air flow path through an extent of the torso. The robot also includes a central processing unit coupled to a first printed circuit board and a graphical processing unit coupled to a second printed circuit board. A first heat sink has a first extent thermally coupled to the central processing unit and a second extent positioned within the air flow path. A second heat sink has a first extent thermally coupled to the graphical processing unit and a second extent positioned within the air flow path. The first heat sink is separated by an appreciable distance from the second heat sink.

In some embodiments, the humanoid robot further comprises a plurality of fins. Each fin of the plurality of fins may be coupled to the first heat sink and positioned within the air flow path. In some embodiments, the first printed circuit board may be coupled to the first heat sink using a fastener. A biasing member may be positioned adjacent to the fastener and between both the first printed circuit board and the first heat sink. The fastener may apply a first coupling force that is directed towards the first heat sink.

In some embodiments, the humanoid robot may further comprise a carrier board. The carrier board may be coupled to the first printed circuit board using a fastener. This fastener may apply a second coupling force oriented in an opposite direction from the first coupling force. In another embodiment, the carrier board may be coupled to both the first printed circuit board and the second printed circuit board.

In some embodiments, the humanoid robot may further comprise an energy attenuation assembly coupled to an exterior surface of the torso. The humanoid robot may also further comprise an upper fan positioned above a lower edge of the energy attenuation assembly. In some embodiments, the humanoid robot may further comprise a manifold that extends between the fan and the upper fan. The fan may be an upper fan, and a majority of the air flow path may be contained within the manifold.

The present disclosure also provides a humanoid robot comprising a torso that includes: (i) an electric rotary left arm actuator, (ii) an electric rotary right arm actuator, (iii) an upper reference line that extends between a lower extent of the left and right arm actuators, and (iv) a vertical reference plane that is both aligned with a forwardmost extent of the torso and parallel with a coronal plane of the robot. A vent opening is: (i) positioned adjacent to the upper reference line, (ii) has at least an extent located below the upper reference line, and (iii) includes a portion that is positioned near an extent of the left arm actuator. A fan, with an air intake, is positioned within the torso. The air intake is not directed toward the vertical reference plane and is configured to generate an air flow path through the vent opening. A battery pack is positioned within the torso and near the air flow path.

In some embodiments, the humanoid robot may further comprise at least three processing units. These processing units may be positioned within the torso, around the battery pack, and within the air flow path of the fan. In some embodiments, the humanoid robot may further comprise a first heat sink thermally coupled to a first processing unit of the at least three processing units, and a second heat sink thermally coupled to a second processing unit of the at least three processing units. The first heat sink may be separate and distinct from the second heat sink to minimize heat transfer from the first processing unit to the second processing unit.

In some embodiments, the humanoid robot may further include a plurality of fins coupled to at least one of the first heat sink and the second heat sink. The fins may be positioned within the air flow path. In some embodiments, the humanoid robot may further comprise a waist coupled to a lower extent of the torso below the battery pack, and a waist vent opening positioned within a left, rear extent of the torso. The waist vent opening may provide for the discharge of the air flow path from the torso and waist. The humanoid robot may further comprise a manifold that substantially extends from the vent opening to the waist vent opening. A majority of the air flow path may be contained within the manifold.

The present disclosure further provides a humanoid robot comprising a torso having a side portion and first and second vent openings located proximate to the side portion of the torso. A manifold substantially extends between the first and second vent openings. A fan is positioned within an extent of the torso and proximate to the first vent opening. The fan is configured to generate an air flow path that primarily flows through the manifold and the torso. At least three processing units are positioned within the torso, with each processing unit having an operating temperature. The air flow path is configured to ensure that the operating temperature of each of the at least three processing units does not exceed 110 degrees Celsius during the operation of the humanoid robot.

In some embodiments, the humanoid robot may further comprise a first heat sink coupled to a first processing unit of the at least three processing units, and a second heat sink coupled to a second processing unit of the at least three processing units. The first heat sink is separate and distinct from the second heat sink to minimize heat transfer from the first processing unit to the second processing unit. In some embodiments, the humanoid robot may further comprise a plurality of heat transfer features coupled to at least one of the first heat sink and the second heat sink and positioned within the air flow path. At least a portion of the heat transfer features may extend into the manifold. The first processing unit of the at least three processing units may be coupled to the first heat sink using a fastener, and a biasing member may be positioned adjacent to the fastener and between both the first processing unit and the first heat sink. The fastener may apply a first coupling force that is directed towards the first heat sink.

In some embodiments, the humanoid robot may further comprise a carrier board. The carrier board may be coupled to the first printed circuit board using a fastener, wherein the fastener applies a second coupling force oriented in an opposite direction from the first coupling force. The carrier board may be coupled to the at least three processing units within the torso.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1:
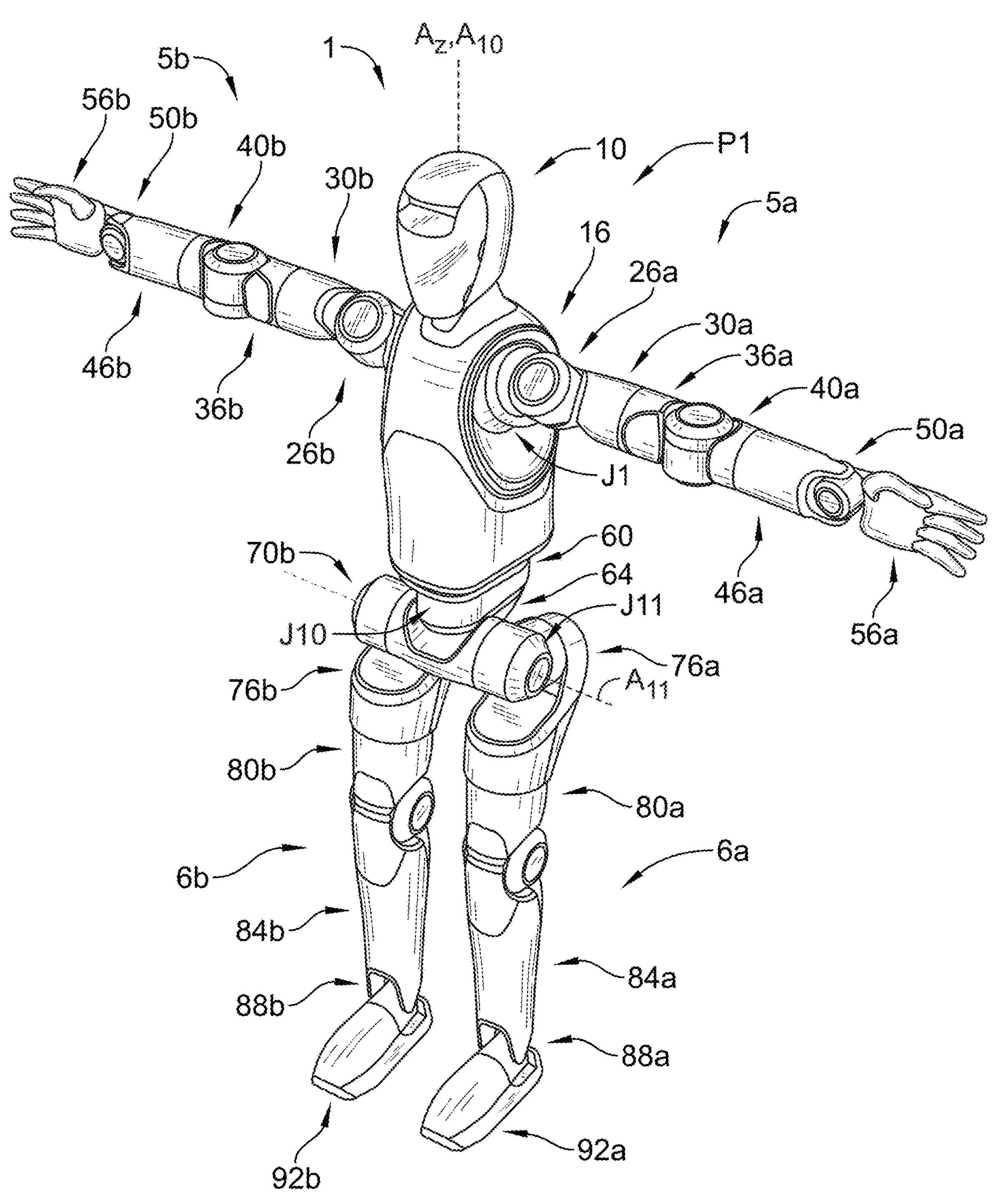
FIG. 1 is a perspective view of a robot in an upright, arms extended, standing position P1, which is comprised of at least: (i) a head and neck, (ii) a torso, (iii) left and right arms, (iv) left and right hands, (v) spine and pelvis, (vi) left and right legs, and (vii) left and right talus and feet.

In the following detailed description, numerous specific details are set forth by way of examples in order to provide a thorough understanding of the relevant teachings. However, it should be apparent to those skilled in the art that the present teachings may be practiced without such details. In other instances, well-known methods, procedures, components, and/or circuitry have been described at a relatively high-level, without detail, in order to avoid unnecessarily obscuring aspects of the present disclosure.

While this disclosure includes several embodiments in many different forms, there is shown in the drawings and will herein be described in detail embodiments with the understanding that the present disclosure is to be considered as an exemplification of the principles of the disclosed methods and systems, and is not intended to limit the broad aspects of the disclosed concepts to the embodiments illustrated. As will be realized, the disclosed methods and systems are capable of other and different configurations, and several details are capable of being modified, all without departing from the scope of the disclosed methods and systems. For example, one or more of the following embodiments, in part or whole, may be combined consistent with the disclosed methods and systems. As such, one or more steps from the flow charts or components in the Figures may be selectively omitted and/or combined consistent with the disclosed methods and systems. Additionally, one or more steps from the flow charts or the method of assembling the shoulder and upper arm may be performed in a different order. Accordingly, the drawings, flow charts, and detailed description are to be regarded as illustrative in nature, and not as restrictive or limiting.

A. Introduction

The torso assembly disclosed in this Application is designed to be a component within a robot system, for example, a versatile and highly functional humanoid robot. The torso assembly extends between the waist, the shoulders, and the head/neck and is designed to: (i) provide the robot 1 with a generally humanoid shape, (ii) provide structural and operable support for the arm assemblies and the head/neck, and (iii) house and protect the arm actuators, an electronic assembly (e.g., that includes a battery pack, a computing device, a power distribution assembly, sensors, etc.), and a cooling system configured to transfer heat from certain components of the electronic assembly (e.g., computing device, power distribution and control assemblies, etc.) to cool these components. To house and protect the arm actuators, the electronic assembly, and the cooling system, the torso includes a frontal skeleton configured to be coupled to a rear skeleton. The frontal skeleton is designed to offset and redistribute most of the loads that the robot experiences while it performs various activities, tasks, and movements. As such, the frontal skeleton includes at least one region, and preferably several regions, that have been selectively thickened. Overall, the selectively thickened regions have been designed to minimize the weight of the torso, while still providing proper structural support to allow for the redistribution of loads. As such, the thickness of the frontal skeleton may vary from less than 1 mm to over 20 mm. Implementing varying thicknesses in the front skeleton is an unconventional approach that provides robot 1 with substantial advantages over conventional robots that lack a front skeleton with variable thicknesses.

Unlike conventional robots, the torso 16 is purposely designed with a complex geometry. As such, a lower torso extent (e.g., within a bottom ⅓ portion of the height of the torso) is larger in width and volume than an upper torso extent (e.g., positioned within a top ⅓ portion of the height of the torso). Also, the variation between the widest point and the narrowest point of the torso is less than 10% of the torso's height, and preferably approximately 5% of the torso's height. Thus, the torso 16 tapers outwardly and downwardly between its upper and lower extents or portions. Finally, the depth of the torso 16 (as defined between the front and rear walls or outer surfaces of the torso) does not substantially change between the bottom of the arm tubes and the lowest extent of the torso. This configuration of the torso is beneficial over conventional robots—especially those with a dissimilar upward V-shaped torso—because it provides the robot 1 with a number of advantages, including: (i) making the robot 1 more stable while operating and performing tasks, (ii) increasing the volume contained within the torso for positioning other valuable components (e.g., batteries, power supplies, computing device, and sensor assemblies), (iii) preventing the front of the torso from having bulges, projections, or protrusions which can limit the robot's cross-torso reach, and (iv) eliminating bulges, projections, or protrusions from being positioned in the rear of the torso, which can adversely impact the robot's center of mass.

To help ensure that the inventive robot 1 has a sufficient "cross-torso reach," which improves its functionality and utility, the torso, in its fully assembled state, has a curvilinear trapezoidal prism configuration. This shape is defined by having a curvilinear front extent, substantially linear non-parallel side extents, and a curvilinear rear extent with a curvilinear length greater than that of the front extent. As shown in the Figures, the curvilinear length of the rear extent is between 25% to 40% larger, preferably 27% to 37% larger, than the curvilinear length of the front extent, and the curvilinear length of the front extent may be between 10% and 20% larger than the substantially linear side lengths. As such, the rear surface area of the torso 16 may be between 1% to 35% larger, preferably between 10% and 25% larger, than the front surface area of the torso. This curvilinear trapezoidal prism configuration allows the arm assemblies of the robot to move across a substantial extent of the robot's torso before coming into contact with it, thereby providing the robot's cross-torso reach. As designed, the maximized cross-torso reach of robot 1 provides substantial benefits over conventional robots because the robot's reachable area is increased, allowing it to perform more tasks without spending valuable time repositioning itself. Minimizing the need to reposition not only increases the speed at which the robot can perform tasks but also increases its runtime by not consuming unnecessary power from the battery pack.

Unlike conventional robots, the spine yaw actuator is not centered beneath the torso 16 of the robot 1. Instead, the spine yaw actuator is offset towards a forwardmost extent of the torso. This helps position and center the mass of the torso 16 over the legs, which increases the robot's stability and balance, thus better mirroring human movement. In addition to being offset, the spine yaw actuator does not substantially extend into the volume of the torso 16 and is instead primarily positioned within the housing that extends downward from the main body of the waist. This configuration helps ensure that the spine yaw actuator does not occupy valuable space within the torso and helps ensure that there is enough clearance between a lower extent of the main body of the waist and the pelvis. The clearance provided by the housing enables the main body of the waist to have a shallow parabolic shape with a substantial surface area (e.g., greater than 40 $cm^2$). This configuration provides the robot 1 with a substantial benefit over conventional robots that have narrow, lower torsos (e.g., a steeply sloped lower torso with a width substantially equal to the actuator's width) because it substantially increases the volume contained within the torso.

Additionally, the clearance associated with the housing and the fact that the connection between the torso and the pelvis is limited to the diameter of the spine yaw actuator (e.g., the depth of the main body is over 50% larger than the diameter of the actuator) enables the robot 1 to lean to its left and/or right utilizing the spine roll actuator without causing the bottom of the waist to contact the hip. This feature also provides the robot 1 with a substantial benefit over conventional robots that form a large connection between the torso and pelvis, as this connection prevents those robots from leaning to the left or right at a location in the lower torso.

As illustrated in FIGS. 2-10, the combination of the battery pack and the computer may consume at least 45% of the total internal volume of the torso, but less than 80% of the total volume. Additionally, the battery pack may consume over 20% of the total volume of the torso 16, preferably over 30%, but less than 60%, and preferably less than 45%. Accordingly, the computer takes up over 10% of the total internal volume of the torso 16, preferably over 12.5%, but less than 25%, and preferably less than 17.5%. The positional relationship and sizing of the battery pack allow it to be a rechargeable 1.5 kWh to 5 kWh battery pack, preferably between 2 kWh and 3 kWh. As such, the battery pack is configured to provide the robot with run times between 2.5 and 8 hours, and preferably at least 3.5 hours, during normal operating conditions.

To effectively cool the computing device or the battery pack during operation, the inventive robot 1 includes a cooling system configured to generate an air flow path from the robot's environment through an extent of the robot's torso. Humanoid torsos are purposely designed with complex geometries that limit the available internal space for a cooling system. To avoid the challenge of fitting a cooling system within this complex geometry, conventional robot systems often omit ducting and/or manifolds, instead utilizing free-air systems where air is pulled into the torso and allowed to flow around until it finds an exit path. However, these conventional free-air systems do not directly target areas of greater heat within the torso to cool specific components, such as the compute elements. Without targeting these high-heat areas, the disclosed humanoid could not be used in a number of environments because the compute contained therein would quickly overheat and potentially be damaged. To overcome this challenge, the disclosed humanoid robot uses a uniquely designed cooling system that specifically cools components, such as the compute elements, in the torso.

To achieve this, the inventive robot 1 includes a cooling system with manifolds on the left and right sides of the torso that direct the flow of air. Each manifold extends from inlets located in an upper extent of the robot's torso to outlets located in a lower extent of the waist/torso, defining an air flow pathway. A left manifold is arranged near the computer of the electronics assembly, and a right manifold is arranged near the power distribution and control assemblies of the electronics assembly. There is at least one, and preferably two, heat sinks positioned within the left manifold and thus in fluid communication with it. Heat transfer features coupled to the heat sinks also extend into the air flow pathway of the left manifold. Each heat sink is directly coupled to components of the computing device (e.g., GPUs and CPUs) to enable effective heat transfer from these devices to the cool air flowing from the robot's environment. There are no heat sinks or heat transfer features associated with the right manifold. Instead, the right manifold is configured to generate an air flow path through the torso to direct hot air from inside the torso out, thereby drawing cooler air in and around the components of the electronics assembly.

As best shown in FIGS. 6-9, fresh air is drawn into the torso through vent openings in the torso housing via fans positioned within an extent of the upper torso and below an extent of the robot's arm assembly. A majority of the air drawn in by the fans is directed into the respective manifold. Air may then flow over a plurality of heat transfer features coupled to heat sinks within the manifold and is then discharged through a vent opening formed in the robot's lower torso and/or waist. Thus, an air flow pathway is defined into, through, and out of the torso 16 of the robot 1. When the robot performs tasks, this air flow can be utilized to cool the computing device (e.g., GPUs, CPUs) and/or the power distribution and control assemblies, and does not need to cool the battery pack. When the robot is charging, the airflow is not needed to cool the computing device but can be used to cool the battery pack to decrease charging times (e.g., by supplying a large amount of current to the robot). This dual-purpose cooling system saves weight, reduces parts, and provides substantial benefits over conventional robots that lack this capability.

B. Robot

As shown in FIGS. 1-19B, the robot 1 includes the following parts: (i) a head and neck 10, (ii) a torso 16, (iii) left and right arms 5*a*, 5*b* (generally arm 5), (iv) left and right hands 56*a*, 56*b*, (v) a spine 60, (vi) a pelvis 64, (vii) left and right legs 6*a*, 6*b*, and (viii) left and right feet 92*a*, 92*b*. The left and right arm assemblies 5*a*, 5*b* each include: a shoulder 26*a*, 26*b*, an upper humerus 30*a*, 30*b*, a lower humerus 36*a*, 36*b*, an upper forearm 40*a*, 40*b*, and a lower forearm 46*a*, 46*b*, and a wrist 50*a*, 50*b*. The left and right leg assemblies 6*a*, 6*b* each include: a hip 70*a*, 70*b*, an upper thigh 76*a*, 76*b*, a lower thigh 80*a*, 80*b*, a shin 84*a*, 84*b*, and a talus 88*a*, 88*b*. The head 10 is coupled to an upper portion of the torso 16. The left and right arm assemblies 5*a*, 5*b* are coupled to the torso 16 at respective arm actuators (J1) 190 that are housed in the torso 16. The spine 60 includes a waist 604 and a torso twist actuator (J10) 620 (also referred to as the spine Z or J10 spine actuator herein) housed in the waist 604. The spine 60 couples the torso 16 to the pelvis 64 and legs 6. The parts of the robot 1 function together to provide the robot 1 with a humanoid shape and enable it to perform human-like movements, which are not possible using conventional robots. From these figures, it can be seen that the torso 16 of the robot 1 extends between the spine 60, the shoulders 26*a*, 26*b*, and head/neck 10. The torso 16 is designed to: (i) provide the robot 1 with a humanoid shape, (ii) provide support for the arm assemblies 5 and the head/neck 10, and (iii) house and protect the arm actuators (J1) 190, an electronics assembly 200 (that includes a battery pack, a computing device, power distribution, sensors, etc.), and a cooling system 210 configured to transfer heat from certain components of the electronics assembly 200 (e.g., computing device 206, power distribution and control assemblies 204, etc.) to cool the components of the electronic assembly 200.

In FIG. 1, the robot 1 is standing in a neutral position, with its head 10 and torso 16 facing forward and stacked over its pelvis 64 and legs 6, and its arms extended. The positional relationship of the components within the robot 1 may be identified relative to the sagittal, coronal, and transverse planes of the robot 1, defined with the robot 1 in neutral position. Specifically, the sagittal plane ($P_S$) is defined as a vertical plane that contains the rotational axis ($A_{10}$) of the torso twist actuator (J10) 620, which is located in the spine 60 of the robot 1, and it divides the robot 1 into left and right sides, as indicated in at least FIGS. 5-6. The coronal plane ($P_C$) is defined as a vertical plane that also contains the rotational axis ($A_{10}$) of the torso twist actuator (J10) 620 located in the spine 60 of the robot 1, and it divides the robot 1 into front and rear sections, as indicated in at least FIG. 4. The transverse plane ($P_T$) is a horizontal plane that contains the rotational axes $A_{11}$ of the hip flex actuators (J11) 720, which are located in the hips 70 of the robot 1, and it divides the robot 1 into upper and lower halves (not shown).

1. Torso Configuration

Figure 4:
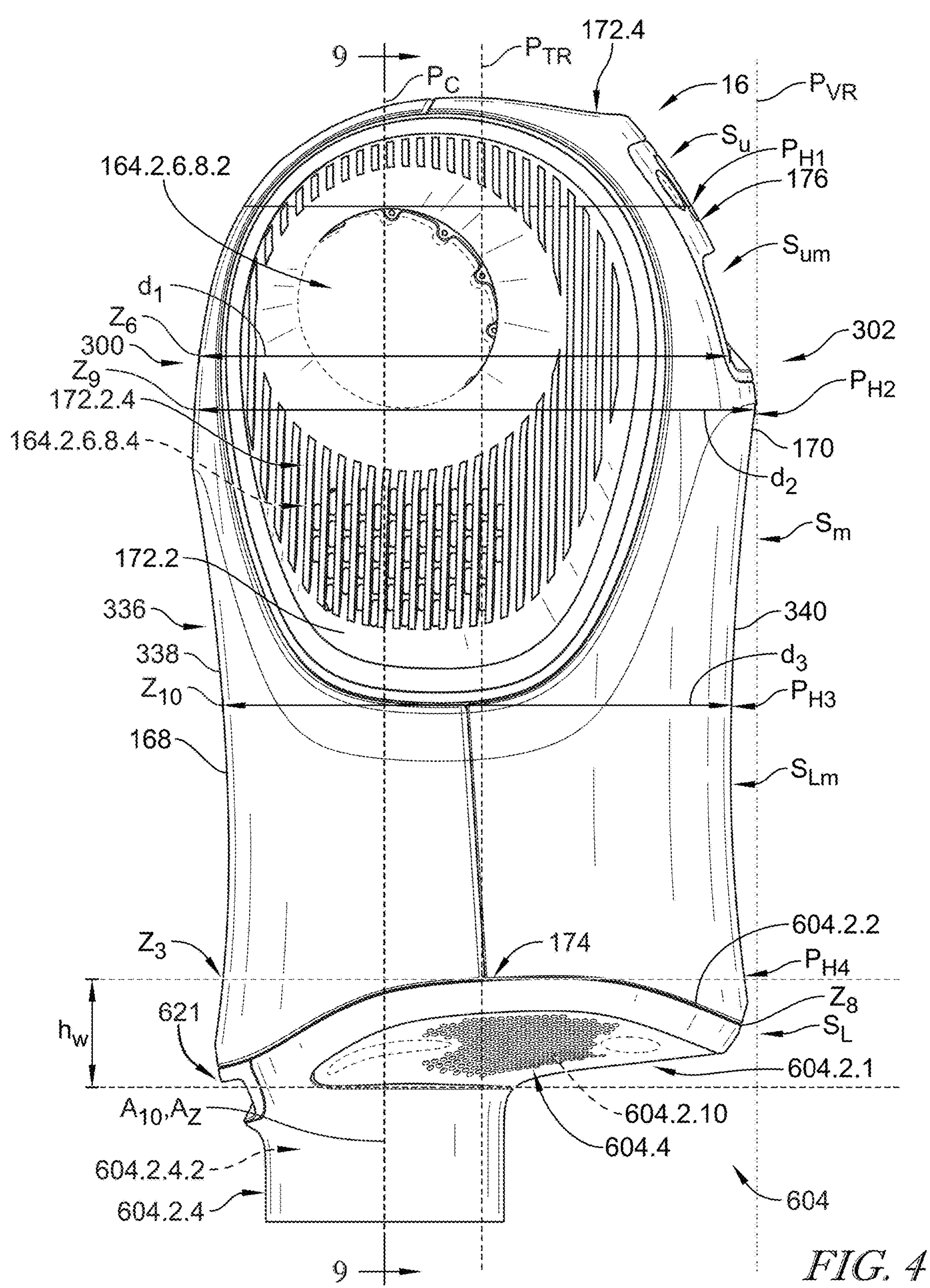
FIG. 4 is a left side view of the torso and spine of the robot of FIG. 1.
Figure 5:
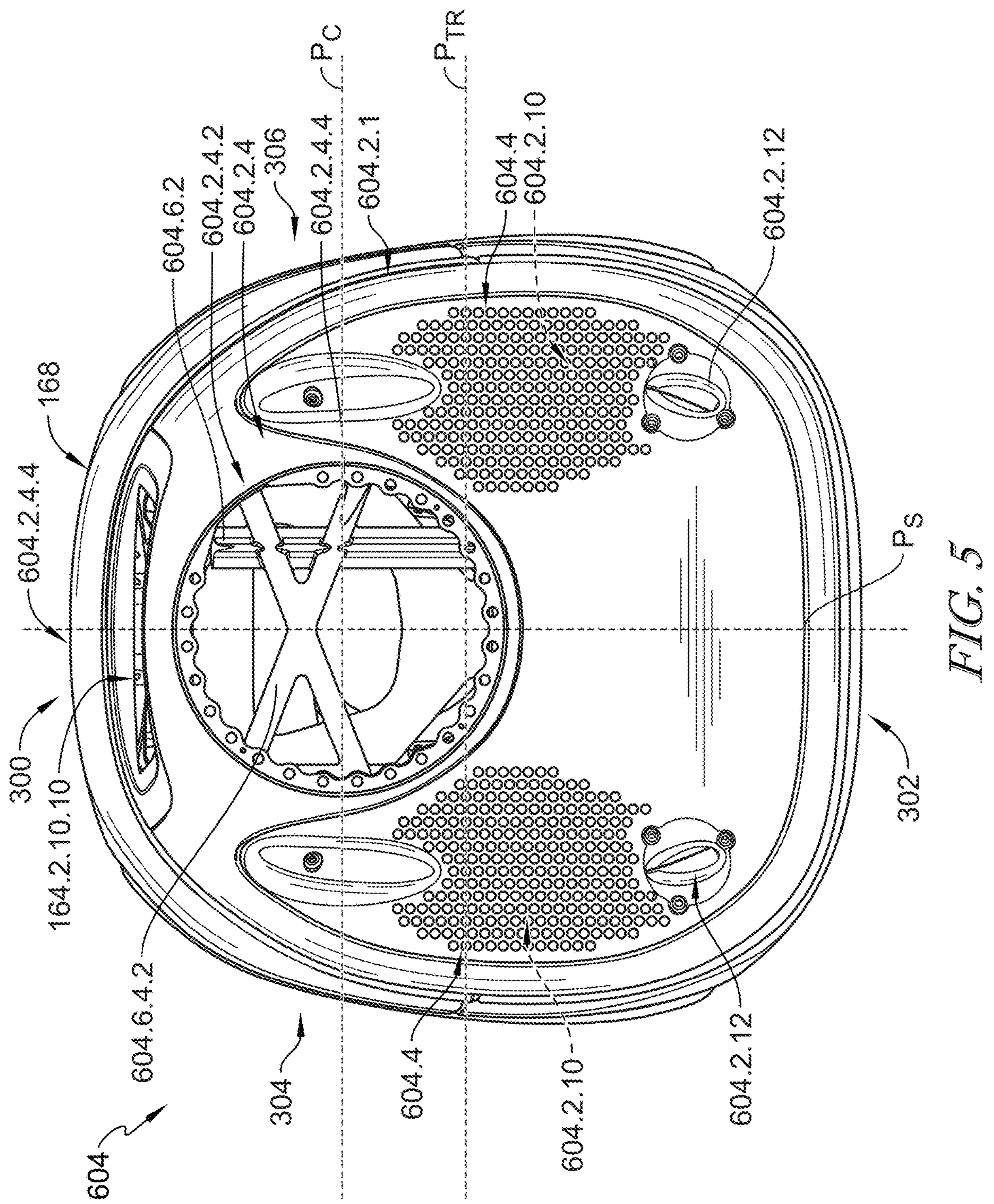
FIG. 5 is a bottom view of the torso and spine of the robot of FIG. 1.
Figure 6:
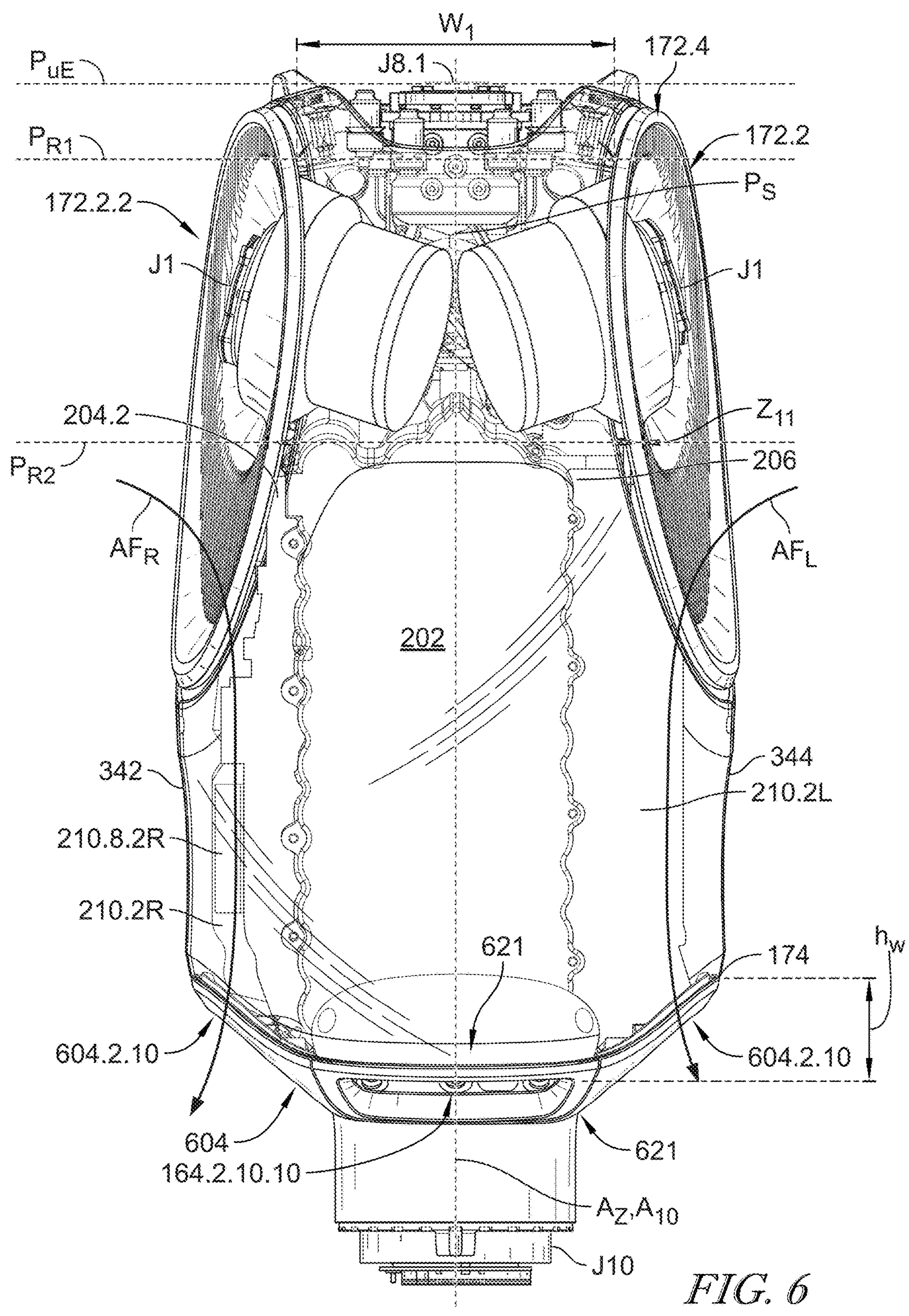
FIG. 6 is a front view of the torso and spine of the robot of FIG. 1, wherein an extent of the torso housing has been made transparent to reveal the internal components of the torso and to show an air flow pathway into the ventilation opening formed in the shoulder shroud, through and across an internal extent of the torso, and out the ventilation opening formed in the waist.
Figure 7:
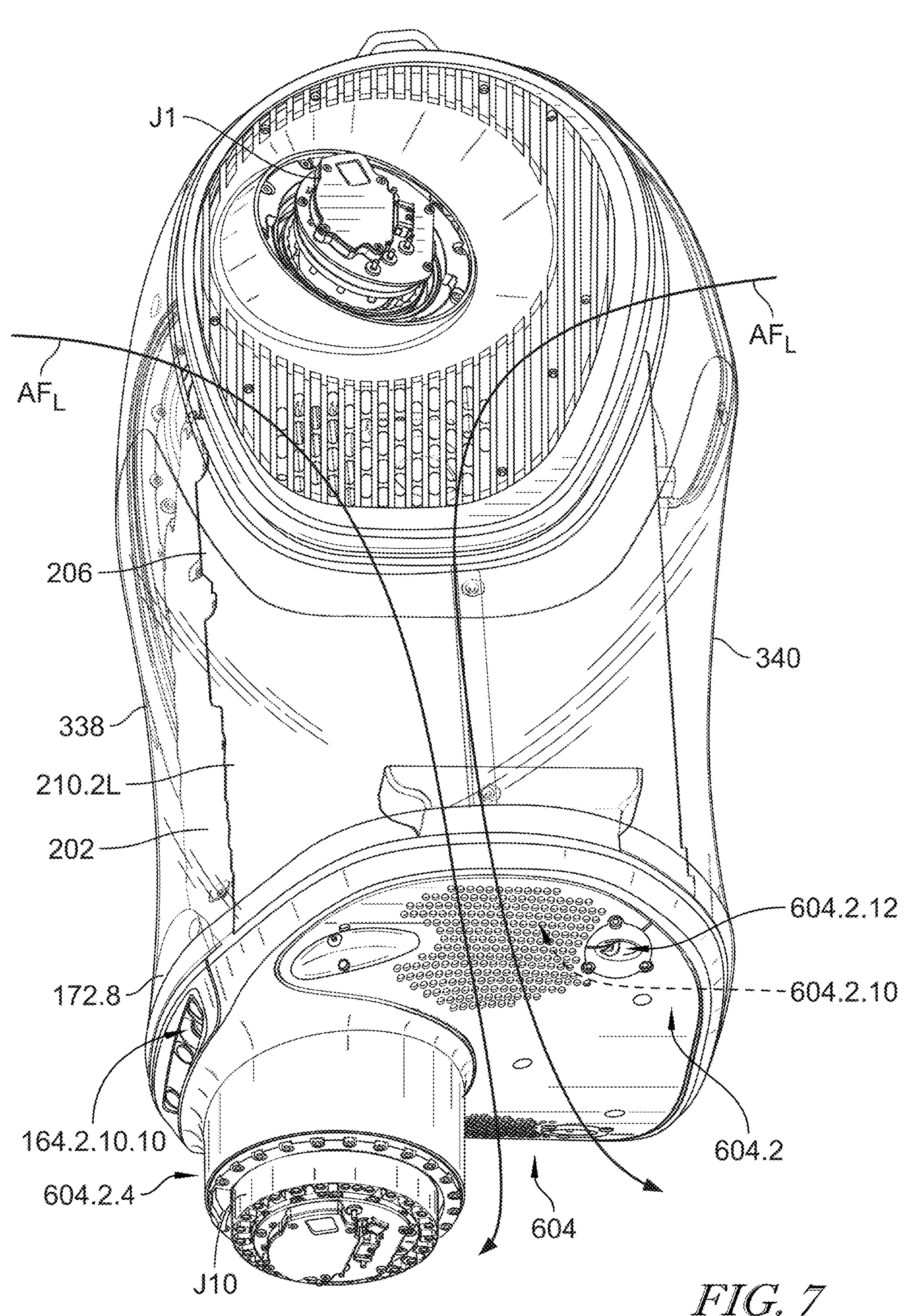
FIG. 7 is a perspective left side view of the torso and spine of the robot of FIG. 1, showing the air flow pathway into the ventilation opening formed in the shoulder shroud, through and across an internal extent of the torso, and out the ventilation opening formed in the waist.
Figure 8:
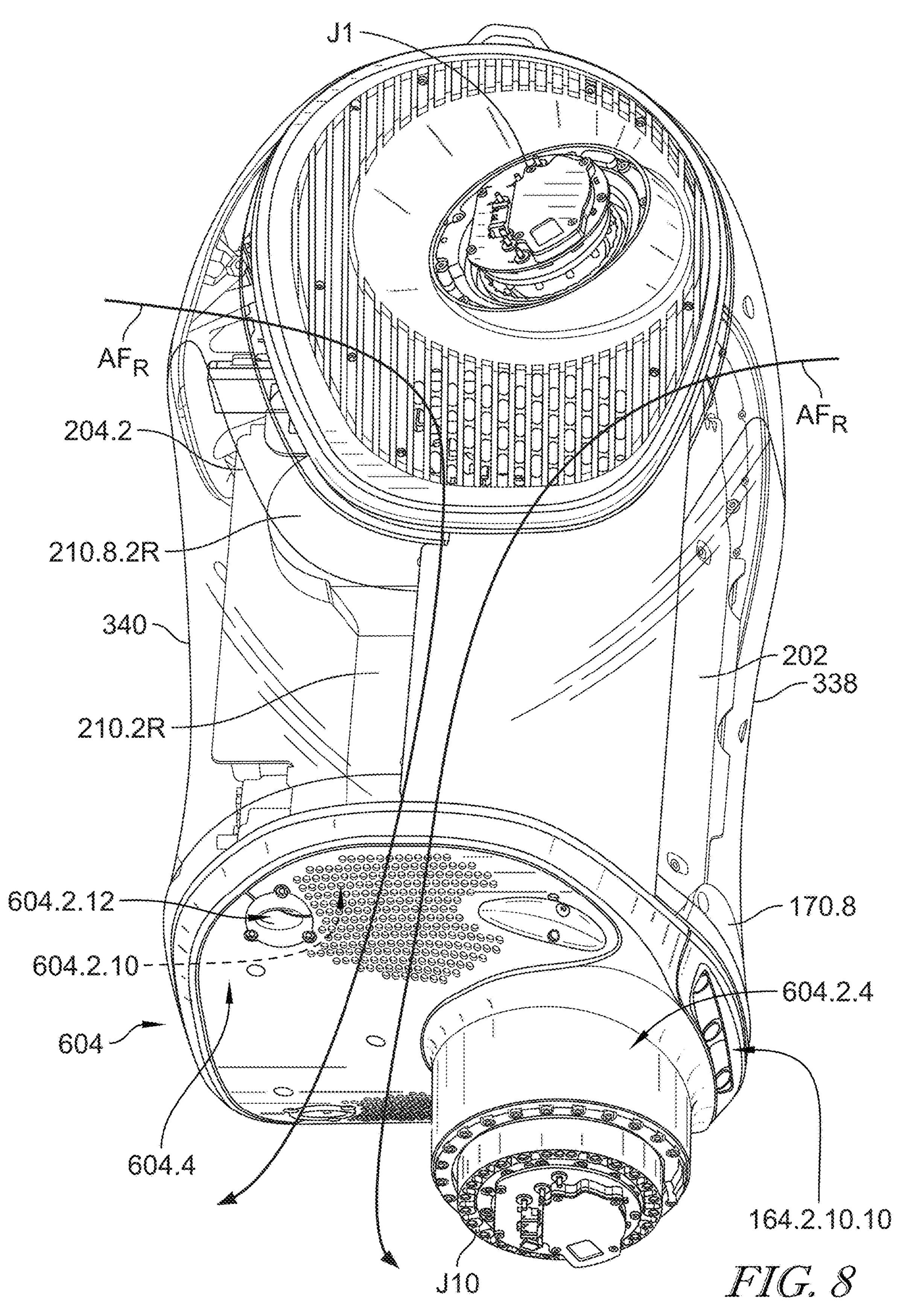
FIG. 8 is a perspective right side view of the torso and spine of the robot of FIG. 1, showing the air flow pathway into the ventilation opening formed in the shoulder shroud, through and across an internal extent of the torso, and out the ventilation opening formed in the waist.

As best shown in FIG. 5, the sagittal plane $P_S$ bisects the torso 16 of the robot 1 defining right extent 304 and left extent 306 of the torso 16. A torso reference plane ($P_{TR}$) is defined as a vertical plane that is perpendicular to the sagittal plane $P_S$ at the geometric center ($C_{TG}$) of the torso 16, defining a frontal extent 300 and a rear extent 302 of the torso 16. The torso reference plane ($P_{TR}$) is parallel to and offset rearward from a coronal plane $P_C$ (FIG. 4).

Based on the significant difference between the curvilinear lengths of the frontal and rear extents 300, 302, it should be understood that the surface area of the frontal extent 300 may be significantly smaller than the surface area of the rear extent 302. For example, the rear surface area of the torso 16 may be between 1% to 35% (preferably between 10% and 25%) larger than the frontal surface area of the torso 16. For example, the surface area of the front extent 300 may be about 0.10-0.12 $m^2$, and the surface area of the rear extent 302 may be about 0.12-0.14 $m^2$. The significant reduction of the curvilinear frontal length and surface area, in comparison to the curvilinear rear length and surface area, allows the arm assemblies 5 to reach further across the front of the torso 16 of the robot 1. This enhanced cross-torso reach provides a substantial advantage over conventional robots that lack this design, configuration, and ability.

Referring to FIGS. 3-9, the depth of the torso 16 does not substantially change between the bottom extent of the arm tubes 164.2.2. The lowest extent of the torso 16, varying by less than 10%, and preferably close to 5%. For example, the shallowest point may have a depth of approximately 230 mm, and the deepest point may have a depth of approximately 250 mm. Keeping the front-to-back depths substantially constant over the height of the torso 16 not only increases the torso's volume but also prevents: (i) bulges in the front of the torso that can limit the robot's cross-torso reach, and (ii) bulges in the rear of the torso that can alter the robot's center of mass. This again is a substantial benefit over conventional robots that have a torso with a small volume or include bulges.

The surface area relationship between the frontal extent 300 and the rear extent 302 allows for increased mobility and functioning of the robot's arm assemblies 5 by positioning less material in front of them as compared to behind them. This surface area relationship also allows for an increase in space within an interior volume ($V_{TI}$) of the torso 16 in areas that do not interfere with the normal movements of the robot's arm assemblies 5 in front of the coronal plane $P_C$.

Figure 9:
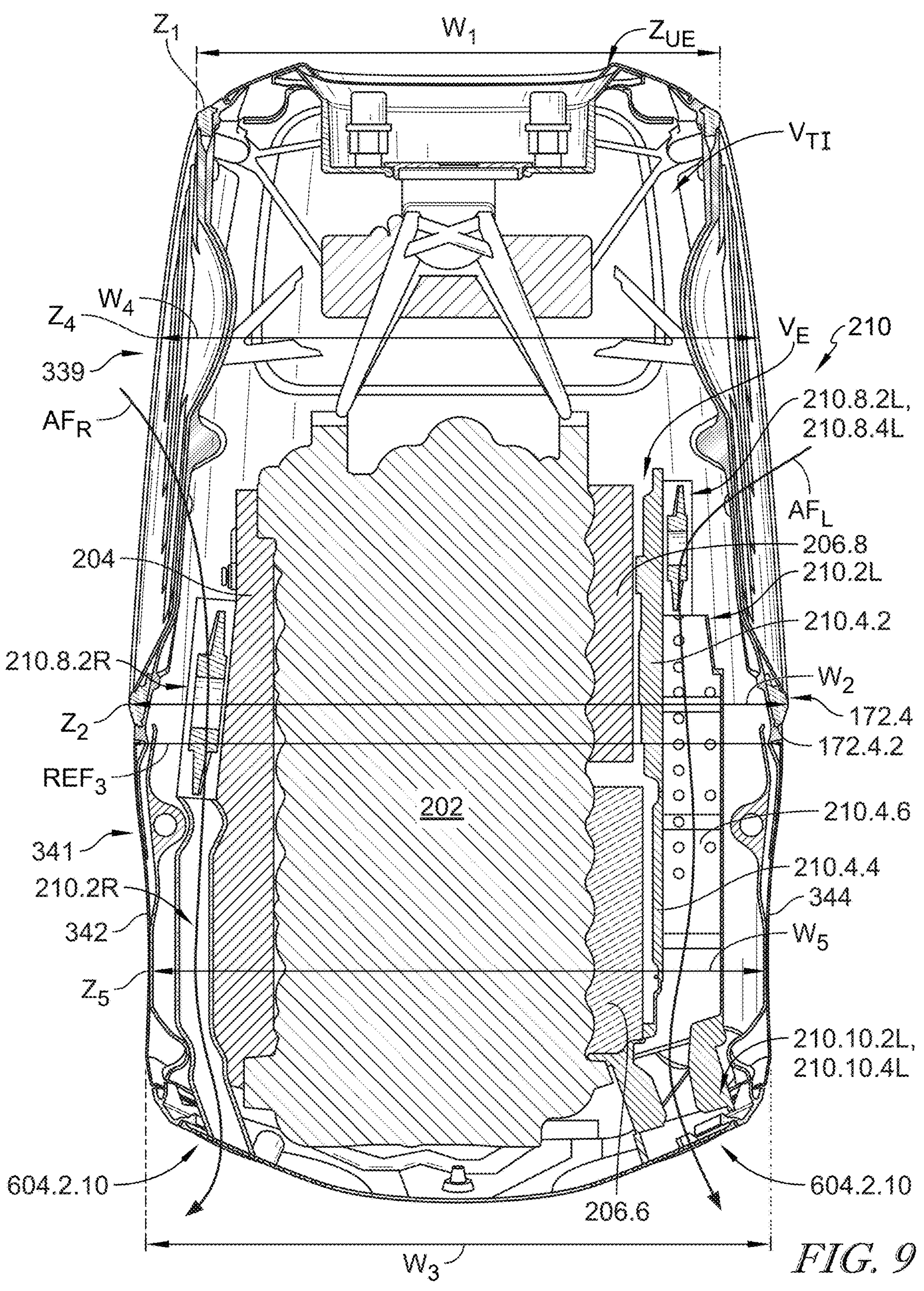
FIG. 9 is a cross-sectional view of the torso and spine taken along line 9-9 of FIG. 4, showing the air flow pathway on either side of the torso around the electronics assembly and other internal components of the torso.
Figure 10:
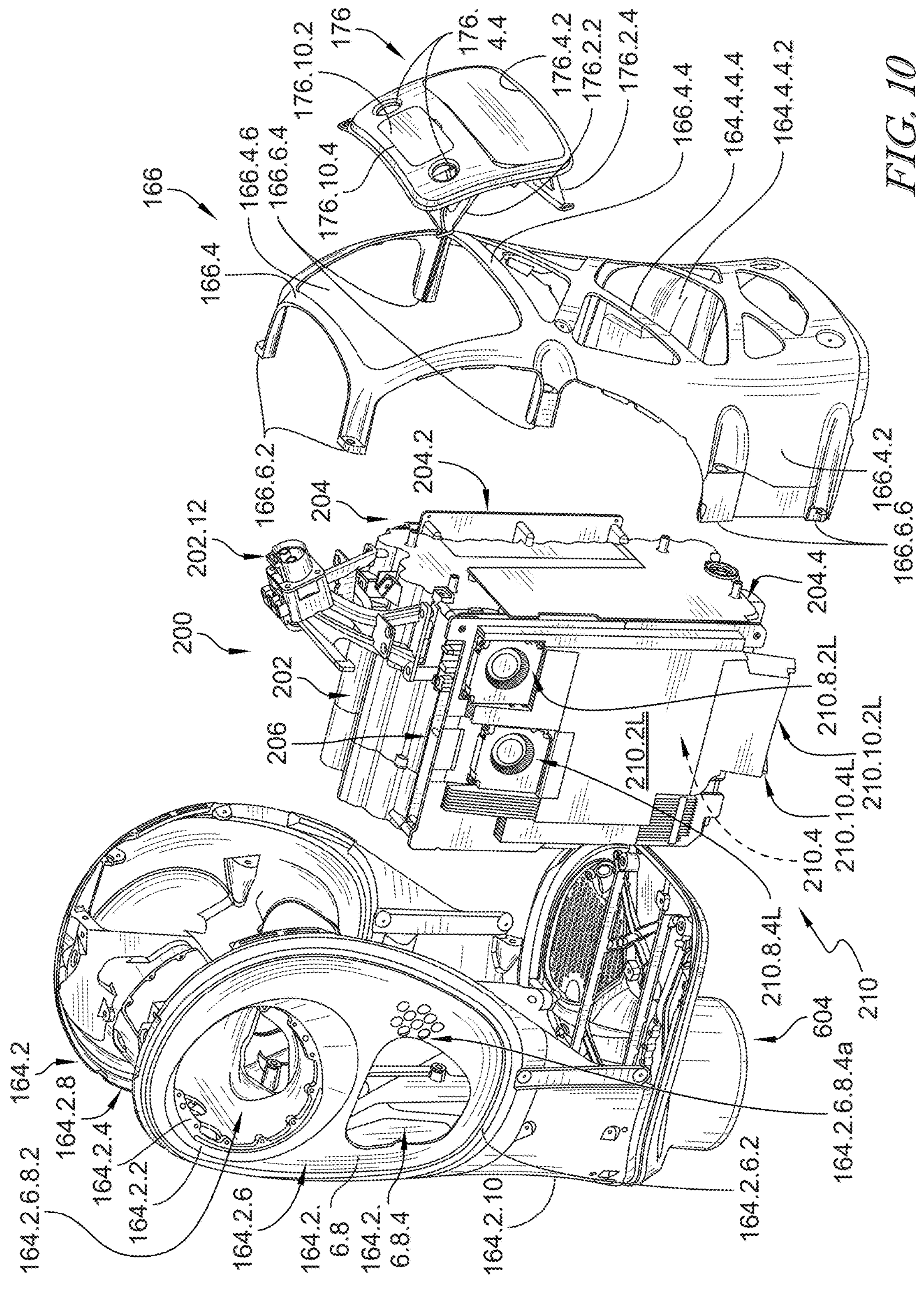
FIG. 10 is a partially exploded view of the torso and spine of FIG. 3, showing the electronic assembly and the cooling system housed within the housing of the torso, wherein the housing includes (i) a front skeleton coupled to the waist and arranged on a forward side of the electronic assembly, (ii) a rear skeleton arranged on a rearward side of the electronic assembly, and (iii) a rear interface panel.

Referring to FIG. 9, a cross-sectional view is show at the torso reference plane $P_{TR}$ of the robot 1 that divides the torso 16 in half at a center of the narrowest region of the torso 16 in all directions (e.g. geometric center). The torso 16 has a first width $w_1$ along the torso plane $P_{TR}$ at a first location $z_1$ above the shoulders 26. The torso 16 has a second width $w_2$, greater than the first width $w_1$, along the torso reference plane $P_{TR}$ at a second location $z_2$ below the shoulders 26. The torso 16 has a third width $w_3$, less than the second width $w_2$ and greater than the first width $w_1$, at a third location $z_3$ above an upper end 174 of the waist 604. The torso 16 has a fourth width $w_4$, greater than the first width $w_1$ and less than the second width $w_2$, at a fourth location $z_4$ aligned with the shoulders 26, below the first location $z_1$, and above the second location $z_2$. The torso 16 has a fifth width $w_5$, less than the second and third widths $w_2$, $w_3$ and greater than the first and fourth widths $w_1$, $w_4$, at a fifth location $z_5$ about midway between the second and third locations $z_2$, $z_3$. These varying widths provide the interior volume $V_{TI}$ with greater volume below the shoulders 26*a*, 26*b* to store more batteries, computing components, sensors, etc.

The torso 16 has a first depth $d_1$ along the sagittal plane $P_S$ at a sixth location $z_6$ above the shoulders 26*a*, 26*b* as shown in FIG. 4. The torso 16 has a second depth $d_2$, greater than the first depth $d_1$, along the sagittal plane $P_S$ at a seventh location $z_7$ below the shoulders 26*a*, 26*b* near an upper end of the battery pack 202. The torso 16 has a third depth $d_3$, less than the second depth $d_2$ and greater than the first depth $d_1$, at an eighth location $z_8$ at the upper end 174 of the waist 604. The torso 16 has a fourth depth $d_4$, greater than the first depth $d_1$ and less than the second depth $d_2$, at a ninth location $z_9$ aligned with the arm actuators 190, below the sixth location $z_6$, and above the seventh location $z_7$. The torso 16 has a fifth depth $d_5$, less than the second and third depths $d_2$, $d_3$ and greater than the first and fourth depths $d_1$, $d_4$, at a tenth location $z_{10}$ about midway between the seventh and eighth locations $z_7$, $z_8$. These varying depths provide the interior volume $V_{TI}$ with a greater volume below the shoulders 26 to store more batteries, computing components, sensors, etc.

The interior volume $V_{TI}$ is substantially filled by an electronics sub-volume $V_E$ located below the shoulders 26 and above the waist 604. The electronics sub-volume $V_E$ contains (i) the battery pack 202, (ii) power distribution and control assemblies 204, and (iii) the computer 206, and has a substantially prism or cylindrical shape. The torso 16 has a width-to-depth ratio below the shoulders 26 and above the waist 604 within a range of about 0.7 to about 1.1 to fit the shape and volume of the electronics sub-volume $V_E$ with a small clearance. In some embodiments, the width-to-depth ratio is within a range of about 0.75 to about 1.1, about 0.8 to about 1.1, or about 0.85 to about 1.1.

The width-to-depth ratio may vary along a height of the torso 16 but does not vary substantially, to maximize space within the electronics sub-volume $V_E$. That is, the width-to-depth ratio of the torso 16 does not change by more than 25% between an eleventh location $z_{11}$ at a lower end of actuator openings and the third location $z_3$ at the upper end 174 of the waist 604. In some embodiments, the width-to-depth ratio does not change by more than 20%, 15%, or 10% between the eleventh location $z_{11}$ and the third location $z_3$. The torso 16 has a width-to-depth ratio of about 0.7 to about 0.9, preferably 0.75 to 0.85, at the eleventh location $z_{11}$ and the third location $z_3$. The torso has a width-to-depth ratio of about 0.95 to about 1.15, preferably 1.0 to 1.1, at the second location $z_2$, which is about midway between the eleventh location $z_{11}$ and the third location $z_3$.

The width and depth dimensions described above provide the torso 16 with an hour-glass shape when viewed in cross-section along the sagittal plane $P_S$ and a blunted diamond or pentagon shape when viewed in cross-section along the coronal plane $P_C$. The second width $w_2$ is the greatest width of the torso 16 at a second location $z_2$, while an upper end 335 of the torso 16 defining a neck opening 164.4.2.2 has the smallest width of the torso 16. An upper portion 339 of the torso 16 is defined between the upper end 335 and the second location $z_2$. The upper portion 339 has a curvilinear or blunted trapezoidal prism shape. Areas of the torso 16 are blunted and curved, in that there are no sharp points like the pointed edge of a diamond or a pointed corner of a trapezoid.

The torso 16 has an exterior surface 336 with various portions or regions that define these shapes. When the torso 16 is viewed in cross-section along the sagittal plane $P_S$, the exterior surface 336 includes a front portion 338 and a rear portion 340 extending from the eleventh location $z_{11}$ to the third location $z_3$ that are concavely curved. When the torso 16 is viewed in cross-section along the coronal plane $P_C$, the exterior surface 336 includes left and right portions 342, 344 between locations corresponding to the second and third widths $w_2$, $w_3$ that are concavely curved. These curved portions 338, 340, 342, 344 provide the torso 16 with a more aesthetic appearance while maintaining sufficient volume within the interior $V_{TI}$ to house the electronics.

A lower portion 341 of the torso 16 is coupled to a lower end of the upper portion 339 and is defined between the second location $z_2$ (corresponding to the second width $w_2$) and the third location $z_3$. Unlike conventional robots, the lower portion or extent 341 (e.g., within the bottom ⅓ of the height of the torso) of the torso 16 does not change substantially in volume, width, and depth from the upper portion or extent 339 of the torso (e.g., positioned within the top ⅓ of the height of the torso). As such, the lowest point of the torso 16 is recessed less than 10 mm from the widest point of the torso 16, whereas the uppermost point of the torso 16 is recessed more than 35 mm from the widest point. This configuration prevents the torso 16 from having a V-shaped appearance where the smallest extent of the V-shape is positioned adjacent to the waist. This configuration is beneficial because it makes the robot more stable and increases the volume contained within the torso 16. Additionally, unlike conventional robots, the variation between the widest point and the narrowest point of the torso's profile is less than 10% of the torso's height, and preferably close to 5% of the torso's height. For example, the narrowest point may be recessed approximately 36 mm from the widest point, and the overall height of the torso is approximately 420 mm. This configuration similarly allows the robot to be more stable and have a substantial volume for containing additional computing power and batteries.

The lower portion 341 of the torso 16 has a super-elliptical shape when viewed in cross-section along a horizontal plane $P_H$, which is perpendicular to the sagittal plane $P_S$, the coronal plane $P_C$ and the torso reference plane $P_{TR}$. The lower portion 341 of the torso 16 has a front width $w_F$ located forward of the coronal plane $P_C$ and a rear width $w_R$ located rearward of the coronal plane $P_C$. The rear width $w_R$ is greater than the front width $w_F$.

The waist 604 tapers inwardly toward the spine axis $A_Z$ from the upper end 174 of the waist 604 to the torso twist actuator (J10) 620 at a low-sloped rate (i.e., low rise, high run). In other words, the torso 16 decreases in width and depth substantially over a relatively short height $h_W$ between the upper end 174 of the waist 604 and an upper end 621 of the torso twist actuator (J10) 620. The torso 16 has a change in width of at least 50%, 55%, 60%, 65%, or 70% along height $h_W$. The torso 16 has a change in depth of at least 35%, 40%, 45%, or 50% along height $h_W$.

As shown in FIG. 4, the torso 16 and waist 604 have been divided into five sections: (i) an upper section $S_U$, (ii) an upper middle section $S_{UM}$, (iii) a middle section $S_M$, (iv) a lower middle section $S_{LM}$, and (v) a lower section $S_L$. The upper section $S_U$ extends from the upper end 335 of the torso to a first reference line $P_{H1}$ at an uppermost end of an actuator opening. The upper middle section 60 extends from the first reference line $P_{H1}$ to a second or upper reference line $P_{H2}$ at a lowermost end of the actuator openings that extends between a lower extent of the left and right arm actuators (J1) 190*a*, 190*b*. The middle section $S_M$ extends from the second reference line $P_{H2}$ to a third reference line $P_{H3}$ at a lowermost end of arm interface portions 164.2.6. The lower middle section 80 extends from the third reference line $P_{H3}$ to a fourth reference line $P_{H4}$ at the upper end 174 of the waist 604 along the coronal plane $P_C$. The lower section 90 extends from the fourth reference line $P_{H4}$ to a lower end 337 of the waist 604.

To compensate for the lack of a V-shaped torso and to further increase the robot's ability to reach across its body, the upper portion 339 of the torso 16 has been designed to have a curvilinear trapezoidal prism configuration. This prism is defined by having the curvilinear front extent 300, substantially linear non-parallel side extents 342, 344, and the curvilinear rear extent 302 that has a curvilinear length along each reference line $P_{H1}$, $P_{H2}$, $P_{H3}$, $P_H$ that is greater than the curvilinear length of the front extent 300. The substantially linear non-parallel side extents 342, 344 intersect with the front extent 300 at an interior angle that is between 85 and 110 degrees, while the substantially linear non-parallel side extents intersect with the rear extent at an interior angle that is between 55 and 85 degrees. Additionally, the curvilinear length of the front extent 300 is between 27% and 37% smaller than the curvilinear length of the rear extent 302. For example, the curvilinear length of the front extent 300 may be between 180 and 220 mm, and the curvilinear length of the rear extent 302 may be between 260 and 300 mm. Further, the substantially linear side lengths may be between 10% and 20% smaller than the curvilinear length of the front extent 300. In other words, the curvilinear length of the rear extent 302 may be between 27% and 37% larger than the curvilinear length of the front extent 300, and the curvilinear length of the front extent 300 may be between 10% and 20% larger than the substantially linear side lengths. Alternatively, the smallest trapezoidal shape that does not include a portion positioned substantially within the torso 16 includes: (i) a front wall length that is over 30% smaller than a rear wall length, and (ii) side wall lengths that are substantially equal to the rear wall length. Other dimensions of the torso 16 are described in the figures and in the tables below.

The upper portion 339 extends generally from the upper end 335 of the torso 16 to the third reference line $P_{H3}$. The lower portion 341 extends generally from the third reference line 374 to the fourth reference line $P_{H4}$. The third reference line $P_{H3}$ is near the widest extent of the torso 16 at the second location $z_2$. The upper portion 339 of the torso 16 generally increases in width from the upper end 335 through the upper section $S_U$, the upper middle section $S_{UM}$, and the middle section $S_M$. The arm interface portions are structured and oriented such that a front extent of the arm interface portions are closer to one another in comparison to a rear extent of the arm interface portions along the second reference line 372.

The lower portion 341 of the torso 16 decreases in width from the third reference line $P_{H3}$ to the fifth location $z_5$ to provide the blunted trapezoidal shape. The lower portion 341 of the torso 16 also increases and decreases in width from the fifth location $z_5$ to the fourth reference line 376 to provide an indented, hourglass-shaped region between the fifth location $z_5$ and the fourth reference line $P_{H4}$.

The components of the electronics assembly 200, the arm actuators (J1) 190, and the torso twist actuators (J10) 620 are arranged within the internal volume of the torso 16. In the illustrative embodiment, the total volume of the torso may be about 17.4-21.3 L. The front volume accounts for over 65% of the total volume of the torso. For example, the front volume may be about 11.7-14.3 L. The rear volume accounts for less than 35% of the total volume of the torso. For example, the rear volume may be about 5.7-7.0 L. The actuators take up over 10% of the total volume of the torso, but less than 15% of the total volume of the torso. For example, the volume occupied by the actuators may be about 0.7-1.95 L. The two arm actuators (J1) 190*a*, 190*b* take up over 5% of the total volume of the torso, but less than 10% of the total volume of the torso. The other components (wires, venting, heat exchange, sensors, etc.) housed in the internal volume take up over 20% of the total volume of the torso, but less than 60% of the total volume of the torso, preferably, they take up over 35% of the total volume of the torso, but less than 50% of the total volume of the torso.

2. Torso Housing Assembly

To protect and house the arm actuators (J1) 190 and the electronics assembly 200, the torso 16 includes a torso housing assembly 162 that is comprised of: (i) a front skeleton 164, (ii) a rear skeleton 166, (iii) a shell assembly 172, and (iv) a rear interface panel 176. It is desirable to utilize a front skeleton 164 and a rear skeleton 166 to: (i) transfer loads from one side of the torso 16 to the other, (ii) allow an extent of the skeleton to be removed for assembly and servicing of the electronics assembly 200, and (iii) reduce manufacturing complexities. In other embodiments, the front and rear skeletons 164, 166 may be combined into a single unitary unit. In this embodiment, the electronics assembly 200 may be inserted from the bottom before the waist 604 is coupled to said unitary skeleton. This embodiment would allow for a reduction in the materials utilized in the torso 16, as said unitary skeleton may be made from a single integrated piece and could more effectively transfer loads between aspects of said unitary skeleton.

However, the limited space within the opening formed in the waist 604 will complicate the assembly of the robot 1 and will likely significantly increase manufacturing complexities associated with fabricating the unitary skeleton. Nevertheless, this application contemplates utilizing a single, unitary skeleton, a skeleton that is comprised of multiple components (e.g., front and rear), or a skeleton that is comprised of multiple parts (e.g., front, rear, left side, and right side). In further embodiments, the rear skeleton 166 may be omitted in its entirety because the front skeleton 164 may be sufficient to effectively transfer the loads that are experienced by the robot 1. It should also be understood that additional embodiments or alterations to the housing will be discussed below, and these embodiments may be partially or fully combined with any of the above-described embodiments.

a. Front Skeleton

As best shown in FIGS. 2-10, the front skeleton 164 is designed to carry the majority of the structural loads. The front skeleton 164 includes a casing 164.2 and a gorget 164.4 that sits on top of and attaches to the casing 164.2, transferring loads from the neck and head 10. The front skeleton 164 couples to the waist 604 to form at least a portion of a compartment for the electronics assembly 200, the actuators (J10) 190*a*, 190*b*, the cooling system 210, and other components housed within the internal volume. The front skeleton 164 is designed to transfer at least a portion of the loads to the waist 604. The rear skeleton 166 and rear interface panel 176 couple individually to the front skeleton 164 to complete the load-bearing and/or load-transferring portions of the housing.

As best shown in FIGS. 2-10, the casing 164.2 is shaped with multiple structural features, wall thicknesses, anchoring features, load transfer features, and openings. The casing 164.2 includes: an arm tube 164.2.2, arm actuator mounts 164.2.4, arm interface portions 164.2.6, a gorget interface portion 164.2.8, and a main body wall 164.2.10. The arm tube 164.2.2 is designed to house the arm actuator assemblies (J1) 190*a*, 190*b*, and the arm actuator mounts 164.2.4 are designed to secure said arm actuator assemblies 190 within said arm tube 164.2.2. The gorget interface portion 164.2.8 has an inner edge that corresponds with an outer edge of the gorget 164.4. The main body wall 164.2.10 is located below the gorget interface portion 164.2.8 and overlies a front end of the battery pack 202, the power distribution and control assemblies 204, and the computer 206. It is formed without any large apertures to provide a protective barrier for these components.

The arm tube 164.2.2 is designed to: (i) support the arm actuator assemblies (J1) 190*a*, 190*b* and transfer torque from the shoulders 26*a*, 26*b* and arm assemblies 5*a*, 5*b* to the torso 16, and (ii) serve as the main structural load path for torsional transfer between the left and right arm actuators (J1) 190*a*, 190*b*. To help ensure this torque is properly transferred through a significant extent of the torso 16 and is not localized in an outer extent, the arm tube 164.2.2 extends across the entirety of the torso 16 and is formed as an integral part of the front skeleton 164. Additionally, by extending the arm tube 164.2.2 across the entire torso 16, the need for additional supporting structures that extend from it is minimized. This is again beneficial because it limits structures that would otherwise reduce the usable space within the torso 16. In other embodiments, the arm tube may not extend entirely across the torso 16; instead, it may have a space formed therein, thereby creating two separate (left and right) arm tubes.

In an alternative embodiment, the arm tube 164.2.2 may be omitted from the front skeleton 164. In such an embodiment, the arm actuator mounts 164.2.4 can be formed directly with the arm interface portions 164.2.6. The arm interface portions 164.2.6 can be structured with thickened regions or trussed to reinforce the arm assemblies 5 relative to the torso 16.

As shown in FIGS. 2-10, the left and right arm interface portions 164.2.6 include an arm portion wall 164.2.6.8 with a curvilinear perimeter defined in part by a rim 164.2.6.2. The arm portion wall 164.2.6.8 is formed to include an actuator recess 164.2.6.8.2, shaped to allow a full range of motion for the arm, and vent openings 164.2.6.8.4 to the main compartment within the housing. The vent opening 164.2.6.8.4: (i) is positioned adjacent to an upper reference line that extends between a lower extent of the left and right arm actuators 190*a*, 190*b*, (ii) has at least an extent located below this upper reference line, and (iii) includes a portion that is positioned near an extent of the left and right arm actuators.

Figure 2:
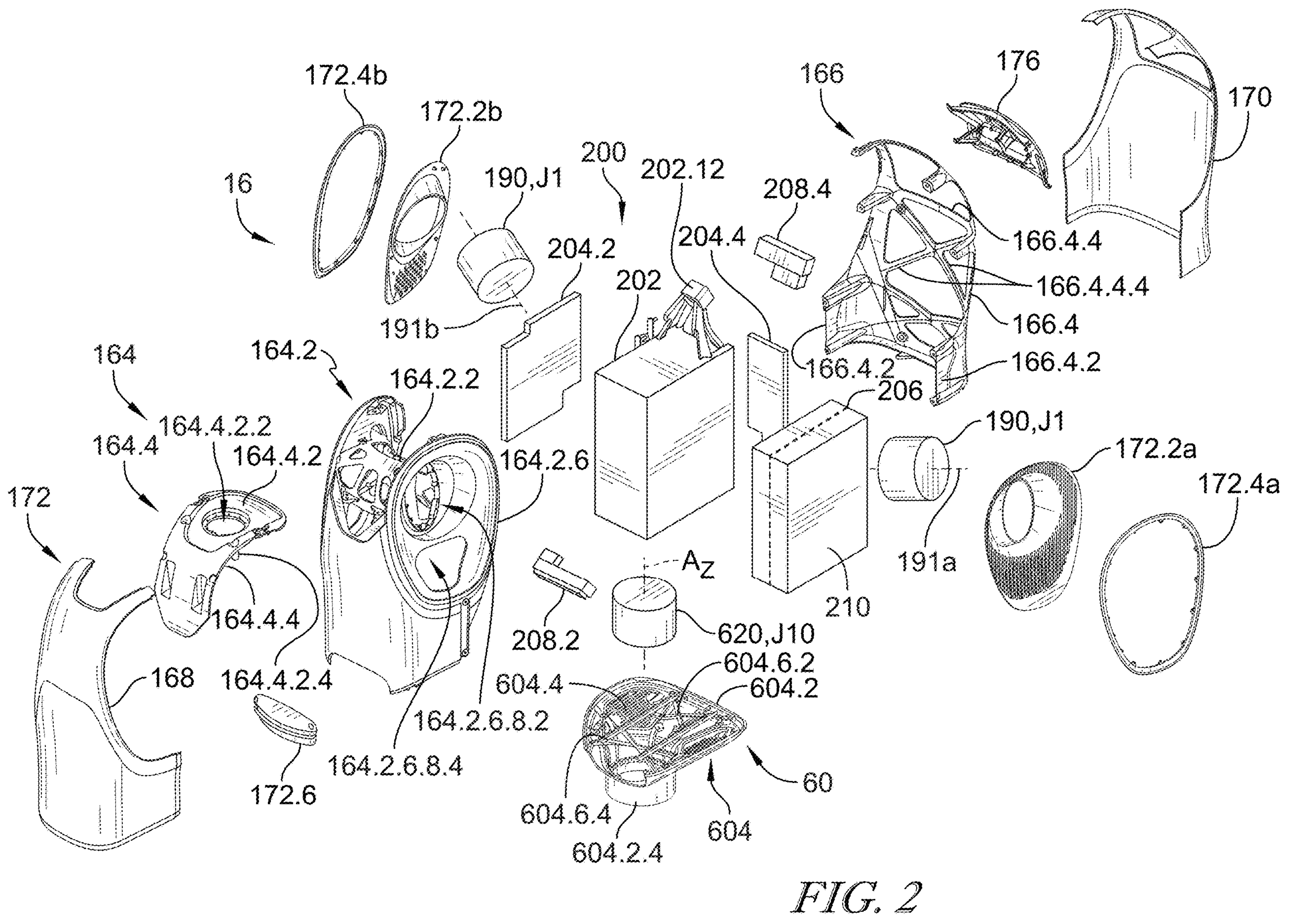
FIG. 2 is an exploded view of the torso and spine of the robot of FIG. 1, where the torso includes a torso housing, arm actuators, an electronics assembly, and a cooling system, and the spine includes a waist and a torso twist actuator.
Figure 3:
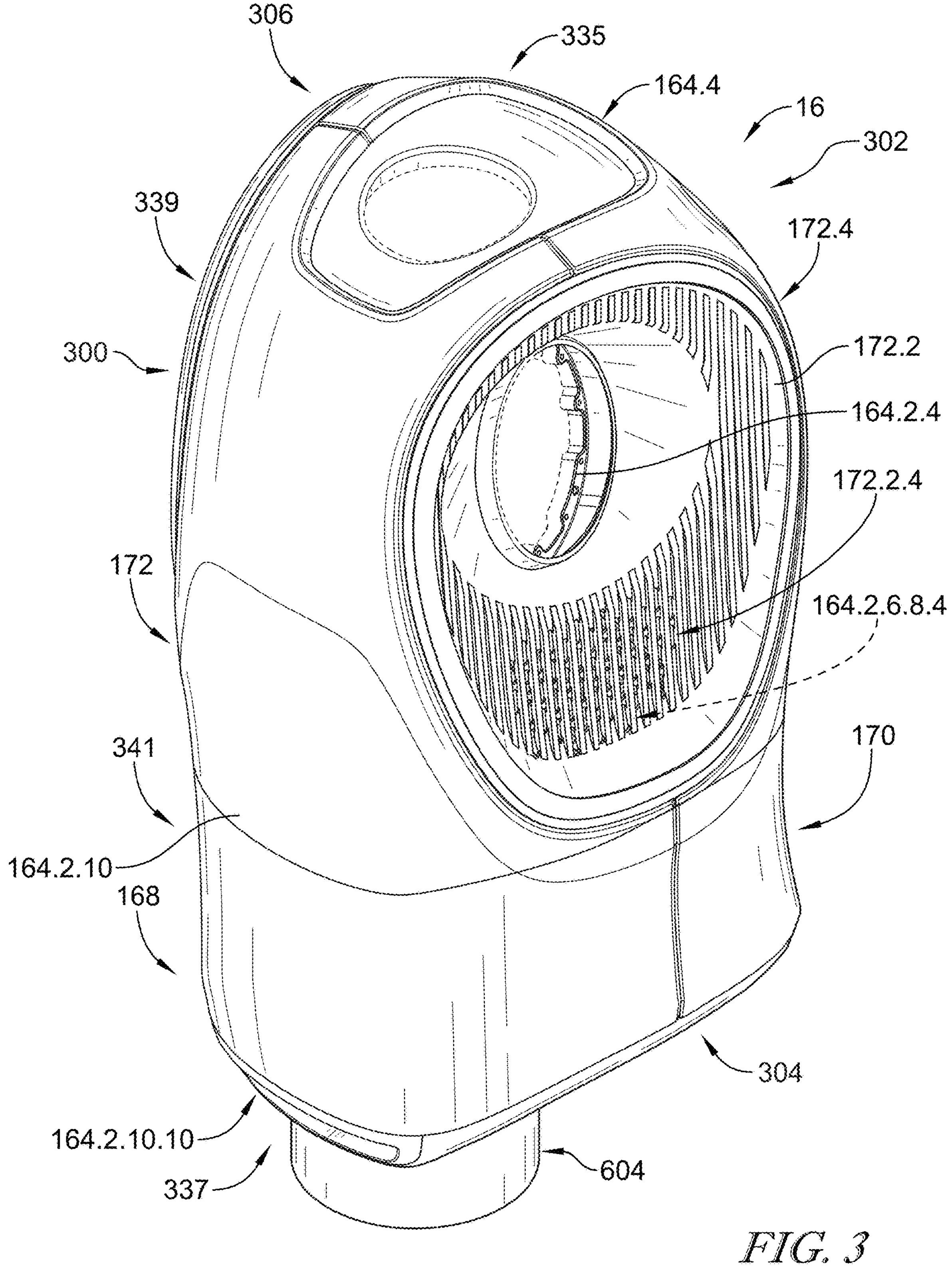
FIG. 3 is a perspective view of the torso and spine of the robot of FIG. 1.

The gorget 164.4 includes a neck area 164.4.2 recessed from a shell mounting surface 164.4.4, as shown in FIGS. 2 and 3. The neck area 164.4.2 includes a neck opening 164.4.2.2 and an actuator mount 164.4.2.4 to interface with the head twist actuator assembly (J8.1) 120 of the head and neck assembly 10.

b. Rear Interface Panel

As best shown in FIGS. 2-10, the rear interface panel 176 is designed to couple with the casing 164.2 and extend to be substantially flush with the surface of a rear shell 170 on the rear skeleton 166. The rear interface panel 176 is configured to cover a rear sensor assembly 208.4, which may also couple to a rear interior surface 176.2 of the rear interface panel 176. The rear interface panel 176 includes mounting extensions 176.2.2, 176.2.4 that extend from the rear interior surface 176.2 and interface with the casing 164.2. The mounting extensions 176.2.2 form a trussed bridge traversing the interface panel 176 and configured to distribute forces therethrough and to the casing 164.2 if the robot falls on its back during operation.

The rear interface panel 176 may also include sensor apertures 176.4.2 and 176.4.4 configured for the rear sensor assembly 208.4. The sensor aperture 176.4.2 may include a lower rear sensor aperture 176.4.2 through the rear interface panel 176, with the external surface formed such that its contours do not interfere with the line of sight of the sensors in the sensor assembly 208.4. The rear interface panel 176 may also include a charging port aperture 176.10.4 therethrough, with an access door 176.10.2 that may be opened to insert a removable charging port adapter into a charging port 202.2 for the battery pack 202. The rear interface panel 176 further includes apertures 176.4.4 configured to receive buttons, such as a power button for the robot 1.

c. Rear Skeleton

As best shown in FIGS. 2-10, the rear skeleton 166 is shaped to complete the form of the torso 16. The rear skeleton 166 is configured as a lighter-weight cover with structural features for stiffness, shear transfer, and to hold the rear shell 170. The front skeleton 164 is designed to carry the majority of the structural loads.

The rear skeleton 166 includes a main body wall 166.4, side portions 166.4.2, and a back portion 166.4.4. The side portions 166.4.2 of the main body wall 166.4 abut the side portions of the front skeleton 164. The back portion 166.4.4 of the main body wall includes an open area 166.4.4.2 with back braces 166.4.4.4 spanning it to carry torsional loads from the casing 164.2 from one side around to the other. The rear skeleton 166 also includes an electronics opening 166.4.6 configured to receive the rear interface panel 176, which is attached to the casing 164.2. The electronics opening 166.4.6 in the rear skeleton 166 and rear shell 170 allows them to be removed to access the battery pack 202 or other components within the torso 16, without disrupting the sensor assembly 208.4. The rear skeleton 166 also includes a plurality of mounting extensions (e.g., upper mounting extensions 166.6.2, middle mounting extensions 166.6.4, lower mounting extensions 166.6.6) that couple to the casing 164.2 of the front skeleton 164.

3. Shell Assembly

The shell assembly 172 is configured to surround the front and rear skeletons 164, 166 and is designed to protect them from external objects and accidental contact between the torso and the arm assemblies 5. The shell assembly 172 includes: (i) a front shell 168, (ii) a rear shell 170, (iii) a shroud or side extent 172.2, and (iv) an energy attenuation assembly 172.4. As best shown in FIGS. 2-10, the front shell 168 covers a majority of the gorget 164.4, the main body wall 164.2.10 of the casing 164.2, and an extent of a lower sensor cover. To cover these structures, the front shell or forward portion of the cuirass 168 includes: (i) a main body, (ii) two upwardly extending projections from the main body configured to overlie an extent of the robot's clavicle and trapezius, and (iii) two rearwardly extending projections from the main body configured to overlie an extent of the robot's obliques and kidneys. Likewise, the rear shell 170 covers the rear skeleton 166, an extent of the front casing 164.2, and an extent of the gorget 164.4. To cover these structures, the rear shell or rear portion of the cuirass 170 includes: (i) a main body, (ii) two upwardly extending projections from the main body configured to overlie an extent of the robot's shoulder blade and trapezius, and (iii) two forwardly extending projections from the main body configured to overlie an extent of the robot's latissimus dorsi and kidneys. Unlike the front shell 168, the rear shell 170 includes a substantial opening formed therein to provide access to the rear interface panel 176.

The front and rear shells 168, 170 may be designed to be consumable and/or replaceable. As such, these shells may be made from any known material, including metal or plastic, and may include polymers. They may be 3D printed or injection molded, to identify a few examples. It should be understood that in other embodiments, the front and rear shells or cuirass 168, 170 may be integrally formed into the front and back skeletons 164, 166. This may be beneficial because it could reduce the number of parts needed for the robot 1. However, integrally forming these components will reduce the robot's ability to have scuffed or damaged shells 168, 170 replaced without replacing the entire skeleton or skeleton section 164, 166. In a further alternative, the shells 168, 170 may be further subdivided into additional components to further aid in their replaceability. For example, the shell may include more than five, and potentially more than ten, separate components. Some possible materials that can be used for the front and rear shells 168, 170 include textiles or any other material described in U.S. application Ser. No. 19/066,122, which is expressly incorporated herein for the purpose of describing suitable materials for the shells 168, 170.

The shroud 172.2 may be coupled with at least an extent of the front shell 168 within the arm interface portion 164.2.6 on each left and right side of the front skeleton 164. The shroud 172.2 is configured to surround the arm tube 164.2.4 and provide protection to the torso 16 along the extents of the front shell 168 and the rear shell 170 on each of the left and right sides. The shroud 172.2 includes: (i) an actuator opening 172.2.2 conforming to the shape of the actuator recess 164.2.6.8.2 of the arm portion wall 164.2.6.8 of the front skeleton 164 within the arm interface portion 164.2.6, and (ii) a perforated portion 172.2.4 configured to allow air flow into the robot 1 through the vent opening 164.2.6.8.4 of the torso 16. Except for the actuator opening 172.2.2 and its adjacent structures, the shroud 172.2 has a somewhat planar configuration that matches the substantially linear sidewall extents of the skeleton/torso. The extent of this somewhat planar configuration of the shroud 172.2 includes a plurality of ribs (e.g., projections and adjacent recesses) that are designed to provide the shroud 172.2 with additional structural integrity, which may be helpful in preventing damage to the skeleton. In other embodiments, these ribs may be removed or replaced with other energy-absorbing materials. In other embodiments, the linear sidewalls may be substantially curvilinear or may have any other known shape. Like the front and rear shells 168, 170, the shroud 172.2 may be designed to be consumable and/or replaceable. As such, the shroud 172.2 may be made from any known material, including metal or plastic, and may include polymers; it may be 3D printed, or injection molded, to identify a few examples. In alternative embodiments, the shroud 172.2 may be integrally formed with the skeleton or may be formed from a plurality of other components.

As best shown in FIG. 2, the energy attenuation assembly or bump-stop 172.4 is shaped to surround the arm interface portion 164.2.6. The bump-stop 172.4 interfaces with the rim 164.2.6.2 that defines the edge of the arm interface portion 164.2.6 and the shroud 172.2. The bump-stops 172.4 are designed to protect the torso 16 from accidental contact with the robot's arm assembly 5 (e.g., upper humerus 30, lower humerus 36). Accordingly, the bump-stop 172.4 is made from an energy-absorbing material (e.g., plastic, TPU, or other polymers). The left and right shrouds 172.2 cover the left and right arm interface portions 164.2.6, with the left and right bump-stops 172.4 interfacing with the front skeleton 164 and the shrouds to provide additional protection to the torso 16.

4. Actuators

As shown in FIGS. 2 and 6-8, the arm actuator assembly (J1) 190 is configured to be housed within the arm tube 164.2.2 of the front skeleton 164 and secured to the actuator mounts 164.2.4. The arms 5*a*, 5*b* extend from the torso 16 (see also, FIG. 1). Movement of the arms 5*a*, 5*b* are controlled, at least in part, by the left and right arm actuator assemblies 190*a*, 190*b* housed within the housing 162 of the torso 16. The torso housing 162 is designed to protect the components contained within the torso 16, including the left and right arm actuator assemblies (J1) 190*a*, 190*b*, and provide stability to the upper portion of the robot 1. For example, the individual actuators of the arm assemblies 5*a*, 5*b* operate independently and are electrically coupled to the following actuator using a single wire bundle.

Finally, the robot's configuration places its arm output mount of the output adaptor at: (a) an upward angle relative to the transverse plane $P_T$, and (b) a rearward angle relative to the coronal plane $P_C$. The shoulder output mount of the shoulder actuator is also upwardly angled relative to the transverse plane. This allows the arm singularity to be beneficially positioned between 5 and 25 degrees upward relative to the transverse plane and between 5 and 25 degrees rearward relative to the coronal plane. Further, the range of motion for: (i) the arm actuator is between 180 and 270 degrees, (ii) the shoulder actuator is between 120 and 180 degrees, (iii) the humerus actuator is between 190 and 360 degrees, and (iv) the elbow actuator is between 120 and 180 degrees. These ranges of motion, along with the location of the singularity, allow the robot to have a sizable workable area and reduce the need to twist the spine, while minimizing space for the battery pack 202 and computer 206.

C. Waist

As best shown in FIGS. 2-10, the waist 604 of the spine 60 includes: (i) a waist body 604.2, (ii) perforated vent panel(s) 604.4, and (iii) battery support bracing 604.6. The waist body 604.2 is shaped and contoured to transition the form of the robot from the torso 16 to the pelvis 64. The waist body 604.2 not only encloses the torso 16 at the lower extent, but also provides support for the electronics assembly 200 contained within the torso 16 and components coupled (directly and indirectly) to the torso 16 above the spine 60.

Specifically, said waist body 604.2 includes: (i) a main body 604.2.1 with a waist rim 604.2.2, and (ii) a projecting actuator housing or waist bucket 604.2.4 that extends therefrom. The projecting actuator housing 604.2.4 includes an actuator receptacle 604.2.4.2 and actuator mount 604.2.4.4 configured to receive the torso twist actuator (J10) 620 that couples the torso 16 to the pelvis 64 via the spine 60. The torso twist actuator (J10) 620 is substantially similar in structure to the arm actuator (J1) 190*a*, 190*b* but is sized to have a momentary peak torque ranging from 101.6-152.4 N-m, preferably 114.3-139.7 N-m. Said main body 604.2.1 has a shallow parabolic shape with a height that is less than 30 mm and has a width that is over 225 mm. Accordingly, said height of the main body 604.2.1 is less than 13% of its width. This shallow main body 604.2.1 provides a curvilinear bottom shelf for the torso 16 that has a substantial area (e.g., greater than 40 $cm^2$). This large area has a limited slope, as the height is less than 30 mm, which helps maximize the volume of the torso 16 and provides additional stability to the robot 1. The larger torso volume and additional stability represent a substantial benefit over conventional robots that have very narrow lower torsos (e.g., a steeply sloped lower torso that has a width substantially equal to the width of the actuator).

The projecting actuator housing 604.2.4 extends downward from the shallow, parabolic shaped main body 604.2.1. In other words, the projecting actuator housing 604.2.4 does not protrude within the main body 604.2.1, which ensures that a substantial portion of the torso twist actuator (J10) 620 is not located within the torso 16. As such, the intersection between the main body 604.2.1 and the projecting actuator housing 604.2.4 forms an angle that is between 90 degrees and 120 degrees. This sharp angle between these walls furthers the above described concept that the main body 604.2.1 does not include a steeply sloped wall that narrows down to said diameter of the torso twist actuator (J10) 620. As shown in the figures, the projecting actuator housing 604.2.4 is not centered within the main body and instead is offset towards a forwardmost extent of the torso 16. For example, the actuator housing 604.2.4 may be positioned adjacent to a frontal extent of the main body, may have a lateral width that extends over 60 mm from an external surface of the housing 604.2.4 to the perimeter of the main body 604.2.1, and a rearward depth of over 100 mm that extends over 60 mm from said external surface of the housing 604.2.4 to the perimeter of the main body.

It should be understood that the height of the projecting actuator housing 604.2.4 must be sufficient to allow for enough clearance between the bottom extent of the main body 604.2.1 and the pelvis 64. However, extending the height of the projecting actuator housing 604.2.4 too far creates instability in this main connection between the torso 16 and the pelvis 64. Thus, the designer must ensure that the height of the projecting actuator housing 604.2.4 is sufficient for clearance but not so high as to cause instability issues. The balance struck in the disclosed robot 1 is a height between 30 mm and 80 mm, wherein a shorter extent may be positioned at a frontal extent of the projection because the robot 1 does not have the ability to lean forward at a location formed in the lower torso.

Because the only connection between the torso 16 and the pelvis 64 is the waist 604, said waist 604 must be capable of transferring at least a portion of the load the robot 1 undertakes while performing a task. In particular, this transfer usually occurs from the arms, through the torso, and into the legs. As such, the waist body 604.2 includes a plurality of casing attachment supports 604.2.6 that provide additional thickness in the waist body 604.2 into the waist bucket 604.2.4. As shown in the illustrative embodiment, the waist body 604.2 may have four casing attachment supports 604.2.6. The bottom of the casing 164.2 couples to the waist 604 at the casing attachment supports 604.2.6. In other embodiments, the waist may include more or fewer attachment supports. In further embodiments, these attachment supports may be eliminated, and the waist and the frontal skeleton may be formed as a single integrated unit.

The waist 604 also includes battery support bracing 604.6 to receive the battery pack 202 within the torso 16. The battery support bracing 604.6 includes guide rails 604.6.2 coupled to rail supports 604.6.4 that, in turn, couple to the waist body 604.2 at the rail attachment supports 604.6.4. The rail supports 604.6.4 may include front rail supports 604.6.4.2 that attach to front attachment supports 604.6.4.2, positioned at the waist bucket opening 604.2.4.6, and rear rail supports 604.6.4.4 that attach to rear attachment supports 604.6.4.2, positioned at the rear of the waist body 604.2 with additional thickness in the waist body 604.2 carried into the waist bucket opening 604.2.4.6. The front and rear rail supports 604.6.4.2, 604.6.4.4 may have a cross shape in part to couple the guide rails 604.6.2 off center. The inclusion of the battery support bracing 604.6 provides a substantial benefit over other robots that lack this feature because the robot 1 is designed to allow for the battery to be replaced or serviced once it nears the end of its life. For example, a battery contained in the robot may be designed to last only a year. At the end of the battery's life, it may be removed from the torso 16, the computing devices may be removed from the battery, and a new battery, along with all other previously used components, may be inserted into and secured within the torso 16. In other embodiments, the robot may not be designed for battery removal, and instead, the entire robot 1 or a substantial portion (e.g., torso) of the robot may need to be replaced.

The waist body 604.2 also includes vent openings 604.2.10 and fly wire ports 604.2.12. The vent openings 604.2.10 may be covered by perforated vent panel(s) 604.4 coupled to the waist body 604.2, or the perforated vent panel(s) 604.4 may be formed in one piece within the vent openings 604.2.10. The fly wire ports 604.2.12 provide bottom access to the torso 16. The fly wire ports 604.2.12 may include covers 604.2.12.2 with and channel or hole to pass control wires to the lower portion of the robot 1.

As shown in FIGS. 2-10, the waist body 604.2 includes at least two vent openings 604.2.10, one arranged in the left extent 304 of the torso and the other arranged on the right extent 306 of the torso 16. In certain embodiments, the waist body 604.2 may include more than two vent openings 604.2.10. Each of the vent openings 604.2.10 has an oblong, freeform shape as shown in FIGS. 2-10. The vent openings 604.2.10 may also be any one of a circular, ovular, or elliptical shape.

The vent openings 604.2.10 are: (i) arranged to the left and right of the sagittal plane $P_S$, (ii) positioned outward of the guide rails 604.6.2 on the waist 604 toward the outermost left and right extents 304, 306 of the torso 16, (iii) arranged substantially or completely in the rear extent 302 of the torso 16, (iv) arranged around the actuator receptacle 604.2.4.2 for the torso twist actuator (J10) 620, (v) vertically positioned above at least a portion or all of the torso twist actuator (J10) 620, (vi) vertically positioned below the battery pack 202, and (vii) arranged substantially or completely outward of the battery pack 202 toward the outermost left and right extents 304, 306 of the torso 16 so that the vent openings 604.2.10 are not directly under the battery pack 202, as shown in FIGS. 2-10. As such, the vent openings 604.2.10: (i) do not extend across the sagittal plane $P_S$, (ii) are not positioned directly or substantially in front of or in the front extent 300 of the robot's torso 16, and (iii) are not positioned in front of or behind the battery pack 202. The vent openings 604.2.10 are also arranged at an angle relative to the transverse plane Pras shown in FIGS. 2-10.

As shown in FIGS. 2-10, the vent openings 604.2.10 are covered by the perforated vent panel(s) 604.4. The perforated vent panel(s) 604.4 is also formed to define the fly wire ports 604.2.12. With the perforated vent panel(s) 604.4 covering the vent openings 604.2.10, the vent openings are sized to encompass or extend around the fly wire ports 604.2.12. The perforations in the perforated vent panel(s) 604.4 may have any suitable shape, including but not limited to, circular, oblong, ovular, elliptical, rectangular, triangular, or another freeform shape. The perforations may be oriented to optimize airflow out of the torso 16. The perforations may vary in size, orientation, and spacing to optimize airflow depending on the specific cooling requirements and design constraints.

D. Cooling System

As best shown in FIGS. 5-11, air is drawn into an upper extent of the robot's torso 16 below the robot's arm assembly 5, passed through an extent of the robot's torso 16, and routed out through a lower extent of the robot's torso 16 and waist 604. The air that can be drawn into the torso 16 via the fans helps cool the computing device 206 when the robot 1 is working and cool the battery 202 when the robot 1 is charging.

As shown in FIGS. 6-19B, the cooling system 210 includes: (i) left and right manifolds 210.2L, 210.2R, (ii) a heat transfer assembly 210.4 (e.g., heat sinks 210.4.2, 210.4.4 and heat transfer features 210.4.6), and (iii) at least one intake fan 210.8.2L, 210.8.2R, 210.8.4L located at an inlet(s) of the respective manifold 210.2L, 210.2R. Each manifold 210.2L, 210.2R extends between the vent openings 164.2.6.8.4 in an extent of the upper portion 339 of the torso 16 (below an extent of the robot's arm assembly 5) and the vent openings 604.2.10 in a lower extent of the waist 604. Each manifold 210.2L, 210.2R defines an air flow pathway for air to flow therethrough. The air in the air flow pathway of the left manifold 210.2L flows along heat transfer features 210.4.6 (e.g., a plurality of heat transfer fins) of the heat transfer assembly 210.4 that are coupled to the heat sinks 210.4.2, 210.4.4, so that heat is transferred to the flowing air from the components of the electronics assembly 200 (e.g., computing device 206, power distribution and control assemblies 204, etc.). The intake fan(s) 210.8.2L, 210.8.2R, 210.8.4L is configured to generate an air flow path through an extent of the torso 16. A majority of the air flow path generated by the intake fan(s) 210.8.2L, 210.8.2R, 210.8.4L is contained within or directed into the respective manifold 210.2L, 210.2R to be expelled through the vent openings 604.2.10 in the waist 604. In certain embodiments, the cooling system 210 may also include at least one exhaust fan 210.10.2L, 210.10.4L located at an outlet(s) of the respective manifold 210.2L to exhaust air out of the manifold through the vent openings 604.2.10 in the waist 604.

1. Intake Fans

The intake fan(s) 210.8.2L, 210.8.2R, 210.8.4L are configured to generate an air flow path through the torso 16 (as suggested by arrows $AF_L$, $AF_R$ in FIGS. 6-9). Air is drawn into an extent of the upper portion 339 of the torso 16 through the vent openings 164.2.6.8.4 below an extent of the robot's arm assembly 5, passed through an extent of the robot's torso 16 along the left and right extents 304, 306, and routed out through the vent openings 604.2.10 in the lower portion 341 of the torso 16 or the waist 604. In alternative embodiments, the direction of the generated air flow path may be reversed (i.e., directed in via the vent openings 604.2.10 in the lower extent of the robot's torso/waist, through an extent of the torso 16, and out via the vent openings 164.2.6.8.4 under the robot's arm assembly 5).

A majority of the air flow generated by the intake fan(s) 210.8.2L, 210.8.2R, 210.8.4L flows into and through the respective manifold 210.2L, 210.2R and is contained within it before being exhausted out the vent openings 604.2.10. The air flowing through the left manifold 210.2L may flow along the heat transfer assembly 210.4 (e.g., the plurality of heat transfer features 210.4.6 coupled to the heat sinks 210.4.2, 210.4.4) so that heat is transferred to the flowing air from the components of the electronics assembly 200 (e.g., computing device 206, power distribution and control assemblies 204, etc.). Additionally, a portion of the air flow generated by the intake fan(s) may flow into the torso 16 through the vent openings 164.2.6.8.4. This air may be allowed to flow freely through the torso 16 to also help cool the components of the electronics assembly 200, including the battery pack 202.

The intake fan(s) 210.8.2L, 210.8.2R, 210.8.4L may draw air from the robot's environment through the vent openings 164.2.6.8.4 into the left and right extents 304, 306 of the upper portion 339 of the torso 16. This cooler air from outside the torso 16 helps cool the components of the electronics assembly 200 and provides more efficient heat transfer. However, the intake fan(s) 210.8.2L, 210.8.2R, 210.8.4L may also be oriented to draw some air from within the housing 162 of the torso 16 into and through the respective manifolds 210.2L, 210.2R to be exhausted out through the vent openings 604.2.10 in the robot's waist 604. As the robot operates, the components of the electronics assembly 200 may heat the air within the housing 162 of the torso 16. By orienting the intake fan(s) 210.8.2L, 210.8.2R, 210.8.4L to draw some of this internal air into and through the manifolds, the hotter air within the housing 162 may be exhausted out through the vent openings 604.2.10 in the waist 60 and replaced with cooler air from outside the torso 16.

The intake fans 210.8.2L, 210.8.2R, 210.8.4L are each coupled to an upper extent or inlet 210.2L.2, 210.2R.2 of the respective manifold 210.2L, 210.2R, as shown in FIGS. 9-19B. At least one intake fan may be coupled to the upper extent 210.2L.2 of the left manifold 210.2L, and at least one intake fan may be coupled to the upper extent 210.2R.2 of the right manifold 210.2R. As shown in FIGS. 12-15B, more than one intake fan, illustratively two intake fans 210.8.2L, 210.8.4L, are coupled to the upper extent 210.2L.2 of the left manifold 210.2L. The right manifold 210.2R has only a single intake fan 210.8.2R in the illustrative embodiment, but may include more than one intake fan in other embodiments. The intake fans 210.8.2L, 210.8.2R, 210.8.4L may be blower fans, centrifugal fans (e.g., backward curved or forward curved), crossflow blower fans, regenerative blower fans, axial fans, vane-axial fans, or any other type of fan. As shown in FIGS. 11-19B, the intake fans 210.8.2L, 210.8.2R, 210.8.4L are blower fans.

The left intake fans 210.8.2L, 210.8.4L are: (i) coupled to the upper extent 210.2L.2 of the left manifold 210.2L, (ii) positioned to the left side of the battery pack 202 near an upper extent of the battery pack 202, (iii) vertically positioned below the arm actuators (J1) 190*a*, 190*b*, (iv) vertically positioned below the sensor assemblies 208, (v) vertically positioned above the torso twist actuator (J10) 620, and (vi) positioned above a lower edge of the energy attenuation assembly 172.4 on the left extent 304 of the torso 16. The left intake fans 210.8.2L, 210.8.4L are positioned adjacent to one another as shown in FIGS. 10-13B. One of the left intake fans 210.82L, 210.8.4L may be positioned (i) forward or rearward of the other intake fan 210.82L, 210.8.4L, (ii) above or below the other intake fan 210.8.2L, 210.8.4L, or (iii) at the same height as the other intake fan 210.82L, 210.8.4L, As such, the intake fans 210.8.2L 210.8.4L: (i) are not positioned directly in front of or in the front extent 300 of the robot's torso 16, (ii) are not positioned in front of the battery pack 202, (iii) are not designed to primarily draw air in from the front or the front extent 300 of the torso 16, and (iv) are not designed to direct air to a vertical reference plane $P_{VR}$ that is aligned with a forwardmost point of the forward extent 300 of the torso 16 and parallel with the torso plane $P_T$ of the robot 1.

The left intake fans 210.8.2L, 210.8.4L are configured to generate an air flow path through the left extent or portion 304 of the torso 16. The left intake fans 210.8.2L, 210.8.4L draw air through the vent openings 164.2.6.8.4 in the casing 164 of the torso 16. A majority of the air flow generated by the left intake fans 210.8.2L, 210.8.4L flows into and through the left manifold 210.2L and is contained within the manifold 210.2L. However, a portion of the air flow generated by the left intake fans 210.8.2L, 210.8.4L may flow into the casing 164 of the torso 16. The left intake fans 210.8.2L, 210.8.4L do not direct the air to the vertical reference plane, i.e., toward the forward extent 300 of the torso 16.

The right intake fan 210.8.2R is: (i) coupled to the upper extent of the right manifold 210.2R, (ii) positioned to the right side of the battery pack 202 near an upper extent of the battery pack 202, (iii) vertically positioned below the arm actuators (J1) 190, (iv) vertically positioned below the sensor assemblies 208, (v) vertically positioned above the torso twist actuator (J10) 620, and (vi) positioned adjacent to the energy attenuation assembly 172.4 on the right extent 306 of the torso 16. As such, the intake fans 210.8.2L, 210.8.2R, 210.8.4L: (i) are not positioned directly in front of the robot's torso 16, (ii) are not positioned in front of the battery pack 202, (iii) are not designed to primarily draw air in from the front of the torso 16, and (iv) are not designed to direct air to a vertical reference plane that is aligned with a forwardmost extent of the torso 16 and parallel with the torso plane $P_T$ of the robot 1.

The right intake fan 210.8.2R is configured to generate an air flow path through an extent of the torso 16 on a right extent or portion of the torso 16. The right intake fan 210.8.2R draws air (i) through the vent openings 164.2.6.8.4 in the casing 164 of the torso 16 and (ii) from within the housing 162 of the torso 16. The right intake fan 210.8.2R is offset from the vent opening 164.2.6.8.4 in the casing 164 and oriented in such a way as to also draw in air from inside the torso housing 162 into the manifold 210.2R. The right intake fan 210.8.2R draws air into the housing 162 from around (i) the side power distribution and control assembly 204.2, arranged next to the battery pack 202 on the right side of the torso 16, and (ii) the rear power distribution and control assembly 204.4, arranged on the rear side of the torso 16 behind the battery pack 202, into the manifold 210.2R. A majority of the air flow generated by the right intake fan 210.8.2R flows into and through the right manifold 210.2R and is contained within the manifold 210.2L. However, a portion of the air flow generated by the right intake fan 210.8.2R may flow into the casing 164 of the torso 16. The right intake fan 210.8.2R does not direct the air to the vertical reference plane, i.e., toward a forward extent of the torso 16.

2. Manifolds

Each of the manifolds 210.2L, 210.2R is sized and shaped to direct the air flow path generated by the intake fan(s) 210.8.2L, 210.8.2R, 210.8.4L through an extent of the torso 16. Each of the manifolds 210.2L, 210.2R directs the air drawn into an extent of the upper portion 339 of the torso 16 through the vent openings 164.2.6.8.4 (below an extent of the robot's arm assembly 5), through an extent of the robot's torso 16 along the left and right extents 304, 306 of the torso 16, and out through the vent openings 604.2.10 in the lower portion 341 of the torso 16 or the waist 604. In alternative embodiments, the direction of the generated air flow path may be reversed (i.e., in via the vent openings 604.2.10 in the lower extent 341 of the robot's torso/waist, through an extent of the torso 16, and out via the vent openings 164.2.6.8.4 under the robot's arm assembly 5).

Unlike other free-air systems (i.e., systems where air is pulled into the torso and allowed to flow around within the torso until it finds an exit path), the manifolds 210.2L, 210.2R direct the flow of air through the torso 16 (as suggested by arrows $AF_L$, $AF_R$ in FIGS. 6-9). Air is drawn into an upper extent of the torso 16 through vent openings 164.2.6.8.4 below an extent of the robot's arm assembly 5, passed through an extent of the robot's torso 16 along the left and right extents 304, 306 of the torso 16, and routed out through vent openings 604.2.10 in the robot's waist 604. The heat transfer assembly 210.4 (e.g., heat sinks 210.4.2, 210.4.4 and heat transfer features 210.4.6) arranged in the corresponding left manifold 210.2L transfers heat to the air flowing therethrough to cool the respective components (e.g., GPUs 206.8 and CPU 206.6) of the computing device 206.

This prevents the battery pack 202 from being heated by the adjacent components of the electronics assembly 200 (e.g., the GPUs 206.8), and enables control over the cooling of these components by directing flow over the heat transfer assembly 210.4, making the cooling of the electronics assembly 200 more efficient than a free-air system. Additionally, the controlled cooling of the electronics assembly components may use less air to provide the same amount of cooling. The reduced air flow means that slower or smaller intake fan(s) 210.8.2L, 210.8.2R, 210.8.4L may be used. Slower or smaller intake fan(s) 210.8.2L, 210.8.2R, 210.8.4L may be quieter and use less power from the battery pack 202, improving overall efficiency.

Both manifolds 210.2L, 210.2R extend from an extent of the upper portion 339 of the torso 16 (below an extent of the robot's arm assembly 5) to the lower extent 341 of the torso/waist along the respective left or right extent 304, 306 of the torso 16. The left manifold 210.2L is arranged on the left extent 304 of the torso 16, and the right manifold 210.2R is arranged on the right extent 306 of the torso 16. Neither the left manifold 210.2L nor the right manifold 210.2R extends to the front or the rear of the torso 16 in the illustrative embodiments. As shown in FIGS. 6-9, the left manifold 210.2L may be coupled to the computing device 206 (e.g., GPUs and CPUs) of the electronics assembly 200, and the right manifold 210.2R may be coupled to a portion of the power distribution and control assemblies 204. In certain embodiments, this arrangement may be reversed, such that the computing device 206 (e.g., GPUs and CPUs) may be arranged on the right extent 306 of the torso 16 and the portion of the power distribution and control assemblies 204 may be arranged on the left extent 304 of the torso 16.

The intake fan(s) 210.8.2L, 210.8.2R, 210.8.4L are located at the inlet or the upper extent 210.2L.2, 210.2R.2 of the respective manifold 210.2L, 210.2R. The upper extent 210.2L.2, 210.2R.2 of each manifold may not be directly aligned with the vent openings 164.2.6.8.4 in the casing of the torso 16. Rather, the upper extent of the manifold may be offset from the vent openings so that additional air is allowed to flow into the torso 16 through the vent openings. This free air may be allowed to flow freely through the torso 16 to also help cool the components of the electronics assembly 200, including the battery pack 202.

Additionally, the upper extent 202.2L.2, 202.2R.2 of the manifold 210.2L 210.2R may be offset from the vent openings 164.2.6.8.4 so that the intake fan(s) 210.8.2L, 210.8.2R, 210.8.4L also draw air from inside the housing 162 of the torso 16 into the respective manifold 210.2L, 210.2R, as discussed above. As the air flows freely in the torso 16, heat from the components of the electronics assembly 200 is transferred to the air. By offsetting the upper extent 202.2L.2, 202.2R.2 of the manifold 210.2L 210.2R from the vent openings 164.2.6.8.4, some of the hot air from inside of the housing 164 of the torso 16 is exhausted out through the vent openings 604.2.10 in the waist 604 and replaced by cooler air from outside the torso 16. In certain embodiments, the right manifold 210.2R may be offset more or less from the vent openings 164.2.6.8.4 compared to the offset of the left manifold 210.2L.

The bottom extent 202.2L.4, 202.2R.4 of each manifold 210.2L, 210.2R is directly aligned with one of the respective vent openings 604.2.10 in the waist 604 as shown in FIGS. 6-9. In certain embodiments, the bottom extent 202.2L.4, 202.2R.4 of each manifold 210.2L 210.2R may be directly aligned with one of the respective vent openings 604.2.10 in the waist 604, but is not sized to cover or extend across the entire width (left to right) or the entire length (front to back) of the respective vent openings 604.2.10. For example, the bottom extent 202.2L.4, 202.2R.4 of each manifold 210.2L 210.2R may extend across a portion (e.g., between 10% and 75%) of the width and/or length of the respective vent openings 604.2.10. Alternatively, the bottom extent 202.2L.4, 202.2R.4 of each manifold 210.2L 210.2R may extend across the entire width and/or the entire length of the respective vent openings 604.2.10.

As shown in FIGS. 9-19B, the left manifold 210.2L is coupled to the heat transfer assembly 210.4 to cool the computing device 206 of the electronics assembly 200. The air directed through the left manifold 210.2L flows over the heat transfer features 210.4.6 of the heat transfer assembly 210.4 in the airflow pathway of the left manifold 210.2L. The heat transfer features 210.4.6 are positioned within the airflow path of the left manifold 210.2L to enable heat generated by the computing device 206 to be transferred into the air that flows in this path.

Figure 11:
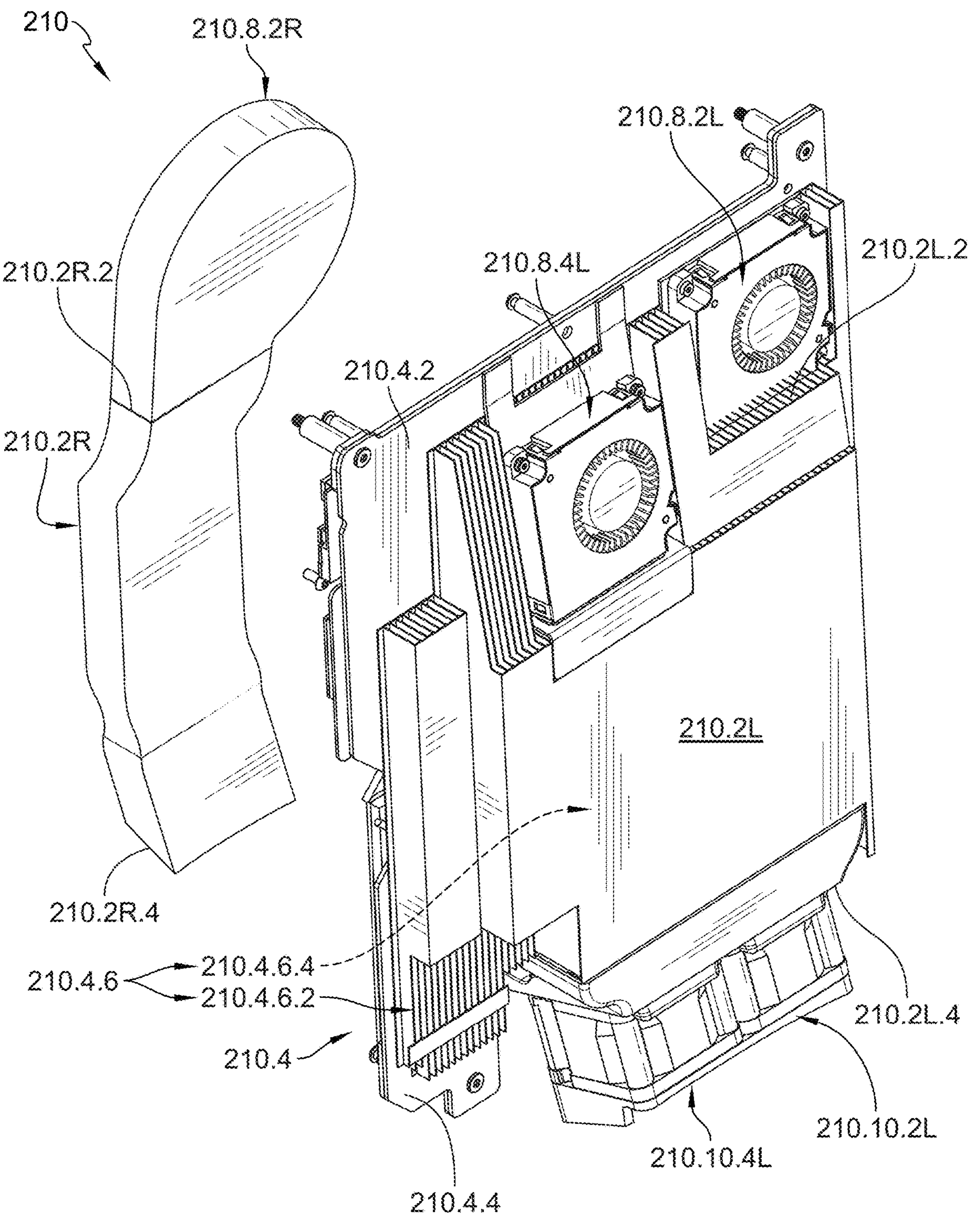
FIG. 11 is a perspective view of the torso cooling system included in the torso of FIG. 10, showing the torso cooling system including (i) a left manifold coupled to the computer of the electronics assembly, (ii) a right manifold, (iii) a heat transfer assembly that includes heat sinks and heat transfer features, (iv) intake fans coupled to an upper extent of the left and right manifolds, and (v) exhaust fans coupled to a lower extent of at least the left manifold.
Figures 19A, 19B:
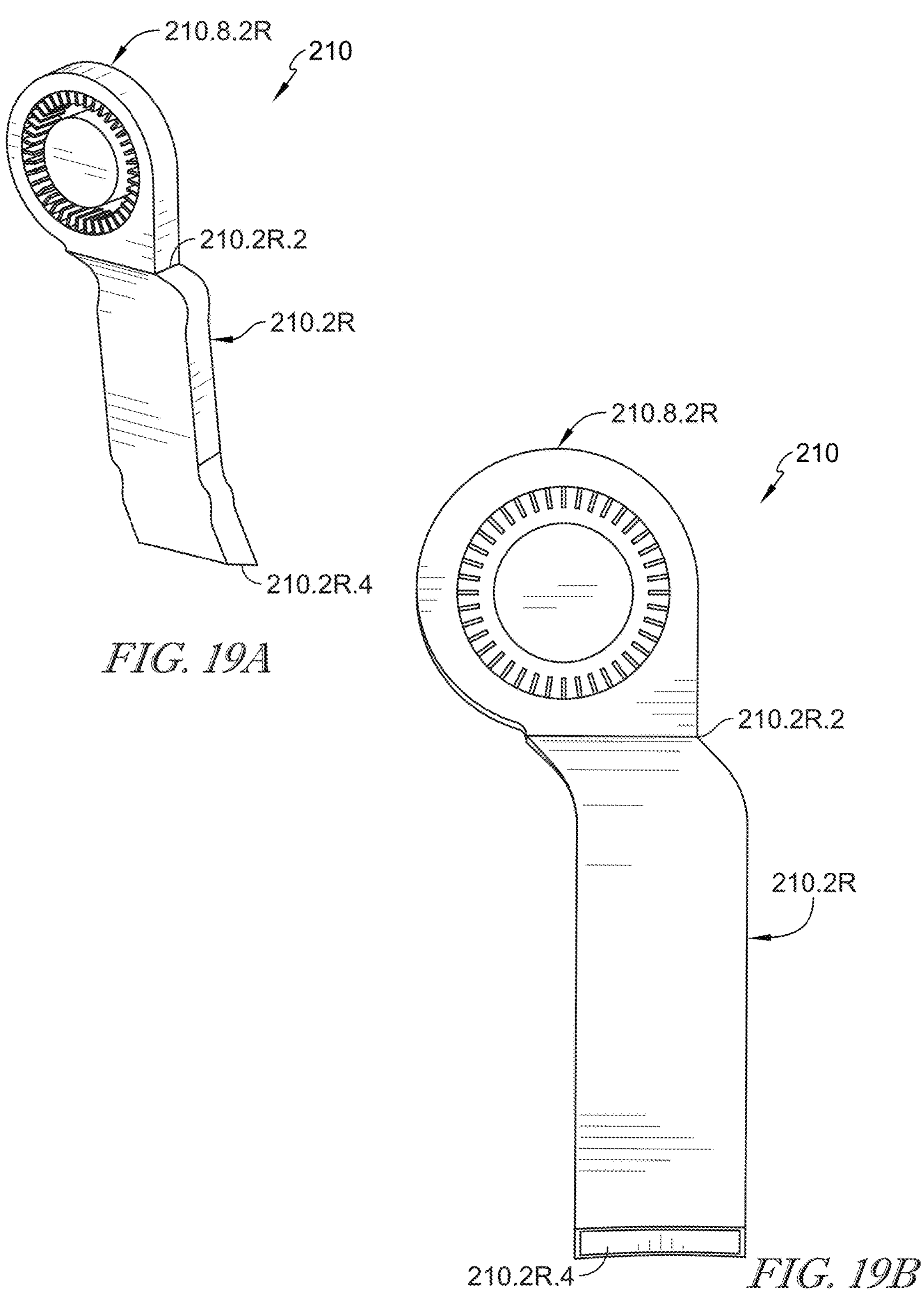
FIG. 19A is a perspective view of a right portion of the cooling system of FIG. 11, showing the right portion of the cooling system including the right manifold and at least one intake fan.
FIG. 19B is a side view of the right portion of the cooling system of FIG. 19A.

As shown in FIGS. 11, 19A, and 19B, the right manifold 210.2R is free of any heat sinks and/or heat transfer features. Rather, the right manifold 210.2R is configured to direct the hot air from the internal volume of the torso 16 out through the vent openings 604.2.10 in the waist 60. By drawing the hotter air from within the housing 162 through the right manifold 210.2R and out through one of the vent openings 604.2.10 in the waist 604, cooler air from outside the torso 16 may be drawn in through the vent openings 164.2.6.8.4 to help cool the components of the electronics assembly 200, including the power distribution and control assemblies 204 and the battery pack 202. In certain embodiments, the right manifold 210.2R may be coupled to a heat transfer assembly like the left manifold 210.2L.

Each of the manifolds 210.2L, 210.2R may be integrally formed such that the respective manifold is a single, integral component. In other embodiments, the manifold 210.2L, 210.2R may be subdivided into sections and assembled to further aid in the replaceability of its components. The subdivided sections may depend on the components of the computing device 206 to be coupled to the respective manifold 210.2L, 210.2R. For example, the left manifold 210.2L may be subdivided so that (i) one side may cool the GPUs 206.8 while the other side may cool the CPU 206.6, (ii) one side may cool the computer 206 while the other side may cool the battery pack 202, (iii) one side may cool the GPUs 206.8 while the other side may cool the battery pack 202, or (iv) one side may cool the battery pack 202 while the other side may cool the CPU 206.6. Alternatively, the left manifold 210.2L may be further subdivided to have separate sections for the different components of the electronics assembly 200.

3. Heat Transfer Assembly

The heat transfer assembly 210.4 includes a number of components and features, as described below.

a. Heat Sinks

The cooling system 210 includes at least one heat sink(s) 210.4.2, 210.4.4 to transfer heat from the computing device 206 (e.g., GPUs 206.8 and CPUs 206.6) of the electronics assembly 200. As shown in FIGS. 5-18, the cooling system 210 includes a first heat sink 210.4.2 and a second heat sink 210.4.4. A first extent 210.4.2.2 of the first heat sink 210.4.2 is thermally coupled to the CPU 206.6 of the computing device 206, and a second extent 210.4.2.4 of the first heat sink is located in the air flow pathway of the left manifold 210.2L. A first extent 210.4.4.2 of the second heat sink 210.4.4 is thermally coupled to the GPUs 206.8 of the computing device 206, and a second extent 210.4.4.4 of the second heat sink 210.4.4 is located in the air flow pathway of the left manifold 210.2L. The heat transfer features 210.4.6 are coupled to the second extents 210.4.2.4, 210.4.4.4 of the heat sinks 210.4.2, 210.4.4 located in the left manifold 210.2L. The heat sinks 210.4.2, 210.4.4 interface with components of the computing device 206 (e.g., GPUs 206.8 and CPUs 206.6) to transfer heat from the components of the computing device 206 (e.g., GPUs 206.8 and CPUs 206.6). Heat from the heat sinks 210.4.2, 210.4.4 is transferred to the heat transfer features 210.4.6, which is then transferred to the air that flows through the manifold 210.2L over the heat transfer features 210.4.6, cooling the components of the computing device 206 (e.g., GPUs 206.8 and CPUs 206.6)

The first heat sink 210.4.2 is separate and distinct from the second heat sink 210.4.4 so that each heat sink can be optimized to cool the respective components (e.g. GPUs and CPU) of the computing device 206. By separating the cooling of the GPUs 206.8 and the CPU 206.6 using different heat sinks, the temperature of the GPUs 206.8 may be better managed. Moreover, having the first heat sink 210.4.2 is separate and distinct from the second heat sink 210.4.4 minimizes heat transfer between the CPU 206.6 and the GPUs 206.8 of the computing device 206.

The second heat sink 210.4.4, also referred to as the upper heat sink 210.4.4, is arranged above the first heat sink 210.4.2, also referred to as the lower heat sink 210.4.2 as shown in FIGS. 11-18. In other words, the upper heat sink 210.4.4 is coupled toward the upper extent of the left manifold 210.2L, closer to the intake fans 210.8.2L, 210.8.4L. The lower heat sink 210.4.2 is coupled toward the lower extent 210.2L.4 of the manifold 210.2L, closer to the exhaust fans 210.10.2L, 210.10.4L. The GPUs 206.8 are coupled to the upper heat sink 210.4.4 because the GPUs 206.8 may generate more heat than the CPU 206.6 and thus need more cooling. Air entering the manifold 210.2L, which will be cooler in temperature, will flow across the heat transfer features 210.4.6 coupled to the upper heat sink 210.4.4 first. This cooler air provides more efficient heat transfer for the GPUs 206.8. The upper heat sink 210.4.4 will transfer heat to the flowing air, causing its temperature to increase, such that the air flowing over the heat transfer features 210.4.6 coupled to the lower heat sink 210.4.2 will be warmer in temperature. This warmer air provides less efficient heat transfer for the CPU 206.6 compared to the upper heat sink 210.4.4. However, the CPU 206.6 may generate less heat, such that less cooling may be needed compared to the GPUs 206.8.

Figures 15A, 15B, 16, 17, 18:
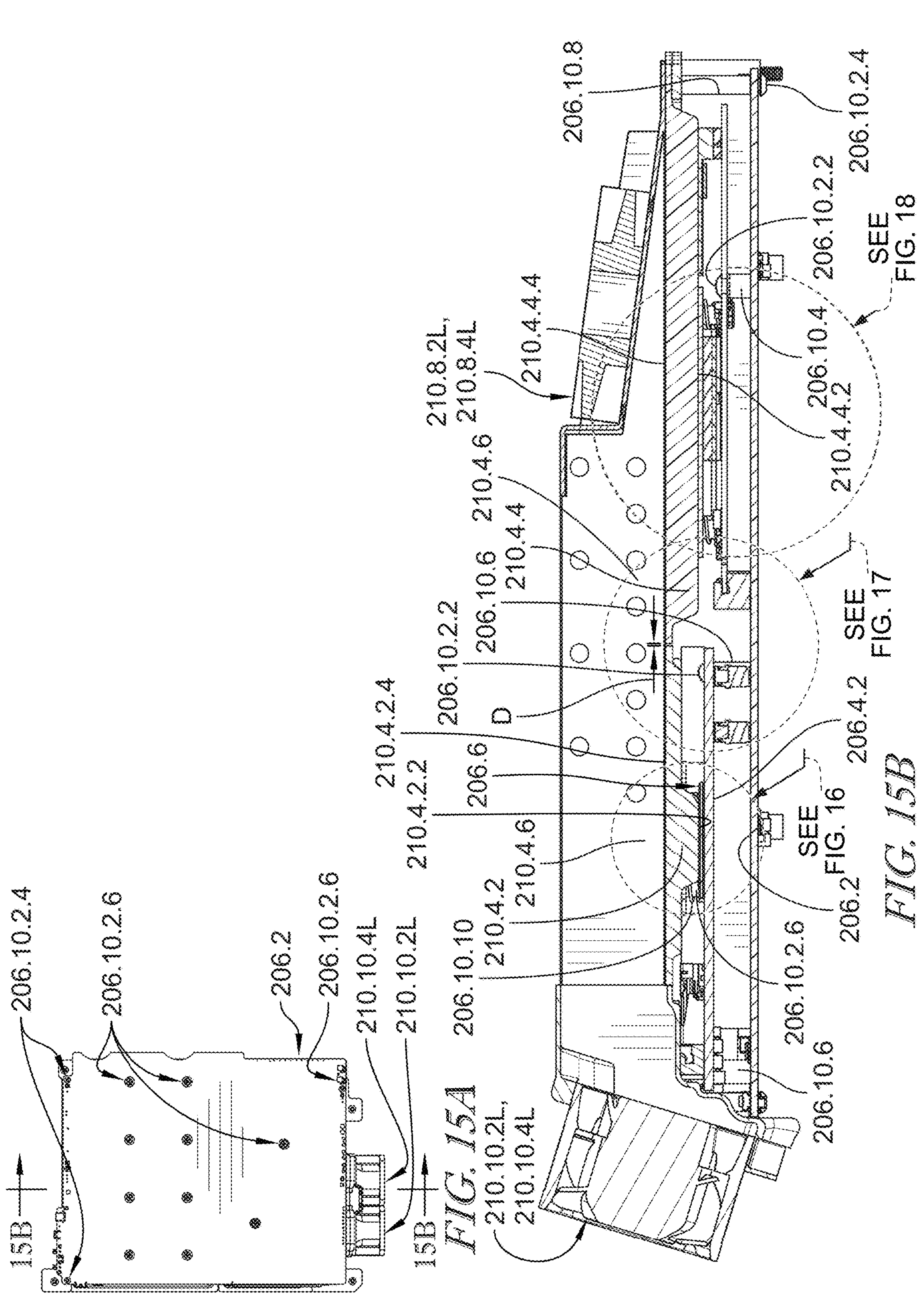
FIG. 15A is a side view of the computer of FIG. 14 coupled with the left portion of the cooling system.
FIG. 15B is a cross-sectional view of the computer and the left portion of the cooling system taken along line 15B-15B of FIG. 15A.
FIG. 16 is a first zoomed-in view of FIG. 15B, showing the interface between the CPU and one of the heat sinks of the cooling system.
FIG. 17 is a second zoomed-in view of FIG. 15B, showing the interface between the GPU and one of the heat sinks of the cooling system.
FIG. 18 is a third zoomed-in view of FIG. 15B, showing the heat sinks of the cooling system are separate and spaced apart from each other at a predetermined distance.
Figure 16:
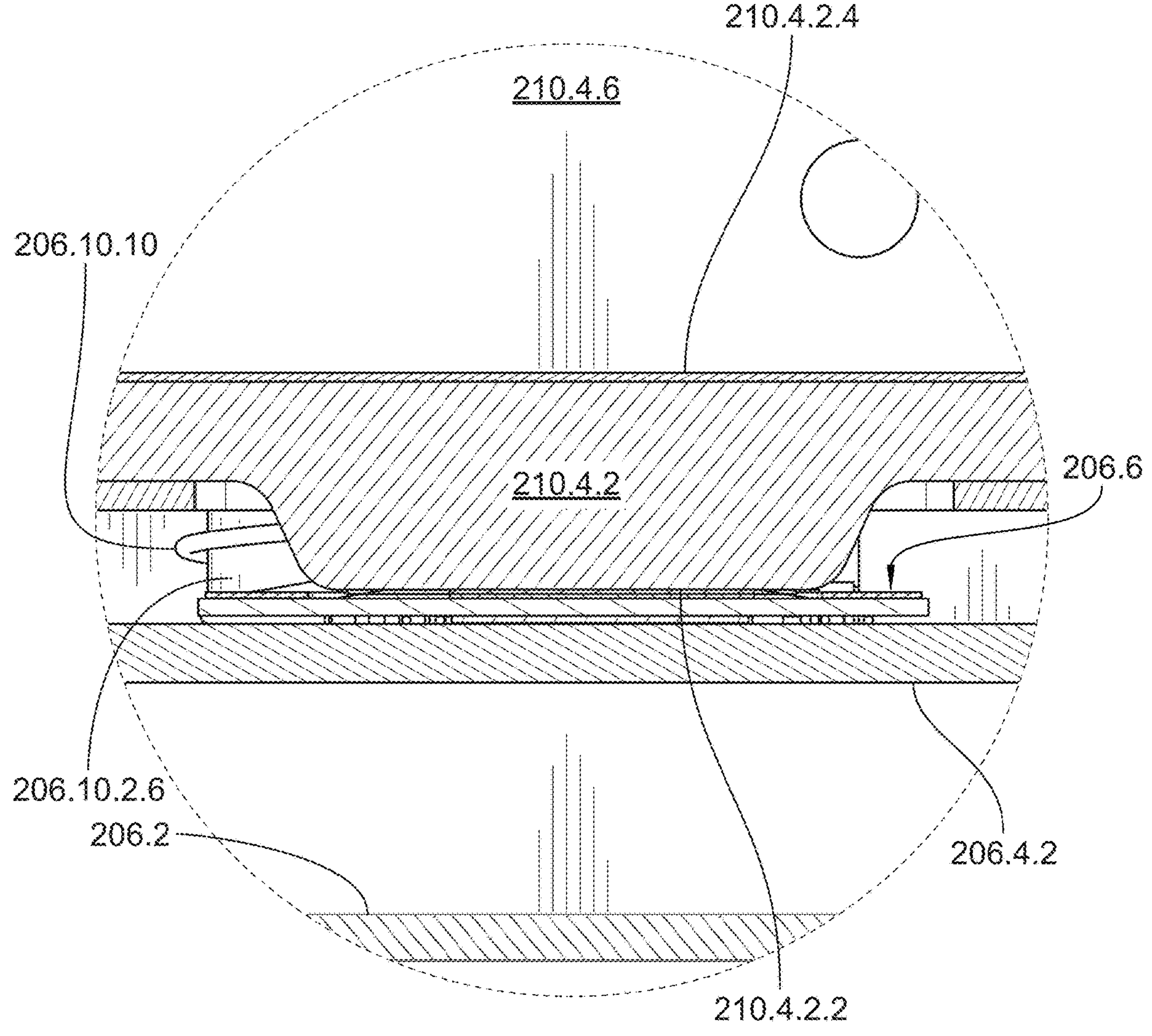
Figure 17:
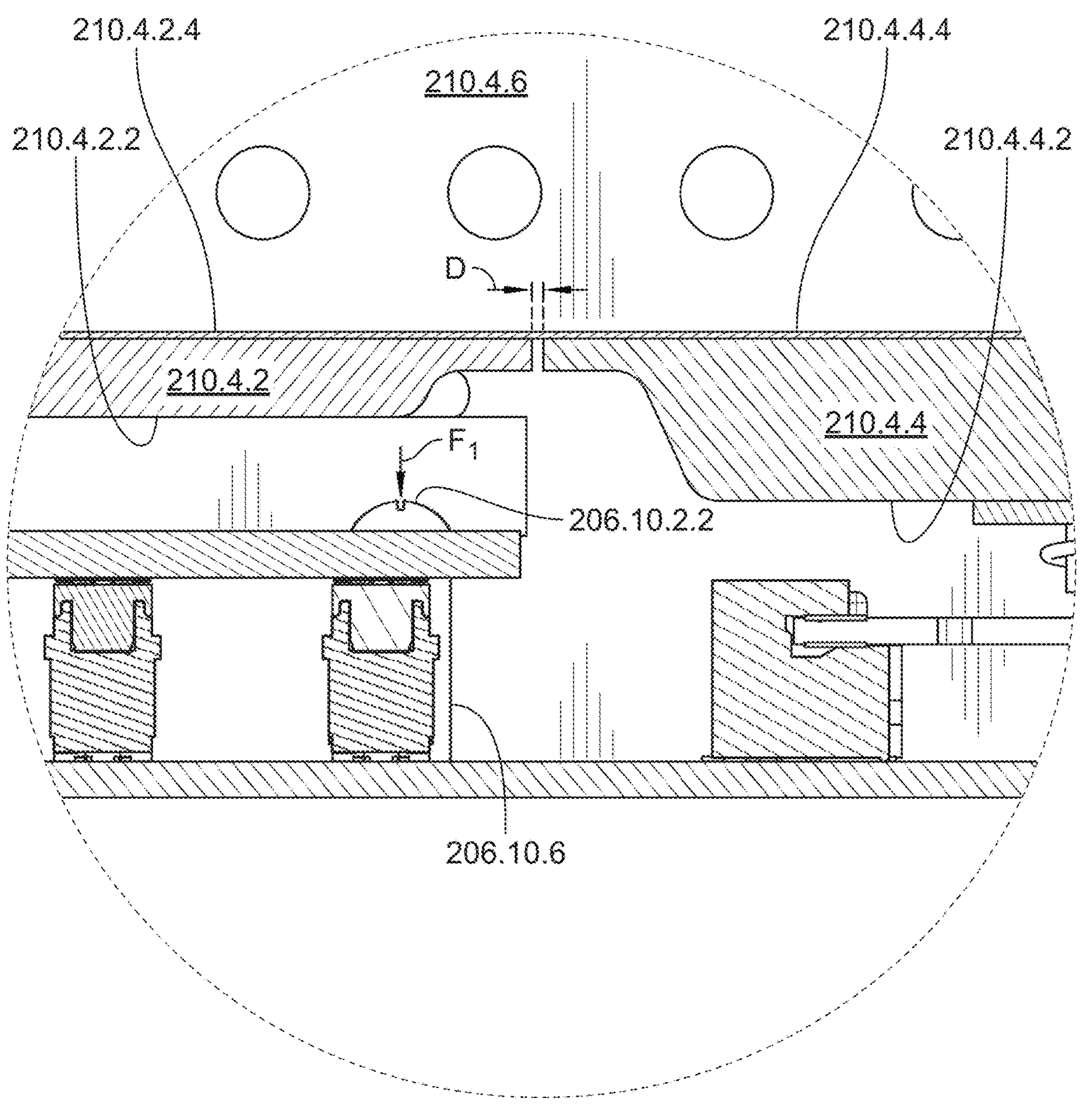
Figure 18:
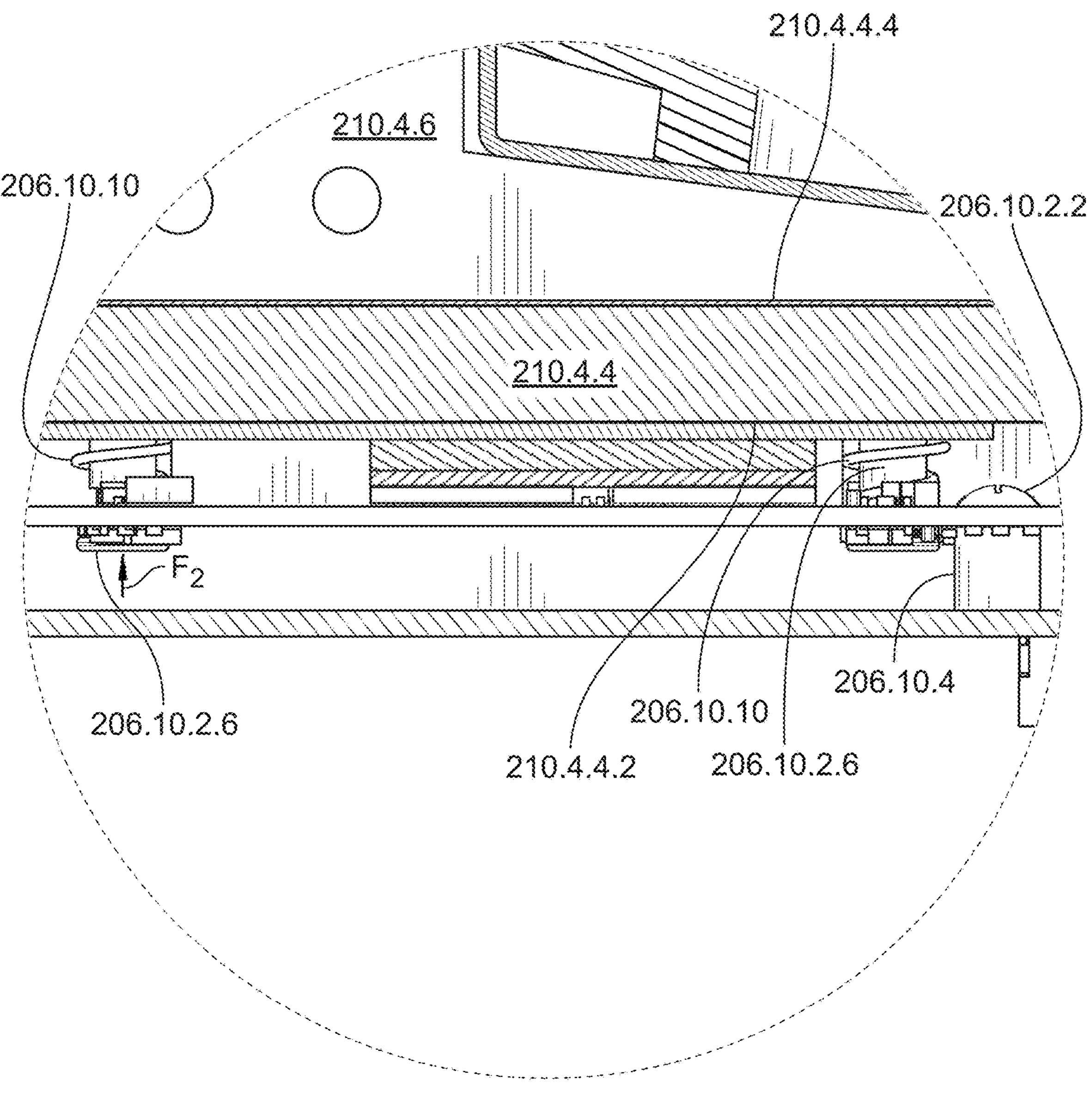

The upper heat sink 210.4.4 may be separated from the lower heat sink 210.4.2 by a predetermined distance D, as shown in FIG. 17. The distance D between the heat sinks 210.4.2, 210.4.4 may be adjusted (i.e., increased or decreased) based on the heat transfer between the components of the computing device 206. For example, the distance D between the heat sinks 210.4.2, 210.4.4 may be adjusted to minimize the heat transfer from one component (e.g., GPUs 206.8 and CPUs 206.6) of the computing device 206 to the other components.

As shown in FIGS. 5-18, the heat sinks 210.4.2, 210.4.4 are vapor chambers 210.4.2, 210.4.4 configured to transfer heat from the computing device 206. Each of the vapor chambers 210.4.2, 210.4.4 are a sealed chamber filled with a working fluid that vaporizes when heated and then condenses as it moves to a cooler area within the sealed chamber. When heat is generated by the computing device 206, the working fluid in the chambers 210.4.2, 210.4.4 near the heat source (i.e., the CPU 206.6 or the GPUs 206.8) vaporizes. The vapor moves to the cooler end, i.e., the areas of the vapor chambers 210.4.2, 210.4.4 away from the CPU 206.6 or the GPUs 206.8, where the vapor condenses back to a liquid thus releasing heat. This condensed liquid flows back to the heat source (i.e., the CPU 206.6 or the GPUs 206.8) to repeat the cycle.

b. Heat Transfer Features

As shown in FIGS. 11-15B and 18, the cooling system 210 includes a plurality of heat transfer features 210.4.6 coupled to the second extents 210.4.2.4, 210.4.4.4 of the heat sinks 210.4.2, 210.4.4 within the left manifold 210.2L. The heat transfer features 210.4.6 extend from the heat sinks 210.4.2, 210.4.4 into the air flow pathway of the manifold 210.2L so that the flow of air flowing through the manifold 210.2L flows over the heat transfer features 210.4.6 to transfer heat to the flow of air. The heat transfer features 210.4.6 may be formed separately and coupled to (e.g., welded, brazed, soldered, etc.) the heat sinks 210.4.2, 210.4.4. In some implementations, the heat transfer features 210.4.6 may utilize advanced manufacturing techniques like 3D printing to create complex geometries for improved heat dissipation. In other embodiments, the heat transfer features

210.4.6 may be integrally formed with the respective heat sinks 210.4.2, 210.4.4 such that the heat sinks 210.4.2, 210.4.4 and the heat transfer features 210.4.6 are a single piece component.

If formed separately, the heat transfer features 210.4.6 may be made of different metals or alloys. For example, the heat transfer features 210.4.6 may be made of high-strength aluminum alloys (e.g., 7075-T6, 2024-T3, etc.), stainless steel (e.g., 17-4 PH, 15-5 PH, etc.), tool steel (e.g., AISI 4340, etc.), beryllium copper (e.g., copper beryllium, beryllium bronze, and spring copper, etc.), nickel-chromium-based superalloys (e.g., Inconel®, etc.), titanium alloys (e.g., Ti-6Al-4V, etc.), and the like. The heat transfer features may also be made of advanced alloys such as a cobalt-chromium-nickel alloy (e.g., Elgiloy®), a nickel-iron alloy with low thermal expansion (e.g., Invar), a nickel-chromium alloy (e.g., Nichrome®), and the like. The heat transfer features 210.4.6 may also incorporate phase change materials in some configurations to provide additional thermal buffering. Additionally, the surface of the heat transfer features 210.4.6 may be treated or coated in some aspects to improve emissivity and heat radiation properties.

The heat transfer features 210.4.6 may be a plurality of heat transfer fins 210.4.6 as shown in FIGS. 11-15B and 18. The heat transfer fins 210.4.6 may be vertically or horizontally oriented to increase the effective surface area for heat dissipation. The fins 210.4.6 may vary in thickness, height, orientation, and spacing to optimize airflow and heat transfer depending on the specific cooling requirements and design constraints. For example, the heat transfer fins 210.4.6 may extend: (i) across the entire width (left to right) of the manifold 210.2L, or (ii) across a portion (e.g., between 10% and 75%) of the width of the manifold 210.2L. In addition, the plurality of fins 210.4.6 may: (i) be hollow, (ii) have a rectangular cross-sectional shape, (iii) have a curvilinear configuration to increase surface area and reduce laminar flow, or (iv) have any other suitable cross-sectional shape known to one of skill in the art. Also, the plurality of fins 210.4.6 may extend: (i) entirely across the thickness of the manifold 210.2L or (ii) across a portion (e.g., between 10% and 75%) of the thickness of the manifold 210.2L. In certain embodiments, the heat transfer features 210.4.6 may incorporate raised protrusions, such as pins or bumps. The heat transfer features 210.4.6 may incorporate three-dimensional geometries or lattices, such as periodic lattice structures or triply periodic minimal surface geometries. The heat transfer features 210.4.6 may incorporate other features, shapes, geometries, or non-repeating patterns to further enhance convective heat transfer by increasing the available surface area exposed to airflow.

In certain embodiments, the heat transfer features 210.4.6 may be split between the heat sinks 210.4.2, 210.4.4, so that the plurality of heat transfer features 210.4.6 has a first set for the upper heat sink 210.4.4 and a second set for the lower heat sink 210.4.2. The first set of features 210.4.6 may be separate and distinct from the second set of features 210.4.6 so that the heat transfer features 210.4.6 can be optimized to cool the respective components (e.g. GPUs and CPU) of the computing device 206. Having the first set be separate and distinct from the second set minimizes the heat transfer between the CPU 206.6 and the GPUs 206.8.

Figure 12:
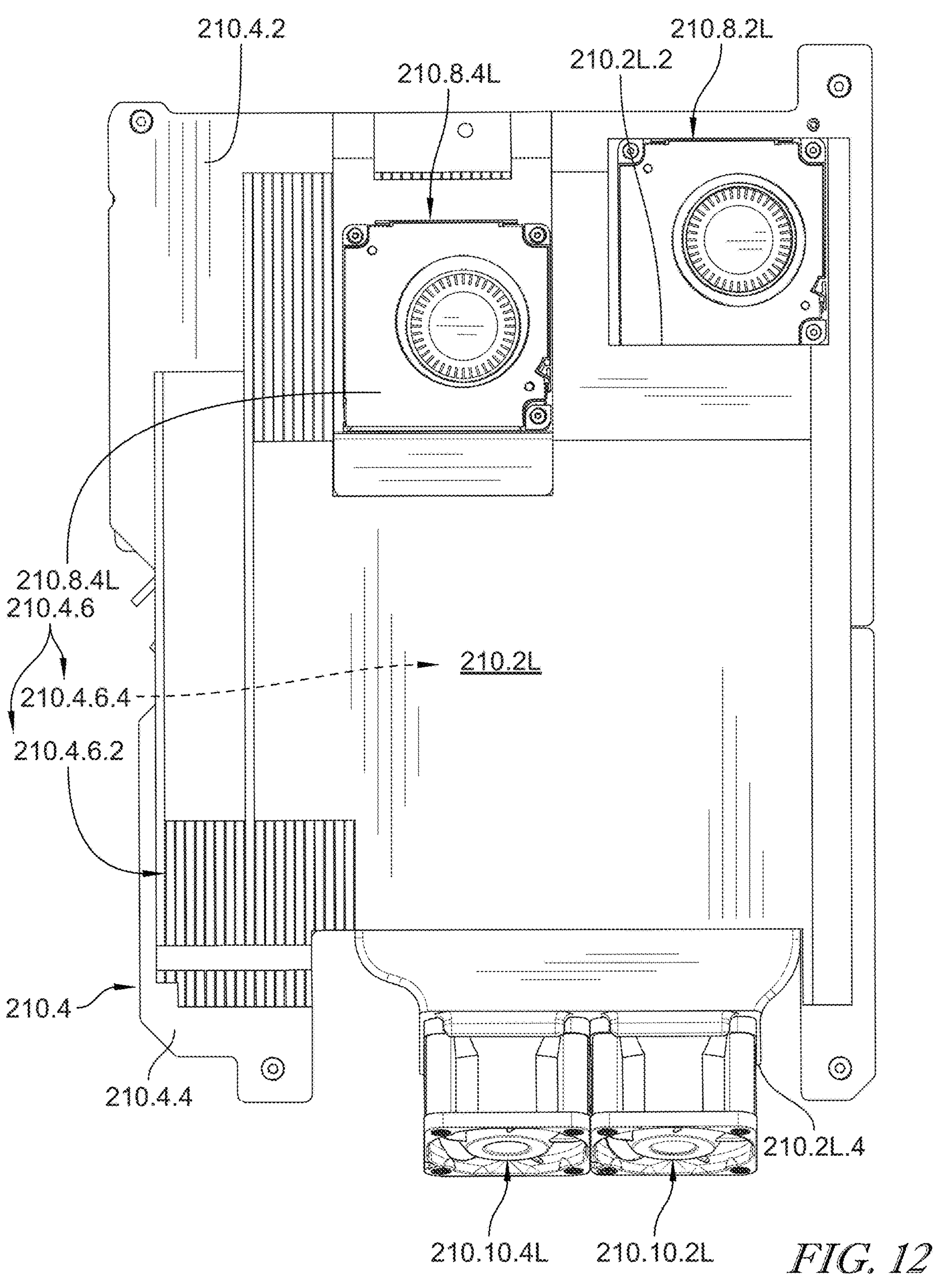
FIG. 12 is a left side view of the cooling system of FIG. 11, showing a left portion of the cooling system which includes the left manifold, the heat transfer assembly (e.g., the heat sinks and the heat transfer features), the intake fans, and the exhaust fans.
Figures 13A, 13B:
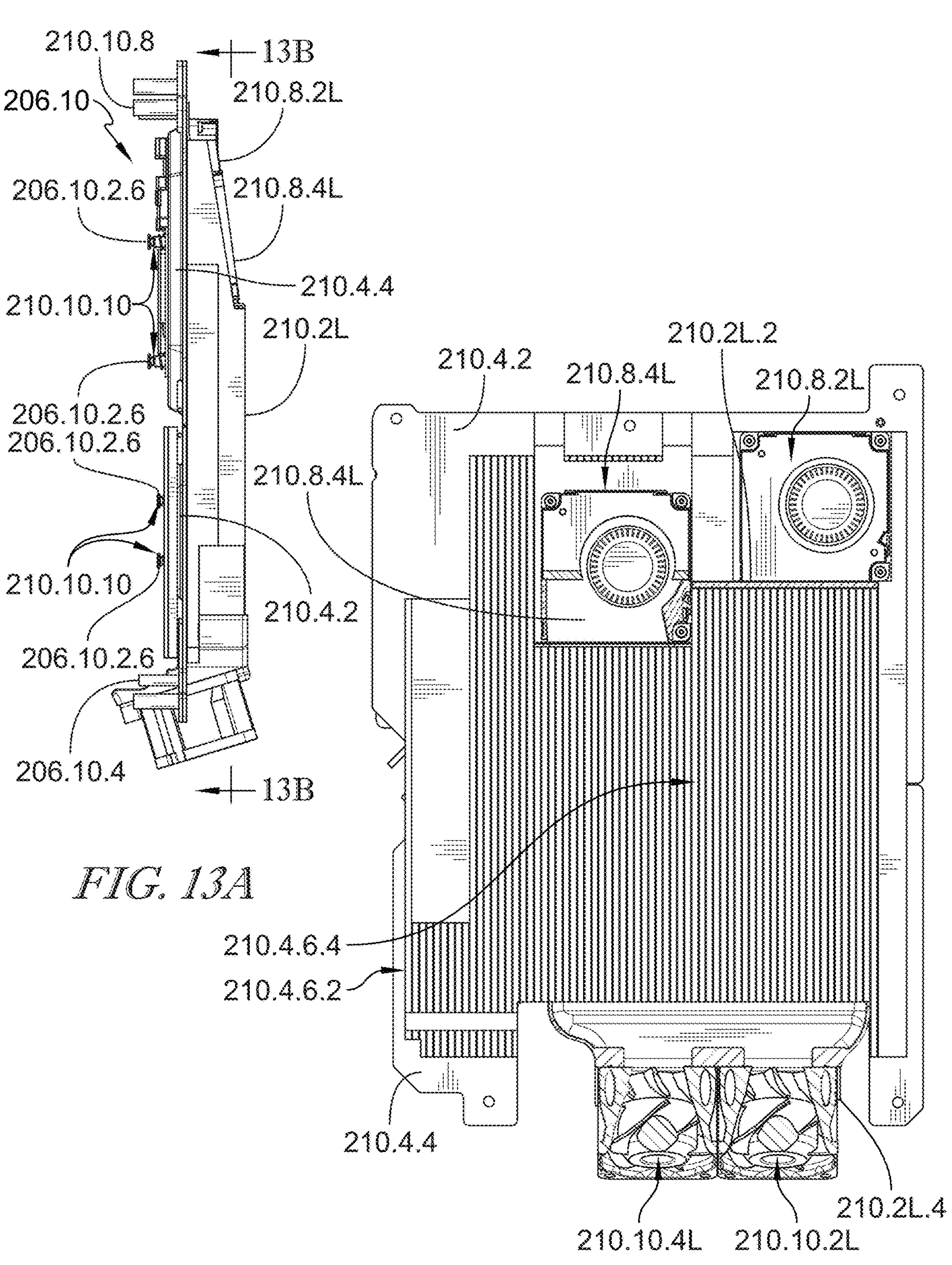
FIG. 13A is a front view of the left portion of the cooling system of FIG. 12.
FIG. 13B is a cross-sectional view of the left portion of the cooling system taken along line 13B-13B of FIG. 13A.

As shown in FIGS. 11, 12, and 13B, the heat transfer features 210.4.6 have a specific configuration.

4. Exhaust Fans

The cooling system 210 may include at least one exhaust fan 210.10.2L, 210.10.4L for each of the respective manifolds 210.2L, 210.2R in certain embodiments. As shown in FIGS. 11-15B, more than one exhaust fan, illustratively two exhaust fans 210.10.2L, 210.10.4L, are coupled to the lower extent of the left manifold 210.2L. The right manifold 210.2R does not have an exhaust fan coupled to the lower extent of the manifold 210.2R, but may include at least one or more than one exhaust fan in other embodiments. The exhaust fan 210.10.2L, 210.10.4L may be blower fans, centrifugal fans (e.g., backward curved or forward curved), crossflow blower fans, regenerative blower fans, axial fans, vane-axial fans, or any other type of fan. As shown in FIGS. 11-15B, the exhaust fans 210.10.2L, 210.10.4L are axial fans.

The left exhaust fans 210.10.2L, 210.10.4L are: (i) coupled to the lower extent of the left manifold 210.2L, (ii) positioned to the left side of the battery pack 202 near a lower extent of the battery pack 202, (iii) vertically positioned below the arm actuators (J1) 190, (iv) vertically positioned below the sensor assemblies 208, and (v) vertically positioned above the torso twist actuator (J10) 620. The left exhaust fans 210.10.2L, 210.10.4L are positioned adjacent to one another as shown in FIGS. 12-15B. One of the left exhaust fans 210.10.2L, 210.10.4L may be positioned (i) forward or rearward of the other exhaust fan 210.10.2L, 210.10.4L, (ii) above or below the other exhaust fan 210.10.2L, 210.10.4L, or (iii) at the same height as the other exhaust fan 210.10.2L, 210.10.4L. As such, the exhaust fans 210.10.2L, 210.10.4L: (i) are not positioned directly in front of the robot's torso 16, (ii) are not positioned in front of the battery pack 202, and (iii) are not designed to primarily draw air in from the front of the torso.

The left exhaust fans 210.10.2L, 210.10.4L are configured to exhaust air from the left manifold 210.2L out through the vent openings 604.2.10 in the waist 604 arranged toward the left extent of the waist 604. The exhaust fans 210.10.2L, 210.10.4L draw the flow of air out of the manifold 210.2L and exhaust the air through the vent openings 604.2.10 in the waist 604 toward the left side of the waist 604. The exhaust fans 210.10.2L, 210.10.4L are directly aligned with the vent openings 604.2.10 in the waist 604.

E. Electronics Assembly

As best shown in FIGS. 5-18, the electronics assembly 200 is housed within and coupled to the housing 162 of the torso 16. The electronics assembly 200 includes: (i) a battery pack 202, (ii) power distribution and control assemblies 204, (iii) a computer 206, and (iv) sensor assemblies 208.

1. Battery Pack

The battery pack 202 may be coupled in a position offset from the center to accommodate the computer 206. As illustrated in FIGS. 5-11, the battery pack 202 and computer 206 take up over 45% of the total volume of the torso, but less than 80% of the total volume of the torso. For example, the total volume occupied by the battery and computer may be about 7.8-9.6 L. The battery pack 202 takes up over 20% of the total volume of the torso, but less than 60% of the total volume of the torso, preferably takes over 30% of the total volume of the torso, but less than 45% of the total volume of the torso. For example, the volume occupied by the battery pack 202 may be about 5.5-6.7 L. The computer 206 takes up over 10% of the total volume of the torso, but less than 25% of the total volume of the torso, preferably takes up over 12.5% of the total volume of the torso, but less than 17.5% of the total volume of the torso. For example, the volume occupied by the computer may be about 2.3-2.9 L. The battery pack 202 may be rechargeable and sized between 1.5 kWh to 5 kWh, preferably between 2 kWh and 3 kWh. The battery pack 202 run time is between 2.5 and 8 hours, preferably at least 3.5 hours. The battery pack 202 may be charged using a removable port adapter that may be coupled to the charging port 202.2, accessible via the charging port access door 176.10.2 of the rear interface panel 176. The battery pack 202 is serviceable by removing the rear shell 170 and rear skeleton 166.

The battery pack 202 serves as the primary energy source for the robot, enabling untethered mobility and the execution of various tasks without continuous reliance on an external power supply. Over time, as the robot performs its assigned operations, the battery naturally discharges due to energy consumption. To sustain uninterrupted functionality, the robot's battery must be periodically recharged. Therefore, the battery pack 202 is configured to be recharged by an external charging system with up to about 2 kW-4 kW wireless power delivery. Various types of robot charging systems may be used, including, but not limited to: a fast direct current (DC) charging docking station, tethered charging, wireless charging, a charging pad, external non-electrical energy source charging, regenerative charging, off-the-grid charging, and robot-to-robot charging.

The charging speed or charging rate of a battery pack can be described by "C-rates." The C-rate is the unit used to measure the speed at which a battery pack is fully charged or discharged. For example, charging at a C-rate of 1C means that the battery pack is fully charged by a charging system from 0-100% in one hour. A C-rate higher than 1C means a faster full battery pack charge. For example, a 3C rate is three times faster than a 1C rate, resulting in a full charge in 20 minutes. A charging dock can provide charge rates between 2C (about 30 minutes) and 6C (about 10 minutes). In other embodiments, the robot 1 can be charged from other power sources. For example, a standard battery pack charging cable with power electronics can convert 110V AC power from a wall power outlet to DC power at the robot's battery pack operating voltage. The charging power from a standard wall AC power supply can be between 0.5C and 2C. This lower C-rate means a slower charge of between 30 minutes and 2 hours to fully charge the robot 1 battery pack.

2. Power Distribution and Control Assemblies

The power distribution and control assemblies 204 include (i) a side power distribution and control assembly 204.2 arranged next to the battery pack 202 on a side opposite the computer 206, and (ii) a rear power distribution and control assembly 204.4, also referred to as a communication assembly, arranged next to the computer 206 on the rear side of the torso 16 behind the battery pack 202. The side power distribution and control assembly 204.2 connects to the battery pack 202 and powers the different actuators. The communication assembly 204.4 connects all communications from the computer 206 to the different actuators. The communication assembly moves the communication connections from the computer 206, which is arranged on the left extent of the torso 16, to the rear of the torso, allowing for better access for servicing the robot 1.

The power distribution and control assemblies 204 do not have dedicated heat sinks like the computer 206. Rather, the air flow generated by the right intake fan 210.8.2R helps to cool the power distribution and control assemblies 204. The right intake fan 210.8.2R is offset from the vent opening 164.2.6.8.4 in the casing 164 and oriented in such a way as to also draw air from the housing 162 from around the side power distribution and control assembly 204.2 and the rear power distribution and control assembly 204.4 into the manifold 210.2R, exhausting the air out the vent openings. In this way, hotter air around the power distribution and control assemblies 204 may be directed out of the housing 162 of the torso 16 and replaced by cooler air drawn in through the vent openings 164.2.6.8 in the upper extent 339 of the torso 16. In other embodiments, the power distribution and control assemblies 204 may (i) have dedicated heat transfer assemblies, e.g., heat sinks and/or heat transfer features, (ii) share the heat transfer assembly 210.4 with the computer 206, (iii) share a heat transfer assembly, e.g., heat sinks and/or heat transfer features, with the battery pack 202, and (iv) be cooled via free air.

3. Computer

Figure 14:
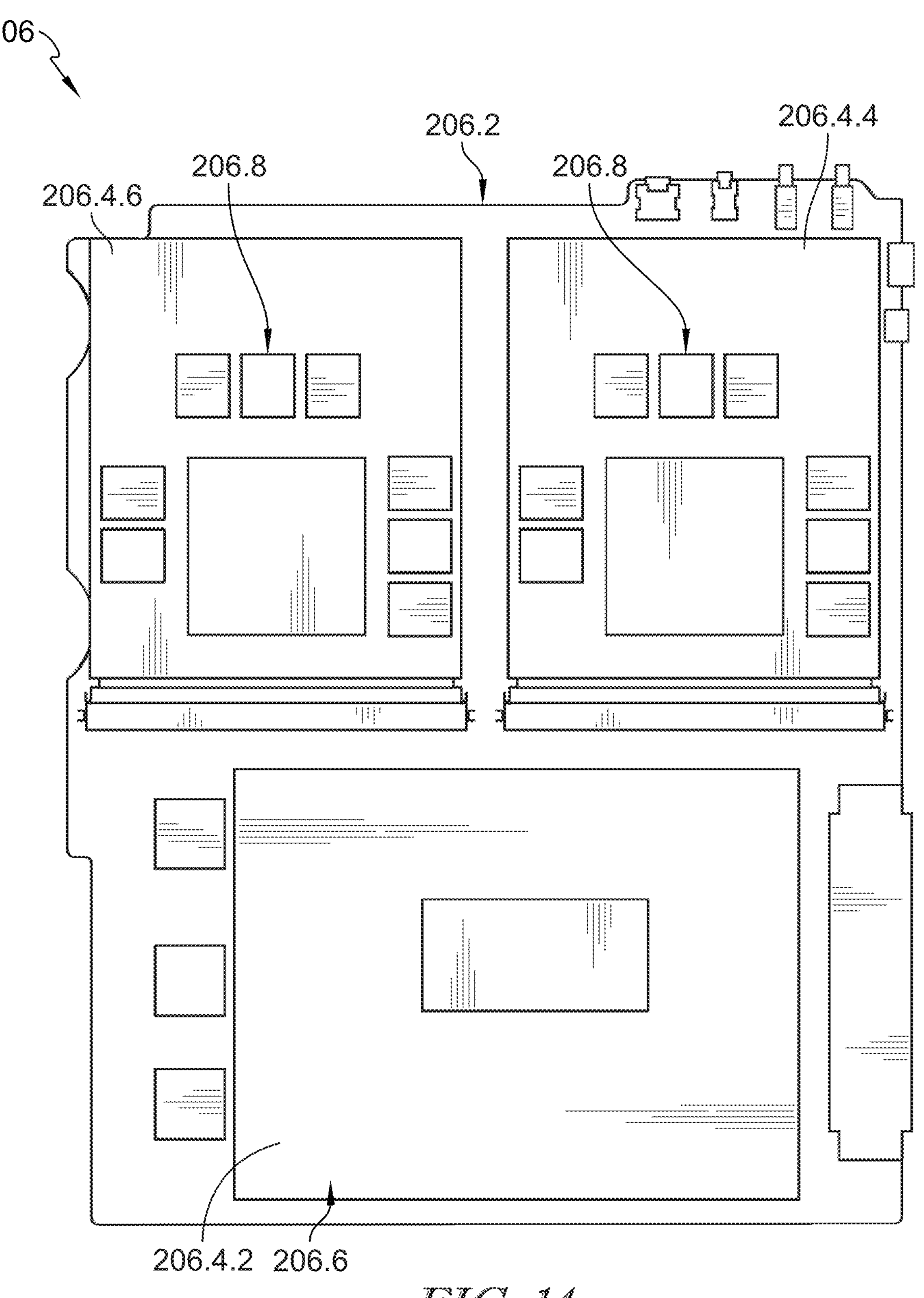
FIG. 14 is a side view of the computer of the electronics assembly included in the torso of FIG. 3, wherein the computer includes (i) a carrier board, (ii) printed circuit boards, (iii) a central processing unit (CPU), and (iv) graphical processing units (GPU)

The computer 206 includes (i) a carrier board 206.2 coupled to the left manifold 210.2L, (ii) printed circuit boards 206.4.2, 206.4.4 coupled to the carrier board 206.2, (iii) a central processing unit (CPU) 206.6 coupled to a first printed circuit board 206.4.2, and (iv) graphical processing unit(s) (GPU) 206.8 coupled to a second printed circuit board 206.4.4 that is arranged above the first printed circuit board 206.4.2 on the carrier board 206.2, as shown in FIGS. 11-18. As shown in FIG. 14, the computer 206 includes two GPUs 206.8. The computer 206 further includes a coupling assembly 206.10 to (i) couple the printed circuit boards 206.4.2, 206.4.4 to the carrier board 206.2, (ii) couple the printed circuit boards 206.4.2, 206.4.4 relative to the heat sinks 210.4.2, 210.4.4 to ensure desired thermal coupling between the CPU 206.6 and the GPUs 206.8 and the heat sinks 210.4.2 210.4.4, and (iii) couple the carrier board 206.2 to the manifold 210.2L.

As shown in FIGS. 16-18, the coupling assembly 206.10 includes (i) a plurality of fasteners 206.10.2.2, 206.10.2.4, 206.10.2.6, (ii) a first set of stand offs 206.10.4 arranged between the carrier board 206.2 and the first printed circuit board 206.4.2, (iii) a second set of stand offs 206.10.6 arranged between the carrier board 206.2 and the second printed circuit board 206.4.4, (iv) a third set of stand offs 206.10.8 arranged between the carrier board 206.2 and the heat sinks 210.4.2, 210.4.4, and (v) biasing members 206.10.10 arranged between first or second printed circuit boards 206.4.2, 206.4.4 and the respective heat sink 210.4.2, 210.4.4. Some of the fasteners 206.10.2.2 extend through the first and second printed circuit boards 206.4.2, 206.4.4, through stand offs 206.10.4, 206.10.6, and into the carrier board 206.2. Other fasteners 206.10.2.4 extend through the carrier board, through the stand offs 206.10.8, and into the heat sinks 210.4.2, 210.4.4. Each of the stand offs 206.10.4, 206.10.6, 206.10.8 are sized to position the first printed circuit board 206.4.2, the second printed circuit board 206.4.4, or the heat sinks 210.4.2, 210.4.4 relative to the carrier board 206.2. The different sets of stand offs 206.10.4, 206.10.6, 206.10.8 may have different lengths to position the first printed circuit board 206.4.2, the second printed circuit board 206.4.4, and the heat sinks 210.4.2, 210.4.4 at different distances from the carrier board 206.10.2. Other fasteners 206.10.2.6 extend through the printed circuit board 206.4.2, 206.4.4 into the respective heat sink 210.4.2, 210.4.4 to couple the printed circuit boards 206.4.2, 206.4.4 to the respective heat sinks 210.4.2, 210.4.4. The biasing members 206.10.10 are positioned adjacent to the fasteners 206.10.2.6 between the printed circuit boards 206.4.2, 206.4.4 and the respective heat sinks 210.4.2, 210.4.4.

The fasteners 206.10.2.6 coupling the printed circuit boards 206.4.2, 206.4.4 to the respective heat sink 210.4.2, 210.4.4 apply a first coupling force $F_1$ directed in a first direction toward the respective heat sink 210.4.2, 210.4.4. The fasteners 206.10.2.2 coupling the printed circuit boards 206.4.2, 206.4.4 to the carrier board 206.2 apply a second coupling force $F_2$ directed in a second direction opposite the first direction of the first coupling force $F_1$. The carrier board 206.2 and the printed circuit boards 206.4.2, 206.4.4 may bend/flex in response to the heat generated. The arrangement of the fasteners 206.10.2.4, 206.10.2.6 controls the bending/flexing of the printed circuit boards 206.4.2, 206.4.4 so that thermal connection between the CPU 206.6 and the GPUs 206.8 with the respective heat sink 210.4.2, 210.4.4 is maintained while minimizing the bending/flexing of the boards 206.2 206.4.2, 206.4.4. The boards 206.2, 206.4.2, 206.4.4 bend (i) toward the heat sinks 210.4.2, 210.4.4 at locations of the CPU 206.6 and the GPUs 206.8 to maintain the thermal coupling of the CPU 206.6 and the GPUs 206.8 with the respective heat sink 210.4.2, 210.4.4 and (ii) away from the heat sinks 210.4.2, 210.4.4 at locations spaced about from the CPU 206.6 and the GPUs 206.8, such as the edges of the printed circuit boards 206.4.2, 206.4.4.

The biasing members 206.10.10 are configured to be compressed between the printed circuit boards 206.4.2, 206.4.4 and the heat sinks 210.4.2, 210.4.4 when the fasteners 206.10.2.6 apply the first coupling force $F_1$ to preload the printed circuit boards 206.4.2, 206.4.4. The biasing members 206.10.10 account for differences in thermal expansion rates between the components and help ensure the CPU 206.6 and GPUs 206.8 remain thermally coupled to their respective heat sinks 210.4.2, 210.4.4. The biasing members 206.10.10 may be any one of coil springs, helical springs, conical springs, leaf springs, disk springs, wave springs, etc. As shown in FIG. 16, the biasing member 206.10.10 is a spring arranged around the fastener 206.10.2.4.

In certain embodiments, the components of the computer 206 may be arranged differently. For example, (i) a single printed circuit board may be used for both the CPU 206.6 and the GPUs 206.8 instead of having an individual printed circuit board for each, (ii) the carrier board 206.2 may be omitted and the printed circuit boards 206.4.2, 206.4.4, 206.4.6 coupled directly to the heat transfer assembly 210.4, (iii) the computer 206 may include additional CPUs and/or GPUs, or (iv) the GPUs 206.8 may be arranged next to or side-by-side with the CPU 206.6. The coupling assembly 206.10 may be altered depending on the number of components in the computer 206.

4. Sensor Assemblies

The sensor assemblies 208 include a front sensor assembly 208.2 and a rear sensor assembly 208.4. The front sensor assembly 208.2 may be positioned within the torso 16 and directed through a sensor opening 164.2.10.10 in the main body wall 164.2.10 near the waist 604 and enclosed by a lower sensor cover 172.6. The rear sensor assembly 208.4 may be positioned at a rear support 164.2.2.4 with covered by the rear interface panel 176. The charging port 202.2 of the battery pack 202 may also be accessed via the rear interface panel 176.

F. Industrial Application

While the disclosure shows illustrative embodiments of a robot (in particular, a humanoid robot), it should be understood that these embodiments are designed to be examples of the principles of the disclosed assemblies, methods, and systems, and are not intended to limit the broad aspects of the disclosed concepts to the embodiments illustrated. As will be realized, the disclosed robot, and its functionality and methods of operation, are capable of other and different configurations, and several details are capable of being modified, all without departing from the scope of the disclosed methods and systems. For example, one or more of the disclosed embodiments, in part or in whole, may be combined with a disclosed assembly, method, and system. As such, one or more steps from the diagrams or components in the Figures may be selectively omitted and/or combined consistent with the disclosed assemblies, methods, and systems. Additionally, one or more steps from the arrangement of components may be omitted or performed in a different order. Accordingly, the drawings, diagrams, and detailed description are to be regarded as illustrative in nature, not restrictive or limiting, of the said humanoid robot.

While the above-described robot is designed as a head for use with a general-purpose humanoid robot, it should be understood that its assemblies, components, learning capabilities, and/or kinematic capabilities may be used with other robots. Examples of other robots include: an articulated robot (e.g., an arm having two, six, or ten degrees of freedom, etc.), a cartesian robot (e.g., rectilinear or gantry robots, robots having three prismatic joints, etc.), Selective Compliance Assembly Robot Arm (SCARA) robots (e.g., with a donut shaped work envelope, with two parallel joints that provide compliance in one selected plane, with rotary shafts positioned vertically, with an end effector attached to an arm, etc.), delta robots (e.g., parallel link robots with parallel joint linkages connected with a common base, having direct control of each joint over the end effector, which may be used for pick-and-place or product transfer applications, etc.), polar robots (e.g., with a twisting joint connecting the arm with the base and a combination of two rotary joints and one linear joint connecting the links, having a centrally pivoting shaft and an extendable rotating arm, spherical robots, etc.), cylindrical robots (e.g., with at least one rotary joint at the base and at least one prismatic joint connecting the links, with a pivoting shaft and extendable arm that moves vertically and by sliding, with a cylindrical configuration that offers vertical and horizontal linear movement along with rotary movement about the vertical axis, etc.), a self-driving car, a kitchen appliance, construction equipment, or a variety of other types of robot systems. The robot system may include one or more sensors (e.g., cameras, temperature, pressure, force, inductive or capacitive touch), motors (e.g., servo motors and stepper motors), actuators, biasing members, encoders, housings, or any other component known in the art that is used in connection with robot systems. Likewise, the robot system may omit one or more sensors (e.g., cameras, temperature, pressure, force, inductive or capacitive touch), motors (e.g., servo motors and stepper motors), actuators, biasing members, encoders, housing, or any other component known in the art that is used in connection with robot systems.

In other embodiments, other configurations and/or components may be utilized. As is known in the data processing and communications arts, a general-purpose computer typically comprises a central processor or other processing device, an internal communication bus, various types of memory or storage media (RAM, ROM, EEPROM, cache memory, disk drives, etc.) for code and data storage, and one or more network interface cards or ports for communication purposes. The software functionalities involve programming, including executable code as well as associated stored data. The software code is executable by the general-purpose computer. In operation, the code is stored within the general-purpose computer platform. At other times, however, the software may be stored at other locations and/or transported for loading into the appropriate general-purpose computer system.

A server, for example, includes a data communication interface for packet data communication. The server also includes a central processing unit (CPU), in the form of one or more processors, for executing program instructions. The server platform typically includes an internal communication bus, program storage, and data storage for various data files to be processed and/or communicated by the server, although the server often receives programming and data via network communications. The hardware elements, operating systems, and programming languages of such servers are conventional in nature, and it is presumed that those skilled in the art are adequately familiar therewith. The server functions may be implemented in a distributed fashion on a number of similar platforms to distribute the processing load.

Hence, aspects of the disclosed methods and systems outlined above may be embodied in programming. Program aspects of the technology may be thought of as "products" or "articles of manufacture" typically in the form of executable code and/or associated data that is carried on or embodied in a type of machine-readable medium. "Storage" type media includes any or all of the tangible memory of the computers, processors, or the like, or associated modules thereof, such as various semiconductor memories, tape drives, disk drives, and the like, which may provide non-transitory storage at any time for the software programming. All or portions of the software may at times be communicated through the Internet or various other telecommunication networks. Thus, another type of media that may bear the software elements includes optical, electrical, and electromagnetic waves, such as those used across physical interfaces between local devices, through wired and optical landline networks, and over various air-links. The physical elements that carry such waves, such as wired or wireless links, optical links, or the like, also may be considered as media bearing the software. As used herein, unless restricted to non-transitory, tangible "storage" media, terms such as computer or machine "readable medium" refer to any medium that participates in providing instructions to a processor for execution.

A machine-readable medium may take many forms, including but not limited to, a tangible storage medium, a carrier wave medium, or a physical transmission medium. Non-volatile storage media include, for example, optical or magnetic disks, such as any of the storage devices in any computer(s) or the like, such as may be used to implement the disclosed methods and systems. Volatile storage media include dynamic memory, such as the main memory of such a computer platform. Tangible transmission media include coaxial cables, copper wire, and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD or DVD-ROM, any other optical medium, punch cards, paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

It is to be understood that the invention is not limited to the exact details of construction, operation, exact materials, or embodiments shown and described, as obvious modifications and equivalents will be apparent to one skilled in the art. While the specific embodiments have been illustrated and described, numerous modifications come to mind without significantly departing from the spirit of the invention, and the scope of protection is only limited by the scope of the accompanying Claims. It should also be understood that the word "substantially" utilized herein means a deviation of less than 15%, and preferably less than 5%. It should also be understood that the words "near" and "proximate" utilized herein mean within 10 cm, while the word "adjacent" utilized herein means within 1 cm. It should also be understood that other configurations or arrangements of the above-described components are contemplated by this Application. Moreover, the description provided in the background section should not be assumed to be prior art merely because it is mentioned in or associated with the background section. The background section may include information that describes one or more aspects of the subject of the technology. Finally, the mere fact that something is described as conventional does not mean that the Applicant admits it is prior art.

In this Application, to the extent any U.S. patents, U.S. patent applications, or other materials (e.g., articles) have been incorporated by reference, the text of such materials is only incorporated by reference to the extent that they do not conflict with materials, statements, and drawings set forth herein. In the event of such conflict, the text of the present document controls, and terms in this document should not be given a narrower reading by virtue of the way in which those terms are used in other materials incorporated by reference. It should also be understood that structures and/or features not directly associated with a robot cannot be adopted or implemented into the disclosed humanoid robot without careful analysis and verification of the complex realities of designing, testing, manufacturing, and certifying a robot for completion of usable work nearby and/or around humans. Theoretical designs that attempt to implement such modifications from non-robotic structures and/or features are insufficient (and in some instances, woefully insufficient) because they amount to mere design exercises that are not tethered to the complex realities of successfully designing, manufacturing, and testing a robot.

The invention claimed is:

1. A humanoid robot comprising:

a torso having a side portion and a vent opening positioned adjacent to said side portion;

a fan positioned within an extent of the torso and adjacent to said vent opening, wherein said fan is configured to generate an air flow path through an extent of the torso;

a central processing unit coupled to a first printed circuit board;

a first heat sink having both a first extent thermally coupled to the central processing unit and a second extent positioned within the air flow path;

a graphical processing unit coupled to a second printed circuit board;

a second heat sink having both a first extent thermally coupled to the graphical processing unit and a second extent positioned within the air flow path; and wherein the first heat sink is: (i) separated a distance from the second heat sink, and (ii) vertically arranged relative to the second heat sink, whereby the second extent of the first heat sink is positioned vertically above or below the second extent of the second heat sink.

2. The humanoid robot of claim 1, further comprising a plurality of fins: (i) coupled to both the first heat sink and the second heat sink, and (ii) positioned within said air flow path.

3. The humanoid robot of claim 1, further comprising a battery pack, and wherein a biasing member: (i) is positioned between both the first printed circuit board and the first heat sink, and (ii) applies a biasing force that is directed away from the battery pack.

4. The humanoid robot of claim 1, further comprising an energy attenuation assembly coupled to an exterior surface of the torso.

5. The humanoid robot of claim 1, further comprising an upper fan that is a crossflow blower fan that is not positioned in front of a battery pack contained in the torso.

6. A humanoid robot comprising:

a torso having: (i) an electric rotary left arm actuator, (ii) an electric rotary right arm actuator, (iii) a battery pack, (iv) an upper horizontal reference line positioned below the left and right arm actuators and above an extent of the battery pack, and (v) a coronal plane of the robot;

an exhaust vent opening: (i) positioned above to the upper reference line, (ii) rearward of the coronal plane of the robot, and (iii) having an inner surface;

an exhaust fan positioned within the torso and configured to force air out of the exhaust vent opening, and wherein a gap is formed between the exhaust fan and the inner surface of the exhaust vent opening;

an intake vent opening positioned below the rotary left arm actuator;

an intake fan positioned within the torso, below the rotary left arm actuator, and configured to force air into the torso.

7. The humanoid robot of claim 6, further comprising a first heat sink thermally coupled to a first processing unit, and a second heat sink thermally coupled a second processing unit; and wherein the first heat sink is separate and distinct from the second heat sink to minimize the heat transfer from the first processing unit to the second processing unit.

8. The humanoid robot of claim 7, further comprising a plurality of fins: (i) coupled to at least one of both the first heat sink and the second heat sink, and (ii) positioned within said air flow path.

9. A humanoid robot comprising:

a waist;

a torso: (i) having a side portion, (ii) a battery pack, and (iii) a vent opening located in said side portion of the torso;

a processing unit positioned within the torso and coupled to a heat sink, and wherein the heat sink is positioned between the battery pack and an inner surface of the torso; and a fan positioned within an extent of the torso and proximate the first vent opening, wherein said fan is configured to generate an air flow path that primarily flows along the side portion of the torso and is positioned between the processing unit and an inner surface of the torso.

10. The humanoid robot of claim 9, further comprising: (i) a first heat sink coupled to the processing unit, and (ii) a second heat sink coupled a second processing unit; and wherein the first heat sink is separate and distinct from the second heat sink to minimize the heat transfer from the first processing unit to the second processing unit.

11. The humanoid robot of claim 10, further comprising a plurality of heat transfer features coupled to at least one of the first heat sink and the second heat sink, wherein the heat transfer features are positioned within said air flow path.

12. The humanoid robot of claim 10, wherein a biasing member is positioned between said first processing unit and the first heat sink and applies a biasing force that is directed away from the battery pack.

13. The humanoid robot of claim 1, further comprising a battery pack, and wherein the central processing unit is positioned between the battery pack and the first heat sink.

14. The humanoid robot of claim 1, further comprising: (i) an electric rotary left arm actuator, (ii) an electric rotary right arm actuator, (iii) a battery pack, (iv) an upper horizontal reference line positioned below the left and right arm actuators and above an extent of the battery pack; and an exhaust vent opening: (i) positioned above the upper reference line, and (ii) having an inner surface.

15. The humanoid robot of claim 1, wherein the air flow path primarily flows along the side portion of the torso and is positioned between the central processing unit and an inner surface of the torso.

16. The humanoid robot of claim 1, wherein the fan is positioned above the first heat sink.

17. The humanoid robot of claim 2, wherein the plurality of fins has an outer portion that is positioned adjacent to the inner surface of the torso.

18. The humanoid robot of claim 6, wherein an air flow path that extends between the intake vent opening and the exhaust vent opening, and wherein said air flow path primarily flows along a side portion of the torso.

19. The humanoid robot of claim 6, further comprising a battery pack, a processing unit, and a first heat sink, and wherein the processing unit is positioned between the battery pack and the first heat sink.

20. The humanoid robot of claim 19, wherein the exhaust fan is positioned above the first heat sink.

21. The humanoid robot of claim 12, wherein the plurality of fins has an outer portion that is positioned adjacent to the inner surface of the torso.

22. The humanoid robot of claim 12, wherein the second heat sink is positioned above the first heat sink.

23. The humanoid robot of claim 6, further comprising: (i) a shell assembly that encases a majority of the torso, and (ii) an energy attenuation assembly having an extent that is positioned outside of the shell assembly.

24. The humanoid robot of claim 9, further comprising a second fan positioned adjacent to the second vent opening, and wherein the first and second fans are different types of fans.

25. The humanoid robot of claim 9, wherein the battery pack can be charged at 2C using a wireless charger.

26. The humanoid robot of claim 9, further comprising a second fan that is a crossflow blower fan.

27. The humanoid robot of claim 9, further comprising a battery pack and a first heat sink, and wherein the processing unit is positioned between the battery pack and the first heat sink.

28. The humanoid robot of claim 9, further comprising: (i) an electric rotary left arm actuator, (ii) an electric rotary right arm actuator, (iii) a battery pack, (iv) an upper horizontal reference line positioned below the left and right arm actuators and above an extent of the battery pack; and an exhaust vent opening: (i) positioned above the upper reference line, and (ii) having an inner surface.

* * * * *